US012813316B2

(12) United States Patent
Moon et al.

(10) Patent No.: US 12,813,316 B2
(45) Date of Patent: Nov. 24, 2026

(54) SEMICONDUCTOR DEVICE INCLUDING CONTACT PAD WITH VOID AND ELECTRONIC SYSTEM INCLUDING SEMICONDUCTOR DEVICE

(71) Applicant: Samsung Electronics Co., Ltd., Suwon-si (KR)

(72) Inventors: Joon Moon, Suwon-si (KR); Younghwan Son, Suwon-si (KR); Sukkang Sung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 243 days.

(21) Appl. No.: 18/662,536

(22) Filed: May 13, 2024

(65) Prior Publication Data

US 2025/0157959 A1 May 15, 2025

(30) Foreign Application Priority Data

Nov. 13, 2023 (KR) ........................ 10-2023-0156754

(51) Int. Cl.

*H10W 72/90* (2026.01)
*H10W 72/00* (2026.01)
*H10W 80/00* (2026.01)
*H10W 90/00* (2026.01)
*H10W 99/00* (2026.01)

(52) U.S. Cl.

CPC ......... *H10W 72/90* (2026.01); *H10W 72/019* (2026.01); *H10W 99/00* (2026.01); *H10W 72/01931* (2026.01); *H10W 72/01951* (2026.01); *H10W 72/01953* (2026.01); *H10W 72/923* (2026.01); *H10W 72/934* (2026.01); *H10W 72/952* (2026.01); *H10W 80/312* (2026.01); *H10W 80/327* (2026.01); *H10W 90/792* (2026.01)

(58) Field of Classification Search

None

See application file for complete search history.

(56) References Cited

U.S. PATENT DOCUMENTS 7,276,787 B2 * 10/2007 Edelstein ............ H10W 20/023 257/773
7,388,277 B2 * 6/2008 Pogge ..................... H10P 72/74 257/E21.585
11,244,928 B2 2/2022 Lee
11,270,963 B2 3/2022 Wu et al.
11,348,901 B1 5/2022 Hou et al.

(Continued)

FOREIGN PATENT DOCUMENTS

KR 20210115349 A 9/2021

*Primary Examiner* — Nduka E Ojeh

(74) *Attorney, Agent, or Firm* — Harness, Dickey & Pierce, P.L.C.

(57) ABSTRACT

A semiconductor device may include a circuit element wire, a lower wire connected to the circuit element wire, a lower interlayer insulation layer on the lower wire, and a first contact pad penetrating the lower interlayer insulation layer. The first contact pad may include a first portion connected to the lower wire, a second portion including a void on the first portion, and a third portion on the second portion. A maximum width between both outer surfaces of the second portion along a horizontal direction may be larger than a width of the third portion along the horizontal direction.

20 Claims, 42 Drawing Sheets

(56) References Cited

U.S. PATENT DOCUMENTS

| | | | | |
|---|---|---|---|---|
| 11,527,500 | B2 | 12/2022 | Sharangpani et al. | |
| 11,640,949 | B2 | 5/2023 | Chiang et al. | |
| 11,646,282 | B2 | 5/2023 | Hou et al. | |
| 2016/0351450 | A1* | 12/2016 | Migita | H10W 20/023 |
| 2021/0217716 | A1 | 7/2021 | Wu et al. | |
| 2021/0288028 | A1* | 9/2021 | Lee | H10W 20/023 |
| 2021/0296269 | A1 | 9/2021 | Sharangpani et al. | |
| 2022/0173071 | A1 | 6/2022 | Hou et al. | |
| 2022/0246562 | A1 | 8/2022 | Hou et al. | |
| 2022/0399295 | A1* | 12/2022 | Lai | H10W 72/90 |
| 2023/0008792 | A1 | 1/2023 | Chiang et al. | |
| 2023/0062333 | A1 | 3/2023 | Kawasaki | |
| 2023/0361074 | A1* | 11/2023 | Uzoh | H10W 80/00 |

* cited by examiner

620_E: 620_E1, 620_E2
620_I: 620_I1, 620_I2

SEMICONDUCTOR DEVICE INCLUDING CONTACT PAD WITH VOID AND ELECTRONIC SYSTEM INCLUDING SEMICONDUCTOR DEVICE

CROSS-REFERENCE TO RELATED APPLICATION

This application claims priority to and the benefit of Korean Patent Application No. 10-2023-0156754, filed in the Korean Intellectual Property Office on Nov. 13, 2023, the entire contents of which is incorporated herein by reference.

BACKGROUND

1. Field

The present disclosure relates to a semiconductor device.

2. Description of the Related Art

In electronic systems that require data storage, semiconductor devices capable of storing high-capacity data may be required. Accordingly, ways to increase the data storage capacity of semiconductor devices are being researched. For example, as one of the methods to increase the data storage capacity of a semiconductor device, a semiconductor device including memory cells arranged three-dimensionally instead of memory cells arranged two-dimensionally has been proposed.

SUMMARY

The present disclosure attempts to provide a semiconductor device capable of improving performance and reliability.

According to an example embodiment, a semiconductor device may include a circuit element wire; a lower wire connected to the circuit element wire; a lower interlayer insulation layer on the lower wire; and a first contact pad penetrating the lower interlayer insulation layer. The first contact pad may include a first portion, a second portion on the first portion, and a third portion on the second portion. The first portion of the first contact pad may be connected to the lower wire. The second portion of the first contact pad may include a void on the first portion of the first contact pad. A maximum width of the second portion of the first contact pad along a horizontal direction may be larger than a width of the third portion of the first contact pad along the horizontal direction, and the maximum width of the second portion of the first contact pad along horizontal direction may be from a first outer surface of the second portion of the first contact pad to a second outer surface of the second portion of the first contact pad.

According to an example embodiment, a semiconductor device may include a first contact structure and a second contact structure on the first contact structure. The first contact structure may include a lower interlayer insulation layer, a first bonding insulation layer on the lower interlayer insulation layer, and a first contact pad penetrating the lower interlayer insulation layer and the first bonding insulation layer. The second contact structure may include a second bonding insulation layer on the first contact structure and a second contact pad connected to the first contact pad, the second contact pad penetrating the second bonding insulation layer. The first contact pad may include a first portion extending in one direction, a second portion below the first bonding insulation layer, and a third portion penetrating the first bonding insulation layer. The second portion of the first contact pad may protrude further than the first portion of the first contact pad in a horizontal direction, and the second portion of the first contact pad may include an interiorly buried void.

According to an example embodiment, a semiconductor device may include a peri structure and a cell structure stacked on the peri structure. The peri structure may include a first substrate, circuit elements on the first substrate, a lower interlayer insulation layer on the first substrate, a first bonding insulation layer on the lower interlayer insulation layer, and a first contact pad penetrating the lower interlayer insulation layer and the first bonding insulation layer. The cell structure may include a second substrate electrically connected to the first substrate, a gate stacking structure, a channel structure penetrating the gate stacking structure in a cell array region of the second substrate, a second bonding insulation layer between the gate stacking structure and the first bonding insulation layer, and a second contact pad connected to the first contact pad and penetrating the second bonding insulation layer. The second substrate may include the cell array region and an extension region. A first surface of the second substrate may face the peri structure and a second surface of the second substrate may be opposite the first surface. The gate stacking structure may include a plurality of gate electrodes and a plurality of interlayer insulation layers alternately stacked on the first surface of the second substrate. The first contact pad may include a first portion extending in one direction, a second portion between the first portion and the first bonding insulation layer, and a third portion penetrating the first bonding insulation layer. The second portion of the first contact pad may include an interiorly buried void. The second portion of the first contact pad may protrude further than the third portion of the first contact pad in a horizontal direction.

According to a semiconductor device according to an embodiment, the second portion of the first contact pad may include a void, so when an annealing process is performed, the first contact pad may thermally expand into the void. Accordingly, it is possible to limit and/or prevent the first contact structure and the second contact structure from being separated or the first contact pad and the second contact pad from being disconnected. Therefore, the reliability of semiconductor devices may be improved.

DETAILED DESCRIPTION

Figure 1:
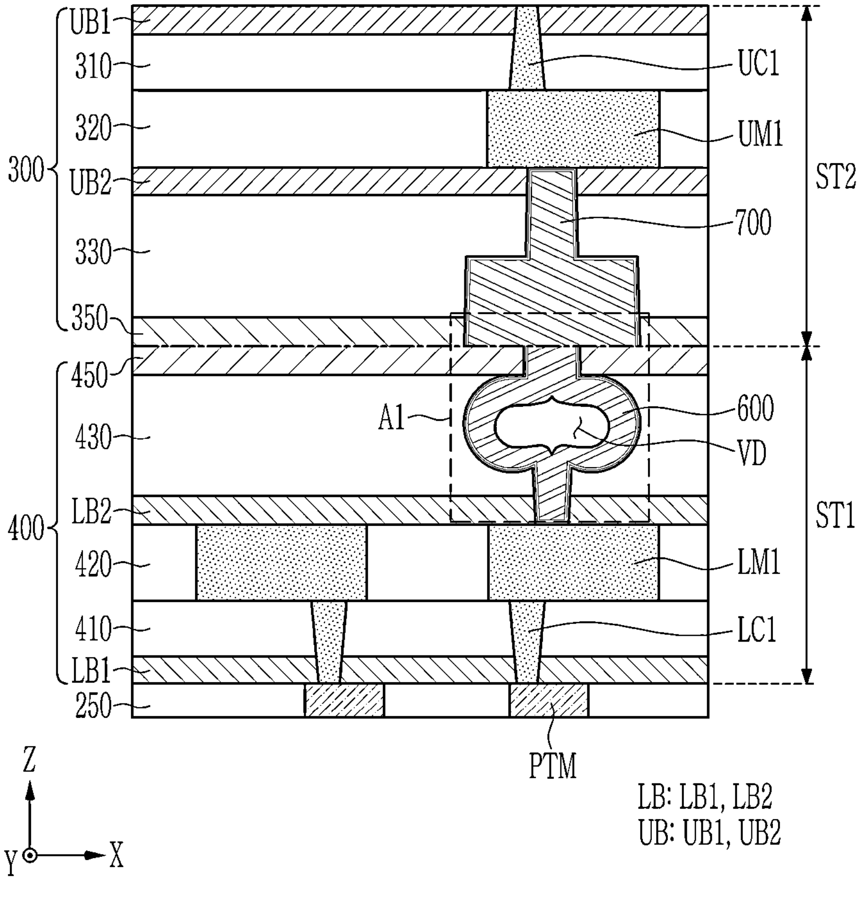
FIG. 1 is a cross-sectional view showing a semiconductor device according to an embodiment.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, for ease of description, the thicknesses of layers, films, panels, regions, areas, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a semiconductor device according to an embodiment will be described with reference to FIG. 1 and FIG. 2.

FIG. 1 is a cross-sectional view showing a semiconductor device according to an embodiment. FIG. 2 is an enlarged cross-sectional view of region A1 of FIG. 1.

Figure 2:
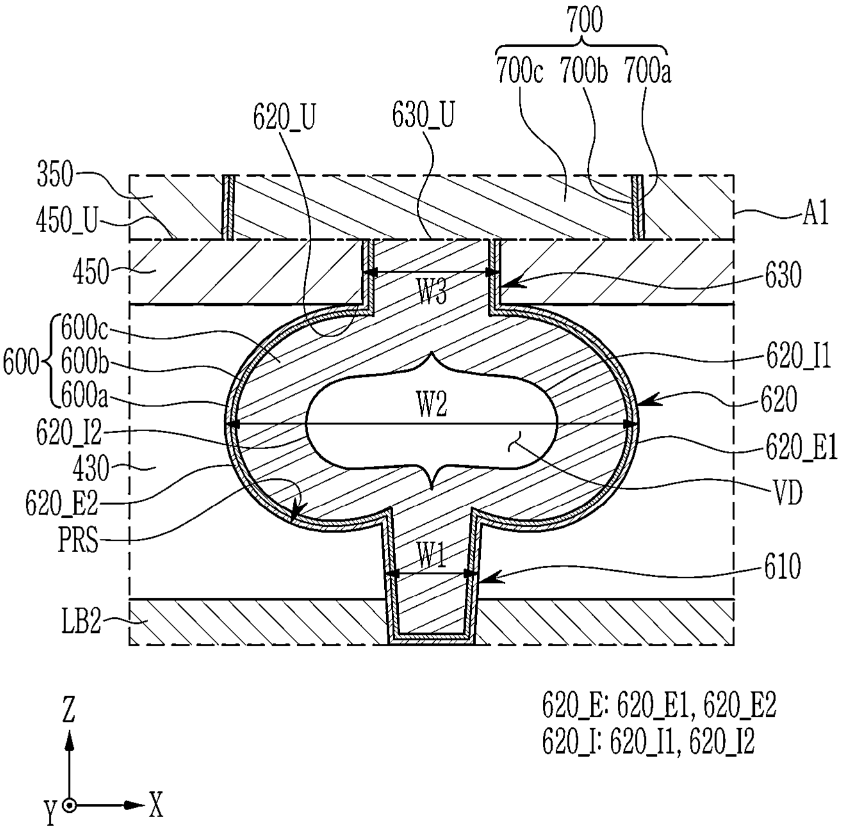
FIG. 2 is an enlarged cross-sectional view of region A1 of FIG. 1.

Referring to FIG. 1 and FIG. 2, a semiconductor device according to an embodiment may include a circuit element wire PTM, a first contact structure ST1 located on the circuit element wire PTM, and a second contact structure ST2 located on the first contact structure ST1.

In an embodiment, the circuit element wire PTM may be connected to various circuit elements controlling an operation of a semiconductor device. That is, the circuit element wire PTM may mean a wire connected to circuit element controlling an operation of a semiconductor device. For example, the circuit element may configure peripheral circuit structures such as a decoder circuit (reference symbol 1110 in FIG. 40), a page buffer (reference symbol 1120 in FIG. 40), a logic circuit (reference symbol 1130 in FIG. 40). The circuit element may include, for example, a transistor, but example embodiments are not limited thereto. For example, the circuit element may include not only active elements such as transistors but also passive elements such as capacitors, resistors, and inductors.

The circuit element wire PTM may be located within an interwire insulation layer 250. For example, the circuit element wire PTM may penetrate the interwire insulation layer 250. The circuit element wire PTM may be located at the same or substantially the same level as an upper surface of the interwire insulation layer 250.

The first contact structure ST1 and the second contact structure ST2 may be located on the circuit element wire PTM.

In an embodiment, the first contact structure ST1 and the second contact structure ST2 may be a bonded semiconductor device of a chip-to-chip (C2C) structure bonded by a wafer bonding method (e.g., hybrid bonding). For example, each of the first contact structure ST1 and the second contact structure ST2 may be a portion corresponding to a peri structure (PERI in FIG. 37) of the semiconductor device shown in FIG. 37 and at least a portion of a cell structure (CELL in FIG. 37). Alternatively, as another example, each of the first contact structure ST1 and the second contact structure ST2 may be a portion corresponding to a peri structure PERI of a semiconductor device 1100 included in an electronic system 1000 shown in FIG. 40 and at least a portion of a cell structure CELL. As a still another example, each of the first contact structure ST1 and the second contact structure ST2 may be a portion corresponding to at least a portion of a first structure 4100 and a second structure 4200 of a semiconductor chip 2200 shown in FIG. 42. However, example embodiments are not limited thereto, and the first contact structure ST1 and the second contact structure ST2 may be applied to all semiconductor devices including a chip-to-chip (C2C) structure bonded by the wafer bonding method (e.g., hybrid bonding).

In an embodiment, the first contact structure ST1 may include a first surface and a second surface opposite each other. The first surface of the first contact structure ST1 may be a surface facing the second contact structure ST2, and the second surface of the first contact structure ST1 may be a surface facing away from the second contact structure ST2. Here, the first surface of the first contact structure ST1 may mean a front side of the first contact structure ST1, and the second surface of the first contact structure ST1 may mean a back side of the first contact structure ST1. In addition, the second contact structure ST2 may include the first surface and the second surface opposite each other. The first surface of the second contact structure ST2 may be a surface facing the first contact structure ST1. The second surface of the second contact structure ST2 may be a surface facing away from the first contact structure ST1.

In an embodiment, the first surface of the first contact structure ST1 adjacent to the second contact structure ST2 may be a bonding surface with respect to the second contact structure ST2. In addition, the first surface of the second contact structure ST2 adjacent to the first contact structure ST1 may be a bonding surface with respect to the first contact structure ST1. That is, the first surface of the first contact structure ST1 and the first surface of the second contact structure ST2 may be a bonding surface between the first contact structure ST1 and the second contact structure ST2.

At this time, the first surface of the first contact structure ST1 and the first surface of the second contact structure ST2 may be bonded by hybrid bonding. Specifically, a first contact pad 600 of the first contact structure ST1 and a second contact pad 700 of the second contact structure ST2 may be bonded in directly contact to form metal bonding. In addition, a first bonding insulation layer 450 of the first contact structure ST1 and a second bonding insulation layer 350 of the second contact structure ST2 may be bonded to form a bonding insulation layer. As such, the first contact pad 600 of the first contact structure ST1 and the second contact pad 700 of the second contact structure ST2 may be bonded, and may provide an electrical connection path between the first contact structure ST1 and the second contact structure ST2. For example, an element connected to the second contact structure ST2 may be electrically connected to the circuit element connected to the circuit element wire PTM by the first contact pad 600 and the second contact pad 700.

In an embodiment, it is illustrated that the first contact structure ST1 and the second contact structure ST2 are located on the circuit element wire PTM, but example embodiments are not limited thereto. For example, the first contact structure ST1 and the second contact structure ST2 may be located on at least one contact structure. As another example, a semiconductor device according to some embodiments may not be provided with the circuit element wire PTM. At this time, the first contact structure ST1 may be located on the circuit element.

The first contact structure ST1 of a semiconductor device according to an embodiment may include a first insulation structure 400 located on the circuit element wire PTM, a lower contact via LC1 and a lower wire LM1 penetrating at least a portion of the first insulation structure 400, and the first contact pad 600 electrically connected to the lower wire LM1.

The first insulation structure 400 may include a plurality of lower barrier layers LB1 and LB2 located on the circuit element wire PTM and the interwire insulation layer 250, a plurality of lower interlayer insulation layers 410, 420, and 430 located on each of the plurality of lower barrier layers LB1 and LB2, and the first bonding insulation layer 450 located on a third lower interlayer insulation layer 430.

The plurality of lower barrier layers LB1 and LB2 may include a first lower barrier layer LB1 and a second lower barrier layer LB2.

The first lower barrier layer LB1 may be located on the circuit element wire PTM and the interwire insulation layer 250. For example, the first lower barrier layer LB1 may be located on an upper surface of the circuit element wire PTM. The first lower barrier layer LB1 may cover the circuit element wire PTM and the interwire insulation layer 250. A bottom surface of the first lower barrier layer LB1 may contact the circuit element wire PTM and the interwire insulation layer 250. The first lower barrier layer LB1 may be located between a first lower interlayer insulation layer 410 and the interwire insulation layer 250.

The second lower barrier layer LB2 may be located on the first lower barrier layer LB1. For example, the second lower barrier layer LB2 may be located to be spaced apart from the first lower barrier layer LB1 in a direction away from the circuit element wire PTM. That is, the second lower barrier layer LB2 may located to be spaced apart from the first lower barrier layer LB1 in a third direction (Z direction). The second lower barrier layer LB2 may be located between a second lower interlayer insulation layer 420 and the third lower interlayer insulation layer 430. The second lower barrier layer LB2 may be located on the lower wire LM1.

In an embodiment, the plurality of lower barrier layers LB1 and LB2 may include silicon nitride. However, example embodiments are not limited thereto, and each of the plurality of lower barrier layers LB1 and LB2 may include at least one of silicon nitride oxide, silicon carbonitride, and silicon carbonitride. The plurality of lower barrier layers LB1 and LB2 may serve as a barrier to limit and/or prevent a material forming the lower wire LM1 and the lower contact via LC1 from being diffused to surroundings, in the process of manufacturing the lower wire LM1 and the lower contact via LC1.

In FIG. 1 and FIG. 2, the number of the plurality of lower barrier layers LB1 and LB2 is shown to be 2, but example embodiments are not limited thereto. For example, the first insulation structure 400 may include one lower barrier layer. As another example, the first insulation structure 400 may include three or more lower barrier layers. As a still another example, the first insulation structure 400 may not include the plurality of lower barrier layers LB1 and LB2. This will be later described in detail with reference to FIG. 14.

The plurality of lower interlayer insulation layers 410, 420, and 430 of a semiconductor device according to an embodiment may include the first lower interlayer insulation layer 410, the second lower interlayer insulation layer 420, and the third lower interlayer insulation layer 430. In an embodiment, the lower contact via LC1 may be located within the first lower interlayer insulation layer 410, and the lower wire LM1 may be located within the second lower interlayer insulation layer 420. However, this is merely an example, and example embodiments are not limited thereto. For example, the lower contact via LC1 and the lower wire LM1 may be located within one of the plurality of lower interlayer insulation layers 410, 420, and 430.

In more detail, the first lower interlayer insulation layer 410 may be stacked on the first lower barrier layer LB1, and the second lower interlayer insulation layer 420 may be stacked on the first lower interlayer insulation layer 410. In addition, the third lower interlayer insulation layer 430 may be located on the second lower barrier layer LB2. That is, the second lower barrier layer LB2 may located between the second lower interlayer insulation layer 420 and the third lower interlayer insulation layer 430.

The lower wire LM1 may be located within the second lower interlayer insulation layer 420. An upper surface of the lower wire LM1 may contact a bottom surface of the second lower barrier layer LB2. That is, the upper surface of the lower wire LM1 may be located at the same or substantially the same level as an upper surface of the second lower interlayer insulation layer 420. A bottom surface and a side surface of the lower wire LM1 may be surrounded by the plurality of lower interlayer insulation layers 410, 420, and 430. For example, the side surface of the lower wire LM1 may be surrounded by the second lower interlayer insulation layer 420. A bottom surface of the lower wire LM1 may be surrounded by the first lower interlayer insulation layer 410.

The lower wire LM1 may be connected to the circuit element wire PTM through the lower contact via LC1 penetrating the first lower barrier layer LB1. At this time, the lower contact via LC1 may penetrate the first lower interlayer insulation layer 410 and the first lower barrier layer LB1. Accordingly, the lower wire LM1 may be electrically connected to the circuit element through the circuit element wire PTM. The lower wire LM1 may be integrally formed without an interface with a first lower contact via LC1, but example embodiments are not limited thereto.

In an embodiment, the lower wire LM1 and the lower contact via LC1 may include a conductive material. For example, the lower wire LM1 and the lower contact via LC1 may include copper (Cu). However, example embodiments are not limited thereto, and the lower wire LM1 and the lower contact via LC1 may include a conductive material such as tungsten (W) or aluminum (Al).

In an embodiment, the plurality of lower interlayer insulation layers 410, 420, and 430 may include an insulating material. The plurality of lower interlayer insulation layers 410, 420, and 430 may include the same material, but example embodiments are not limited thereto. The plurality of lower interlayer insulation layers 410, 420, and 430 may include a material having etch selectivity with respect to the plurality of lower barrier layers LB1 and LB2. In addition, the plurality of lower interlayer insulation layers 410, 420, and 430 may include a material having etch selectivity with respect to the first bonding insulation layer 450 described later. For example, the plurality of lower interlayer insulation layers 410, 420, and 430 may include silicon oxide. However, example embodiments are not limited thereto, and each of the plurality of lower interlayer insulation layers 410, 420, and 430 may include at least one of silicon nitride oxide, silicon carbonitride, and silicon carbonitride.

The first bonding insulation layer 450 may be located on the plurality of lower interlayer insulation layers 410, 420, and 430. Specifically, the first bonding insulation layer 450 may be located on the third lower interlayer insulation layer 430 located uppermost. In an embodiment, a bottom surface of the first bonding insulation layer 450 may contact the third lower interlayer insulation layer 430, but example embodiments are not limited thereto.

In an embodiment, an upper surface of the first bonding insulation layer 450 may configure bonding surface where the first contact structure ST1 and the second contact structure ST2 are bonded. For example, the first bonding insulation layer 450 may be bonded to the second bonding insulation layer 350 of the second contact structure ST2, to configure a portion of the bonding surface between the first contact structure ST1 and the second contact structure ST2.

The first bonding insulation layer 450 may include an insulating material. The first bonding insulation layer 450 may include a material having etch selectivity with respect to the plurality of lower interlayer insulation layers 410, 420, and 430. Specifically, the first bonding insulation layer 450 may include a material having etch selectivity with respect to the third lower interlayer insulation layer 430 in contact with the first bonding insulation layer 450. For example, the first bonding insulation layer 450 may include silicon carbonitride. However, example embodiments are not limited thereto, and the first bonding insulation layer 450 may be changed in various ways within the range of having have etch selectivity with respect to the third lower interlayer insulation layer 430.

In FIG. 1 and FIG. 2, it is illustrated that two lower interlayer insulation layers are sequentially stacked between the first lower barrier layer LB1 and the second lower barrier layer LB2, but example embodiments are not limited thereto. For example, one lower interlayer insulation layer may be provided between the first lower barrier layer LB1 and the second lower barrier layer LB2. As another example, three or more lower interlayer insulation layers may be sequentially stacked between the first lower barrier layer LB1 and the second lower barrier layer LB2.

In FIG. 1 and FIG. 2, it is illustrated that one lower interlayer insulation layer is located between the second lower barrier layer LB2 and the first bonding insulation layer 450, but example embodiments are not limited thereto. For example, two or more lower interlayer insulation layers may be sequentially stacked between the second lower barrier layer LB2 and the first bonding insulation layer 450.

In an embodiment, the first contact pad 600 may be located within the first insulation structure 400.

In more detail, the first contact pad 600 may penetrate at least a portion of the plurality of lower interlayer insulation layers 410, 420, and 430 and at least a portion of the plurality of lower barrier layers LB1 and LB2. For example, the first contact pad 600 may penetrate the third lower interlayer insulation layer 430 and the second lower barrier layer LB2, and be connected to the lower wire LM1. However, example embodiments are not limited thereto, and the first contact pad 600 may be located to penetrate at least one layer of the lower interlayer insulation layers 410, 420, and 430. Alternatively, the first contact pad 600 may not penetrate the plurality of lower barrier layers LB1 and LB2. Hereinafter, as an example, an embodiment that the first contact pad 600 penetrates the third lower interlayer insulation layer 430 and the second lower barrier layer LB2 will be described in detail.

The first contact pad 600 may be located between the lower wire LM1 and the second contact structure ST2. The first contact pad 600 may be electrically connected to the lower wire LM1. The first contact pad 600 may be electrically connected to the circuit element wire PTM by the lower wire LM1 and the lower contact via LC1. In addition, the first contact pad 600 may be bonded to the second contact pad 700 of the second contact structure ST2 by hybrid bonding. The first contact pad 600 may be bonded to the second contact pad 700 of the second contact structure ST2 in a directly contacting state, and may form metal bonding.

Referring further to FIG. 2, the first contact pad 600 may fill at least a portion of a contact recess PRS. A bottom surface of the contact recess PRS may be defined by the second lower interlayer insulation layer 420. A side surface of the contact recess PRS may be defined by the second lower barrier layer LB2, the third lower interlayer insulation layer 430, and the first bonding insulation layer 450. At this time, the first contact pad 600 may be conformally located along an inner sidewall of the contact recess PRS. In an embodiment, the first contact pad 600 may fill at least a portion of a space defined by the contact recess PRS. Accordingly, the first contact pad 600 may include a void VD defined by an inner surface of the first contact pad 600. That is, the void VD may mean a portion where the first contact pad 600 is not formed in the space defined by the contact recess PRS. The void VD will be later described in detail.

In an embodiment, side surface of the first contact pad 600 may include a round shape. Accordingly, a width of the first contact pad 600 along a horizontal direction (a first direction (X direction) and/or a second direction (Y direction)) may include a portion that increases and then decreases with a distance from the bottom surface of the first bonding insulation layer 450, but example embodiments are not limited thereto. This will be later described in detail in describing a second portion 620 of the first contact pad 600.

The first contact pad 600 may include a first conductive layer 600*a*, a second conductive layer 600*b*, and a third conductive layer 600*c* sequentially located on the inner sidewall of the contact recess PRS.

The first conductive layer 600*a* may be conformally located along the inner sidewall of the contact recess PRS. The first conductive layer 600*a* may surround the second conductive layer 600*b*. The first conductive layer 600*a* may contact the first bonding insulation layer 450, the third lower interlayer insulation layer 430, and the second lower barrier layer LB2. The first conductive layer 600*a* may be located on the second lower interlayer insulation layer 420.

The second conductive layer 600*b* may be located inside the first conductive layer 600*a*. The second conductive layer 600*b* may be conformally located along an inner surface of the first conductive layer 600*a*. The second conductive layer 600*b* may surround the third conductive layer 600*c*. The second conductive layer 600*b* may be located between the first conductive layer 600*a* and the third conductive layer 600*c*. The second conductive layer 600*b* may contact the first conductive layer 600*a* and the third conductive layer 600*c*. In an embodiment, the second conductive layer 600*b* may be located on a portion of the first conductive layer 600*a* located on the second lower interlayer insulation layer 420. That is, the second conductive layer 600*b* may cover an upper surface of the first conductive layer 600*a* located on a first portion 610. The second conductive layer 600*b* may not be located on a bottom surface of the second bonding insulation layer of the second contact structure ST2. This may be due to the process characteristic of sequentially forming first to third conductive layers 600*a* to 600*c* within the contact recess PRS. The second conductive layer 600*b* may include a conductive material. For example, the second conductive layer 600*b* may include metal oxide, metal nitride, or the like. For example, the second conductive layer 600*b* may include tantalum nitride, but example embodiments are not limited thereto.

The third conductive layer 600*c* may be located inside the second conductive layer 600*b*. The third conductive layer 600*c* may surround the void VD. The third conductive layer 600*c* may fill at least a portion of the contact recess PRS. For example, the third conductive layer 600*c* may fill at least a portion of the contact recess PRS such that the void VD is provided in an interior (e.g., at a central portion) of the contact recess PRS. The third conductive layer 600*c* may cover an upper surface of the second conductive layer 600*b* located on the first portion 610. In addition, the third conductive layer 600*c* may contact the second contact pad 700 of the second contact structure ST2. The third conductive layer 600*c* may include a conductive material. For example, the third conductive layer 600*c* may include copper, but example embodiments are not limited thereto.

In an embodiment, it is described that the first contact pad 600 includes first to third conductive layers 600*a* to 600*c*, but example embodiments are not limited thereto. For example, the first contact pad 600 may be formed of two or less layers. Alternatively, the first contact pad 600 may be formed of four or more layers.

The first contact pad 600 of a semiconductor device according to an embodiment may include the first portion 610 penetrating the third lower interlayer insulation layer 430, the second portion 620 including the void VD on the first portion 610, and a third portion 630 located on the second portion 620.

The first portion 610 of the first contact pad 600 may be located on the second lower interlayer insulation layer 420. The first portion 610 may extend in the third direction (Z direction) and penetrate the second lower barrier layer LB2, and may penetrate at least a portion of the third lower interlayer insulation layer 430. However, this is merely an example embodiment, and the first portion 610 may penetrate at least one layer of the plurality of lower interlayer insulation layers 410, 420, and 430, or may penetrate the plurality of lower barrier layers LB1 and LB2. Alternatively, the first portion 610 may not penetrate the plurality of lower barrier layers LB1 and LB2. Alternatively, the first portion 610 may not penetrate the plurality of lower interlayer insulation layers 410, 420, and 430. This will be later described in detail with reference to FIG. 10.

A side surface of the first portion 610 may have an inclined shape with respect to the upper surface of the circuit element wire PTM, and at this time, inclined surface may have an inverse taper shape. That is, a first width W1 of the first portion 610 along the horizontal direction (the first direction (X direction) and/or the second direction (Y direction)) may increase away from the upper surface of the circuit element wire PTM. In other words, the first width W1 of the first portion 610 along the horizontal direction (the first direction (X direction) and/or the second direction (Y direction)) may decrease with a distance from the bottom surface of the first bonding insulation layer 450.

In an embodiment, the first portion 610 may be electrically connected to the lower wire LM1. For example, a bottom surface of the first conductive layer 600*a* located in the first portion 610 may contact the lower wire LM1, and accordingly, the first portion 610 may be connected to the circuit element wire PTM through the lower wire LM1. At this time, the second conductive layer 600*b* may be located on a bottom a surface of the third conductive layer 600*c* located on the first portion 610, and the first conductive layer 600*a* may be located on a bottom surface of the second conductive layer 600*b* located on the second portion 620. That is, the second conductive layer 600*b* may cover the bottom surface of the third conductive layer 600*c* located in the first portion 610, and the third conductive layer 600*c* may cover the bottom surface of the second conductive layer 600*b* located in the first portion 610.

The second portion 620 of the first contact pad 600 may be located on the first portion 610. The second portion 620 may be located within the third lower interlayer insulation layer 430. The second portion 620 may overlap the third lower interlayer insulation layer 430 in the horizontal direction (the first direction (X direction) and/or the second direction (Y direction)).

In an embodiment, the second portion 620 may be located between the first bonding insulation layer 450 and the second lower barrier layer LB2. That is, the second portion 620 may be located on the bottom surface of the first bonding insulation layer 450. For example, an upper surface 620_U of the second portion 620 may contact the bottom surface of the first bonding insulation layer 450, but example embodiments are not limited thereto. Accordingly, the second portion 620 may non-overlap the first bonding insulation layer 450 and the second lower barrier layer LB2 in the horizontal direction (the first direction (X direction) and/or the second direction (Y direction)).

In an embodiment, the second portion 620 may protrude than the first portion 610 in the horizontal direction (the first direction (X direction) and/or the second direction (Y direction)). For example, the second portion 620 may protrude from an outer surface of the first portion 610 in the horizontal direction (the first direction (X direction) and/or the second direction (Y direction)). In addition, the second portion 620 may protrude from an outer surface of the third portion 630 in the horizontal direction (the first direction (X direction) and/or the second direction (Y direction)).

Accordingly, a second width W2 between both outer surfaces 620_E of the second portion 620 opposite each other along the horizontal direction (the first direction (X direction) and/or the second direction (Y direction)) may be larger than the first width W1 of the first portion 610 along the horizontal direction (the first direction (X direction) and/or the second direction (Y direction)). In addition, the second width W2 between the both outer surfaces 620_E of the second portion 620 opposite each other along the horizontal direction (the first direction (X direction) and/or the second direction (Y direction)) may be larger than a third width W3 of the third portion 630 along the horizontal direction (the first direction (X direction) and/or the second direction (Y direction)). Here, the second width W2 between the both outer surfaces 620_E of the second portion 620 opposite each other along the horizontal direction (the first direction (X direction) and/or the second direction (Y direction)) may mean maximum width between a first outer surface 620_E1 and a second outer surface 620_E2 of the second portion 620 along the horizontal direction (the first direction (X direction) and/or the second direction (Y direction)) that face each other along the horizontal direction (the first direction (X direction) and/or the second direction (Y direction)).

In an embodiment, the outer surface 620_E of the second portion 620 may include a round shape. Accordingly, the second width W2 between the both outer surfaces 620_E of the second portion 620 opposite each other along the horizontal direction (the first direction (X direction) and/or the second direction (Y direction)) may increases and then decrease with a distance from the bottom surface of the first bonding insulation layer 450. In addition, an inner surface 620_I of the second portion 620 may include a round shape. At this time, curvature of the outer surface 620_E of the second portion 620 may be smaller than a curvature of the inner surface 620_I of the second portion 620. However, example embodiments are not limited thereto. For example, the outer surface 620_E and/or the inner surface 620_I of the second portion 620 may have an inclined shape with respect to the upper surface of the circuit element wire PTM, and at this time, inclined surface may have an inverse taper shape. As another example, the outer surface 620_E and/or the inner surface 620_I of the second portion 620 may have a shape perpendicular to the upper surface of the circuit element wire PTM. This will be later described in detail with reference to FIG. 8 and FIG. 9.

In an embodiment, the second portion 620 may include the void VD located in a central portion. The void VD may be buried in an interior of the third conductive layer 600*c* located in the second portion 620. The void VD may be defined by the inner surface 620_I of the second portion 620. That is, the void VD may be located at between first inner surface 620_I1 and second inner surface 620_I2 of the second portion 620. This may be due to the process characteristics in which the second portion 620 conformally forms the void VD from the inner sidewall of the contact recess PRS so as to fill at least a portion of the space defined by the contact recess PRS. At this time, as described above, the second width W2 between the both outer surfaces 620_E of the second portion 620 opposite each other along the horizontal direction (the first direction (X direction) and/or the second direction (Y direction)) is larger than the third width W3 of the third portion 630 along the horizontal direction (the first direction (X direction) and/or the second direction (Y direction)), and the void VD may be easily formed.

In an embodiment, the void VD may provide a space allowing thermal expansion of the first contact pad 600, when the annealing process is performed on the first contact pad 600. Specifically, when the first contact structure ST1 and the second contact structure ST2 of a semiconductor device according to an embodiment are bonded by hybrid bonding, the annealing process for bonding the first contact pad 600 and the second contact pad 700 may be performed. At this time, the first contact pad 600 and/or the second contact pad 700 may be thermally expanded. Since the second portion 620 of a semiconductor device according to an embodiment includes the void VD, when the annealing process is performed, the first contact pad 600 may thermally expand toward the interior of the void VD. That is, the void VD may provide a function of limiting and/or preventing the first contact pad 600 from thermally expanding from an upper surface of the first contact structure ST1.

In an embodiment, a thickness of the second portion 620 surrounding the void VD may be constant. For example, a thickness between the first outer surface 620_E1 and first inner surface 620_I1 of the second portion 620 may be substantially the same as a thickness between the second outer surface 620_E2 and second inner surface 620_I2 of the second portion 620. As another example, when the second portion 620 includes a lower portion connected to the first portion 610 to cover a lower region of the void VD and an upper portion connected to the third portion 630 to cover an upper region of the void VD, a thickness of the upper portion may be substantially the same as a thickness of the lower portion. This may be due to the process characteristics of conformally forming the second portion 620 within the contact recess PRS. However, example embodiments are not limited thereto, and the thickness of the upper portion may be thicker than the thickness of the lower portion. This will be later described in detail with reference to FIG. 4.

The third portion 630 may be located on the second portion 620. The third portion 630 may extend in the third direction (Z direction) and penetrate the first bonding insulation layer 450. The third portion 630 may overlap the first bonding insulation layer 450 in the horizontal direction (the first direction (X direction) and/or the second direction (Y direction)).

In an embodiment, an upper surface 630_U of the third portion 630 may configure the bonding surface between the first contact structure ST1 and the second contact structure ST2 together with the first bonding insulation layer 450. For example, the third portion 630 may be bonded to the second contact pad 700 of the second contact structure ST2, and the first bonding insulation layer 450 may be bonded to the second bonding insulation layer 350 of the second contact structure. At this time, an upper surface of the third portion 630 may be located at the same or substantially the same level as the upper surface of the first bonding insulation layer 450. That is, the upper surface of the third portion 630 and the upper surface of the first bonding insulation layer 450 may be located at substantially the same distance from the upper surface of the circuit element wire PTM.

In an embodiment, the third width W3 of the third portion 630 along the horizontal direction (the first direction (X direction) and/or the second direction (Y direction)) may be greater than or equal to the first width W1 of the first portion 610 along the horizontal direction (the first direction (X direction) and/or the second direction (Y direction)). In addition, the third width W3 of the third portion 630 along the horizontal direction (the first direction (X direction) and/or the second direction (Y direction)) may be smaller than the second width W2 between the both outer surfaces 620_E opposite each other along the horizontal direction (the first direction (X direction) and/or the second direction (Y direction)) of the second portion 620. Here, the second width W2 between the both outer surfaces 620_E of the second portion 620 opposite each other along the horizontal direction (the first direction (X direction) and/or the second direction (Y direction)) may mean a maximum width between the first outer surface 620_E1 and the second outer surface 620_E2 of the second portion 620 that face each other. Accordingly, during the process of forming the first contact pad 600, the void VD may be easily formed within the second portion 620.

In an embodiment, a central axis of the third portion 630 and a central axis of the second portion 620 may be aligned. Here, the central axis of the third portion 630 may extend in the third direction (Z direction), and may mean an axis passing through a center of the third portion 630. In addition, the central axis of the second portion 620 may extend in the third direction (Z direction), and may mean an axis passing through a center of the second portion 620. This may be due to the process characteristics of, in the process of forming the second portion 620, forming the extension portion (EN in FIG. 25) by equally removing both sides of the third trench (TR3 in FIG. 24).

In an embodiment, it is described that a single third portion 630 is located on the second portion 620, but example embodiments are not limited thereto. For example, a plurality of third portions 630 may be provided on the second portion 620. This will be later described in detail with reference to FIG. 7.

Referring back to FIG. 1, the second contact structure ST2 of a semiconductor device according to an embodiment may include a second insulation structure 300 located on the first contact structure ST1, an upper contact via UC1 and an upper wire UM1 penetrating at least a portion of the first insulation structure 400, and the second contact pad 700 electrically connect the upper wire UM1 and the first contact pad 600.

In an embodiment, the second insulation structure 300 may include the second bonding insulation layer 350 located on the first contact structure ST1, a plurality of upper interlayer insulation layers 310, 320, and 330 located on the second bonding insulation layer 350, and a plurality of upper barrier layers UB1 and UB2.

The second bonding insulation layer 350 may be located on the first bonding insulation layer 450. The second bonding insulation layer 350 may contact the first bonding insulation layer 450.

In an embodiment, a bottom surface of the second bonding insulation layer 350 may configure bonding surface where the first contact structure ST1 and the second contact structure ST2 are bonded. For example, the second bonding insulation layer 350 may be bonded to the first bonding insulation layer 450 by hybrid bonding. Accordingly, the bottom surface of the second bonding insulation layer 350 may configure a portion of the bonding surface between the first contact structure ST1 and the second contact structure ST2.

The second bonding insulation layer 350 may include an insulating material. The second bonding insulation layer 350 may include the same material as the first bonding insulation layer 450. The second bonding insulation layer 350 may include a material having etch selectivity with respect to the plurality of upper interlayer insulation layers 310, 320, and 330, but example embodiments are not limited thereto. For example, the second bonding insulation layer 350 may include silicon carbonitride, but example embodiments are not limited thereto.

In an embodiment, the plurality of upper barrier layers UB1 and UB2 may include a first upper barrier layer UB1 and a second upper barrier layer UB2. The second upper barrier layer UB2 may be located on the second bonding insulation layer 350. The second upper barrier layer UB2 may located to be spaced apart from the second bonding insulation layer 350 in the third direction (Z direction). The first upper barrier layer UB1 may be located on the second upper barrier layer UB2. The first upper barrier layer UB1 may located to be spaced apart from the second upper barrier layer UB2 in the third direction (Z direction).

The plurality of upper barrier layers UB1 and UB2 may include an insulating material. The plurality of upper barrier layers UB1 and UB2 may include the same material as the plurality of lower barrier layers LB1 and LB2. For example, the plurality of upper barrier layers UB1 and UB2 may include silicon nitride. However, example embodiments are not limited thereto, and each of the plurality of upper barrier layers UB1 and UB2 may include at least one of silicon nitride oxide, silicon carbonitride, and silicon carbonitride. The plurality of upper barrier layers UB1 and UB2 may serve as a barrier to limit and/or prevent a material forming the upper wire UM1 and the upper contact via UC1 from being diffused to surroundings, in the process of manufacturing the upper wire UM1 and the upper contact via UC1.

In FIG. 1 and FIG. 2, the number of the plurality of upper barrier layers UB1 and UB2 is shown to be 2, but example embodiments are not limited thereto. For example, the second insulation structure 300 may include one upper barrier layer. As another example, the second insulation structure 300 may include three or more upper barrier layers. As a still another example, the second insulation structure 300 may not include the plurality of upper barrier layers UB1 and UB2. This will be later described in detail with reference to FIG. 14.

The plurality of upper interlayer insulation layers 310, 320, and 330 of a semiconductor device according to an embodiment may include a first upper interlayer insulation layer 310, a second upper interlayer insulation layer 320, and a third upper interlayer insulation layer 330. In an embodiment, the upper contact via UC1 may be located within the first upper interlayer insulation layer 310, and the upper wire UM1 may be located within the second upper interlayer insulation layer 320. However, this is merely an example, and example embodiments are not limited thereto. For example, the upper contact via UC1 and the upper wire UM1 may be located within one of the plurality of upper interlayer insulation layers 310, 320, and 330. The description on the plurality of upper interlayer insulation layers 310, 320, and 330 is substantially the same as the description on the plurality of lower interlayer insulation layers 410, 420, and 430 of the first insulation structure 400, and is not included herein.

In an embodiment, the upper wire UM1 may be located within the second upper interlayer insulation layer 320. The upper contact via UC1 may penetrate the first upper barrier layer UB1 and the first upper interlayer insulation layer 310, and be connected to the upper wire UM1. Accordingly, the upper wire UM1 may be electrically connected to external elements and/or devices through the upper contact via UC1.

In an embodiment, the second contact pad 700 may be located within the second insulation structure 300.

In more detail, the second contact pad 700 may penetrate at least a portion of the plurality of upper interlayer insulation layers 310, 320, and 330 and at least a portion of the plurality of upper barrier layers UB1 and UB2. The second contact pad 700 may be located between the upper wire UM1 and the first contact structure ST1. For example, the second contact pad 700 may extend in the third direction (Z direction), penetrate the third upper interlayer insulation layer 330 and the second upper barrier layer UB2, and be connected to the upper wire UM1. However, but example embodiments are not limited thereto, and the second contact pad 700 may be located to penetrate at least one layer of the plurality of upper interlayer insulation layers 310, 320, and 330. Alternatively, the second contact pad 700 may not penetrate the plurality of upper barrier layers UB1 and UB2. Hereinafter, as an example, an embodiment that the second contact pad 700 penetrates the third upper interlayer insulation layer 330 and the second upper barrier layer UB2 will be described in detail.

In an embodiment, the second contact pad 700 may be bonded to the first contact pad 600 by hybrid bonding. The second contact pad 700 may be bonded to the first contact pad 600 in a directly contacting state, and may form metal bonding. In addition, the second contact pad 700 may extend in the third direction (Z direction). As such, the first contact pad 600 of the first contact structure ST1 and the second contact pad 700 of the second contact structure ST2 may be bonded, and may provide an electrical connection path between the first contact structure ST1 and the second contact structure ST2. For example, an external element connected to the second contact structure ST2 may be electrically connected to the circuit element connected to the circuit element wire PTM by the first contact pad 600 and the second contact pad 700.

A side surface of the second contact pad 700 may include an inclined shaped with respect to the upper surface of the circuit element wire PTM. For example, a portion of the side surface of the second contact pad 700 may include an inclined shape with respect to the upper surface of the circuit element wire PTM, and at this time, the inclined surface may have a taper shape. That is, width of the second contact pad 700 along the horizontal direction (the first direction (X direction) and/or the second direction (Y direction)) may include portion decreasing with a distance from the upper surface of the circuit element wire PTM. In other words, a width of a portion of the second contact pad 700 along the horizontal direction (the first direction (X direction) and/or the second direction (Y direction)) may decrease with a distance from an upper surface of the second bonding insulation layer 350. However, but example embodiments are not limited thereto, and the side surface of the second contact pad 700 may have an inclined shape with respect to the upper surface of the circuit element wire PTM, and at this time, inclined surface may have an inverse taper shape. As another example, the side surface of the second contact pad 700 may have a shape perpendicular to the upper surface of the circuit element wire PTM. This will be later described in detail with reference to FIG. 12.

In an embodiment, the second contact pad 700 may include a third conductive layer 700*c*, a second conductive layer 700*b* surrounding the third conductive layer 700*c*, and a first conductive layer 700*a* surrounding the second conductive layer 700*b*. The third conductive layer 700*c* may contact the third conductive layer 600*c* of the first contact pad 600. The second conductive layer 700*b* may contact the second conductive layer 600*b* of the first contact pad 600, but example embodiments are not limited thereto. For example, the second conductive layer 700*b* may contact the third conductive layer 600*c* of the first contact pad 600. The first conductive layer 700*a* may contact the first conductive layer 600*a* of the first contact pad 600, but example embodiments are not limited thereto. For example, the first conductive layer 700*a* may contact the third conductive layer 600*c* of the first contact pad 600. First to third conductive layers 700*a* to 700*c* may include the same material as first to third conductive layers 600*a* to 600*c* of the first contact pad 600.

In an embodiment, it is described that the second contact pad 700 includes first to third conductive layers 700*a* to 700*c*, but example embodiments are not limited thereto. For example, the second contact pad 700 may be formed of two or less layers. Alternatively, the second contact pad 700 may be formed of four or more layers.

In an embodiment, the width of the second contact pad 700 along the horizontal direction (the first direction (X direction) and/or the second direction (Y direction)) may be larger than a width of the third portion 630 of the first contact pad 600 along the horizontal direction (the first direction (X direction) and/or the second direction (Y direction)). However, example embodiments are not limited thereto, and for example, the width of the second contact pad 700 along the horizontal direction (the first direction (X direction) and/or the second direction (Y direction)) may be substantially the same as the width of the third portion 630 of the first contact pad 600 along the horizontal direction (the first direction (X direction) and/or the second direction (Y direction)).

FIG. 1 illustrates that the number of contact structures of a semiconductor device according to an embodiment is 2, but example embodiments are not limited thereto. For example, a semiconductor device according to some embodiments may include three or more contact structure.

The first contact structure ST1 and the second contact structure ST2 of a semiconductor device according to an embodiment may be bonded by hybrid bonding. At this time, when the first contact pad 600 and the second contact pad 700 are bonded through the annealing process, the first contact pad 600 and/or the second contact pad 700 may be thermally expanded. For example, the first contact pad 600 may thermally expand so as to protrude from the upper surface of the first contact structure ST1. Meanwhile, during the process of performing the annealing process, in order to limit and/or prevent the first contact structure ST1 and the second contact structure ST2 from being separated, a chemical mechanical polishing process for removing at least a portion of the first contact pad 600 and the second contact pad 700 may be additionally perform before bonding the first contact structure ST1 and the second contact structure ST2.

The first contact pad 600 of a semiconductor device according to an embodiment may include the second portion 620 protruding in the horizontal direction (the first direction (X direction) and/or the second direction (Y direction)). For example, the second portion 620 of the first contact pad 600 may protrude from the third portion 630 in the horizontal direction (the first direction (X direction) and/or the second direction (Y direction)). In addition, the second portion 620 may be provided with the void VD in a central portion. The void VD may provide a space allowing expansion of the first contact pad 600. Therefore, when the annealing process is performed, the first contact pad 600 of a semiconductor device according to an embodiment may thermally expand into the void VD, and may limit and/or prevent the first contact structure ST1 and the second contact structure ST2 from being separated.

In addition, since the first contact pad 600 of a semiconductor device according to an embodiment may thermally expand into the void VD, the first contact pad 600 may not protrude from the upper surface of the first contact structure ST1 even if the annealing process is performed. Therefore, the chemical mechanical polishing process of removing at least a portion of the first contact pad 600 and the second contact pad 700 may be streamlined or omitted. Accordingly, non-bonding of the first contact pad 600 and the second contact pad 700 due to excessive chemical mechanical polishing process may be limited and/or prevented, and the reliability of a semiconductor device may be improved.

Hereinafter, referring further to FIG. 3 to FIG. 10, the first contact pad 600 of a semiconductor device according to some embodiments will be described in detail.

FIG. 3 to FIG. 10 are cross-sectional views correspond to the region A1 of FIG. 1, showing a semiconductor device according to some embodiments.

A semiconductor device according to the embodiment shown in FIG. 3 to FIG. 10 has many of the same parts with a semiconductor device according to the embodiment shown in FIG. 1 and FIG. 2, and thus, in the description below, differences are focused on, omitting redundant description to the same parts. In addition, same reference numerals are used to the same element as the above embodiments. In the present embodiment, the shape of the first contact pad 600 is different from the above embodiments, which will be described below.

Referring to FIG. 1 and FIG. 3 to FIG. 10, a semiconductor device according to some embodiments may include the circuit element wire PTM, the first contact structure ST1 located on the circuit element wire PTM, and the second contact structure ST2 located on the first contact structure ST1.

The first contact structure ST1 of a semiconductor device according to some embodiments may include the first insulation structure 400 located on the circuit element wire PTM, the lower contact via LC1 and the lower wire LM1 penetrating at least a portion of the first insulation structure 400, and the first contact pad 600 electrically connected to the lower wire LM1. In addition, the first contact pad 600 may include the first portion 610 penetrating the third lower interlayer insulation layer 430, the second portion 620 including the void VD on the first portion 610, and the third portion located on the second portion 620.

Figure 3:
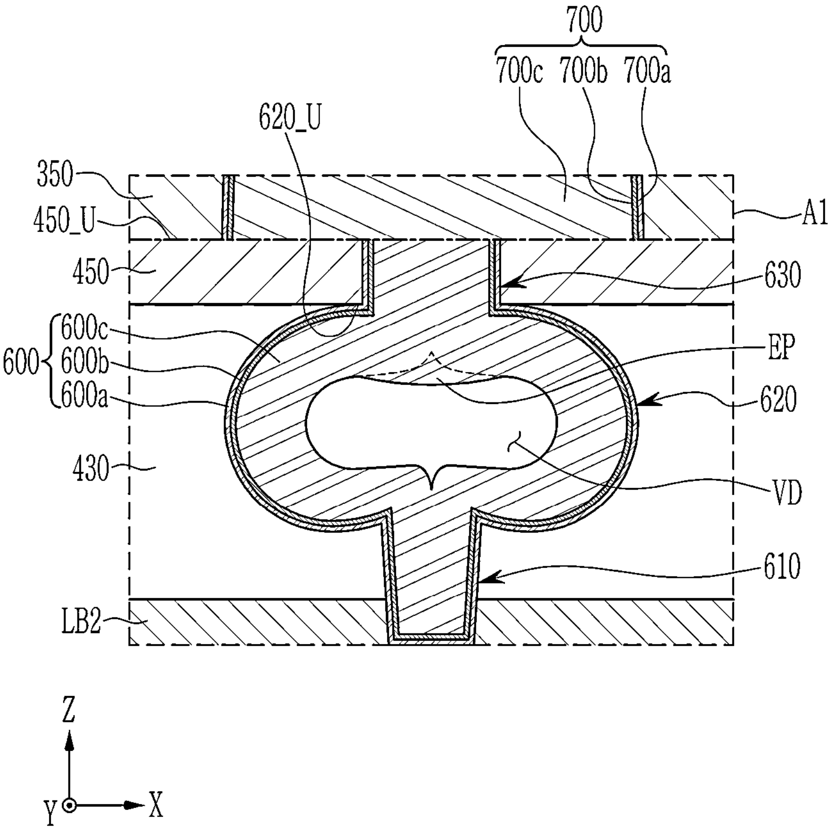
FIG. 3 to FIG. 10 are cross-sectional views correspond to the region A1 of FIG. 1, showing a semiconductor device according to some embodiments.
Figure 4:
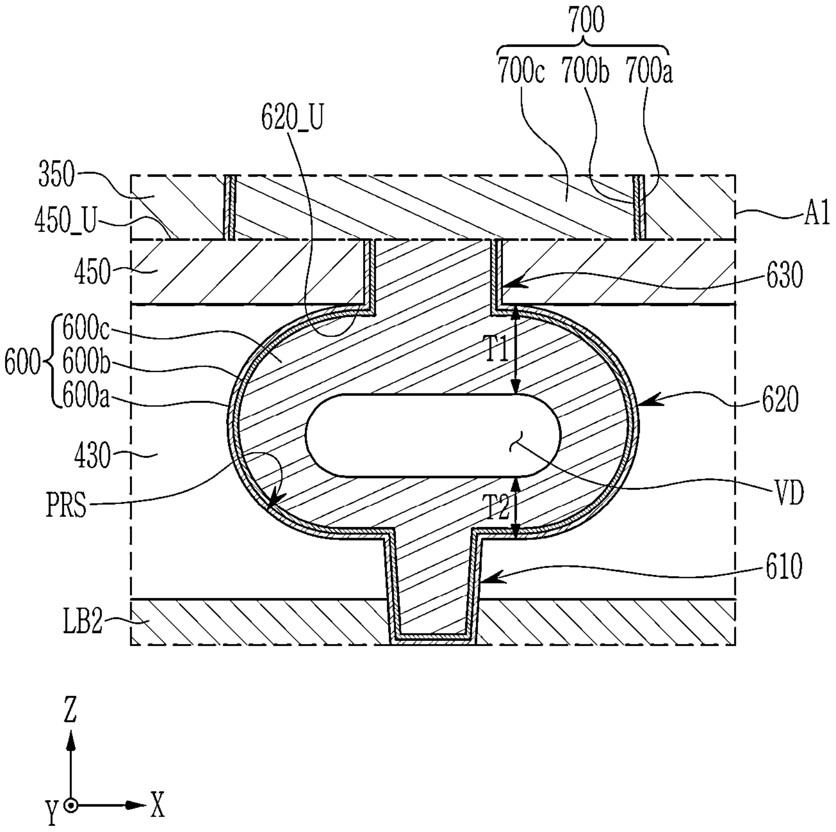

Referring to FIG. 1, FIG. 3, and FIG. 4, the second portion 620 of the first contact pad 600 according to some embodiments may include portions having different thicknesses. For example, a thickness of a lower portion of the second portion 620 connected to the first portion 610 to cover the lower region of the void VD may be smaller than a thickness of an upper portion of the second portion 620 connected to the third portion 630 to cover the upper region of the void VD.

As an example, as shown in FIG. 3, the second portion 620 of the first contact pad 600 may further include a protrusion pattern EP located in the upper portion of the second portion 620. The protrusion pattern EP may be located between the upper portion of the second portion 620 and the void VD. That is, an upper surface of the void VD may be defined by the protrusion pattern EP. The protrusion pattern EP may be a portion formed as the first contact pad 600 expands when the annealing process is performed on the first contact pad 600. When the annealing process is performed, the first contact pad 600 may thermally expand into the void VD, and form the protrusion pattern EP. Accordingly, a thickness of the upper portion of the second portion 620 connected to the first portion 610 to cover the lower region of the void VD may be thicker than a thickness of the lower portion of the second portion 620 connected to the third portion 630 to cover the upper region of the void VD.

As another example, referring to FIG. 4, a first thickness T1 of the upper portion of the second portion 620 connected to the first portion 610 to cover the upper region of the void VD may be thicker than a second thickness T2 of the lower portion of the second portion 620 connected to the third portion 630 to cover the lower region of the void VD. This may be due to the process characteristic that, in the process of conformally forming the first contact pad 600 within the contact recess PRS, the upper portion of the second portion 620 formed thicker than the lower portion of the second portion 620.

Figure 5:
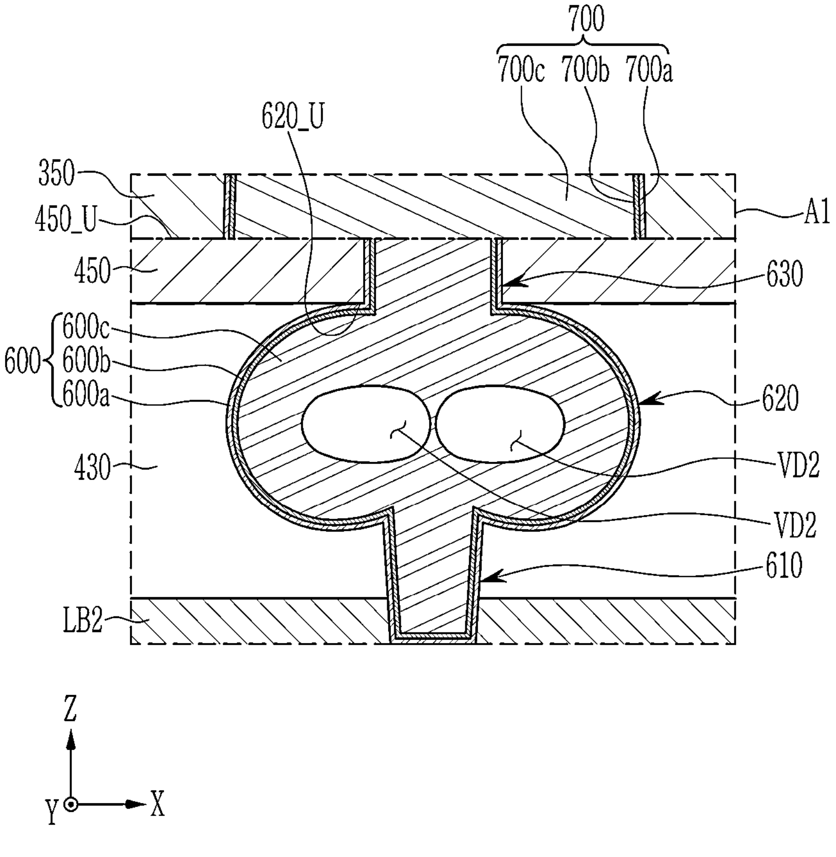

Referring to FIG. 1 and FIG. 5, the second portion 620 of the first contact pad 600 according to some embodiments may include a plurality of voids VD1 and VD2.

Each of the plurality of voids VD1 and VD2 may be surrounded by the second portion 620. That is, each of the plurality of voids VD1 and VD2 may be defined by an inner surface of the second portion 620. Each of the plurality of voids VD1 and VD2 may be located to be adjacent in the horizontal direction (the first direction (X direction) and/or the second direction (Y direction)). At this time, the second portion 620 may further include a portion extending from between the plurality of voids VD1 and VD2 to between the upper portion of the second portion 620 and the lower portion of the second portion 620.

FIG. 5 illustrates that the number of the plurality of voids VD1 and VD2 is 2, but example embodiments are not limited thereto. For example, the void VD located within the second portion 620 may be provided as a single quantity, and may have a Torus structure. As another example, 3 or more voids VD may be located within the second portion 620.

Figure 6:
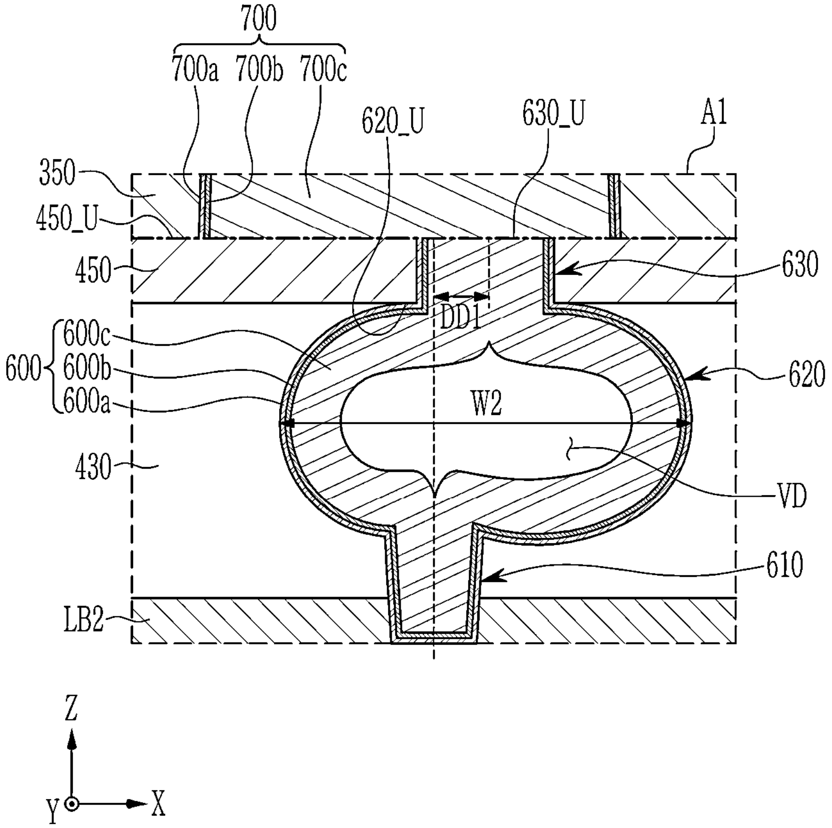

Referring to FIG. 1 and FIG. 6, the central axis of the third portion 630 and a central axis of the first portion 610 according to some embodiments may parallelly extend. That is, a first distance DD1 along the second direction (Y direction) may be formed between the central axis of the third portion 630 and the central axis of the first portion 610. The first distance DD1 between the central axis of the third portion 630 and the central axis of the first portion 610 along the second direction (Y direction) may be smaller than the second width W2 between the both outer surfaces 620_E opposite each other along the horizontal direction (the first direction (X direction) and/or the second direction (Y direction)) of the second portion 620. Here, the central axis of the third portion 630 may extend in the third direction (Z direction), and may mean an axis passing through the center of the third portion 630. In addition, the central axis of the first portion 610 may extend in the third direction (Z direction), and may mean an axis passing through a center of the first portion 610.

In some embodiments, the central axis of the third portion 630 and the central axis of the second portion 620 may be aligned. Therefore, the central axis of the second portion 620 and the central axis of the first portion 610 may parallelly extend. This may be due to the process characteristics in which the first portion 610 and the second trench (TR2 in FIG. 23) for forming the second portion 620 and the third portion 630 are misaligned. Meanwhile, even in this case, since the first contact pad 600 connected to the circuit element wire PTM may be formed through an extension portion EN, an alignment margin may be secured.

Figure 7:
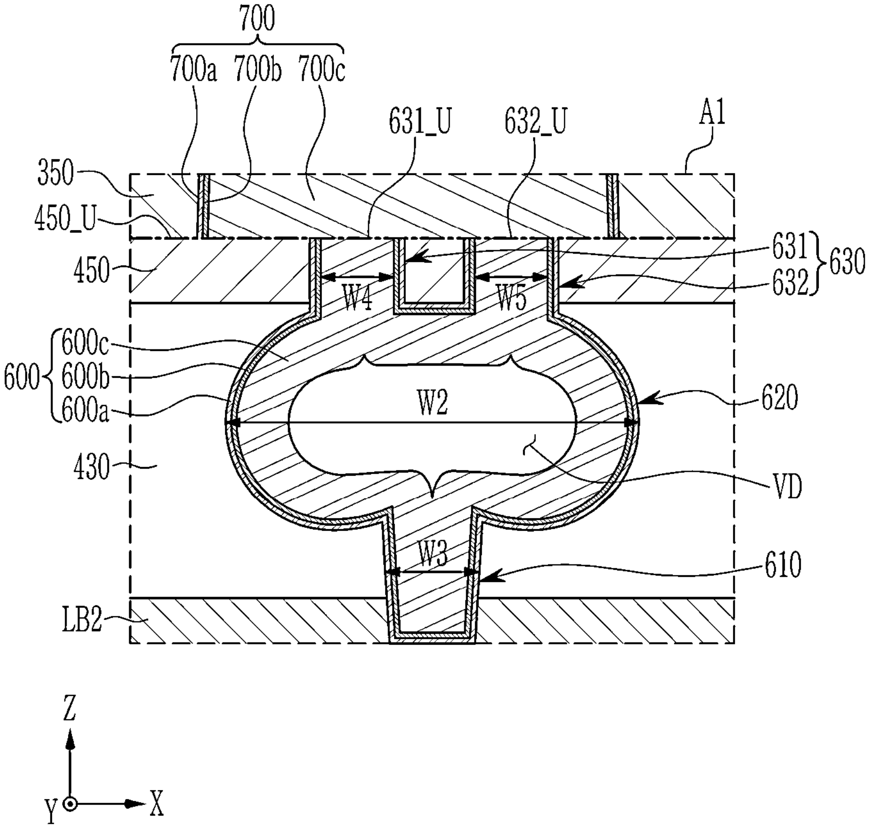

Referring to FIG. 1 and FIG. 7, the third portion 630 of the first contact pad 600 according to some embodiments may be provided in a plural quantity.

In an embodiment, the third portion 630 may include a first pattern 631 and a second pattern 632. The first pattern 631 and the second pattern 632 may be located to be apart from each other. For example, as shown in FIG. 7, the first pattern 631 and the second pattern 632 may be located to be spaced apart in the second direction (Y direction). However, but example embodiments are not limited thereto, and the first pattern 631 and the second pattern 632 may be located to be spaced apart in the first direction (X direction). That is, the first pattern 631 and the second pattern 632 may be located to be spaced apart in the horizontal direction (the first direction (X direction) and/or the second direction (Y direction)).

In an embodiment, a sum of a fourth width W4 of the first pattern 631 along the horizontal direction (the first direction (X direction) and/or the second direction (Y direction)) and a fifth width W5 of the second pattern 632 along the horizontal direction (the first direction (X direction) and/or the second direction (Y direction)) may be smaller than the second width W2 between the both outer surfaces 620_E opposite each other along the horizontal direction (the first direction (X direction) and/or the second direction (Y direction)) of the second portion 620. That is, the fourth width W4 of the first pattern 631 along the horizontal direction (the first direction (X direction) and/or the second direction (Y direction)) may be smaller than the second width W2 between the both outer surfaces 620_E opposite each other along the horizontal direction (the first direction (X direction) and/or the second direction (Y direction)) of the second portion 620. The fifth width W5 of the second pattern 632 along the horizontal direction (the first direction (X direction) and/or the second direction (Y direction)) may be smaller than the second width W2 between the both outer surfaces 620_E opposite each other along the horizontal direction (the first direction (X direction) and/or the second direction (Y direction)) of the second portion 620. In addition, a sum of the fourth width W4 of the first pattern 631 along the horizontal direction (the first direction (X direction) and/or the second direction (Y direction)) and the fifth width W5 of the second pattern 632 along the horizontal direction (the first direction (X direction) and/or the second direction (Y direction)) may be larger than the third width W3 of the third portion 630 along the horizontal direction (the first direction (X direction) and/or the second direction (Y direction)). Accordingly, during the process of forming the first contact pad 600, the void VD may be easily formed within the second portion 620.

In an embodiment, each of the first pattern 631 and the second pattern 632 may penetrate the first bonding insulation layer 450. The first pattern 631 and the second pattern 632 may overlap the first bonding insulation layer 450 in the horizontal direction (the first direction (X direction) and/or the second direction (Y direction)). An upper surface 631_U of the first pattern 631 and an upper surface 632_U of the second pattern 632 may configure the bonding surface between the first contact structure ST1 and the second contact structure ST2 together with the first bonding insulation layer 450. For example, the first pattern 631 and the second pattern 632 may be bonded to the second contact pad 700 of the second contact structure ST2. Accordingly, the first pattern 631 and the second pattern 632 may be electrically connected to the second contact pad 700.

Figure 8:
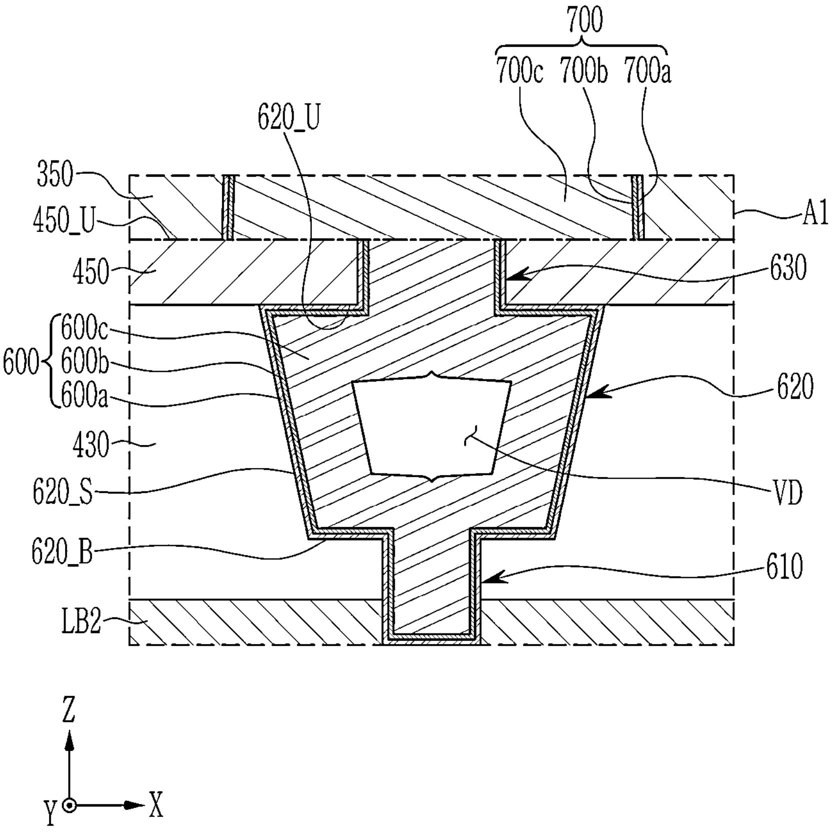
Figure 9:
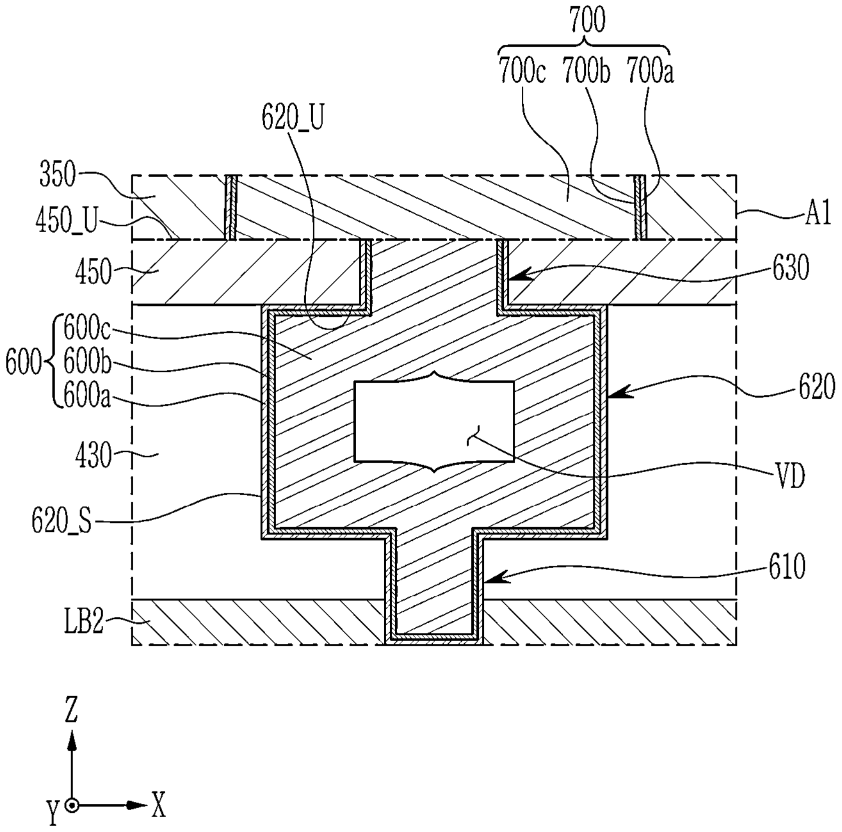

Referring to FIG. 1, FIG. 8, and FIG. 9, a side surface 620_S of the second portion 620 according to some embodiments may include a flat portion.

First, referring to FIG. 8, the side surface 620_S of the second portion 620 according to some embodiments may have an inclined shape with respect to the upper surface of the circuit element wire PTM, and at this time, inclined surface may have an inverse taper shape. That is, a width of the second portion 620 along the horizontal direction (the first direction (X direction) and/or the second direction (Y direction)) may increase away from the upper surface of the circuit element wire PTM. In other words, the width of the second portion 620 along the horizontal direction (the first direction (X direction) and/or the second direction (Y direction)) may decrease with a distance from the bottom surface of the first bonding insulation layer 450. At this time, an angle formed by the side surface 620_S of the second portion 620 and a bottom surface 620_B of the second portion 620 may be 90 degrees or more, but example embodiments are not limited thereto. Alternatively, referring to FIG. 9, a side surface of the second portion 620 may have a shape perpendicular to the upper surface of the circuit element wire PTM.

Figure 10:
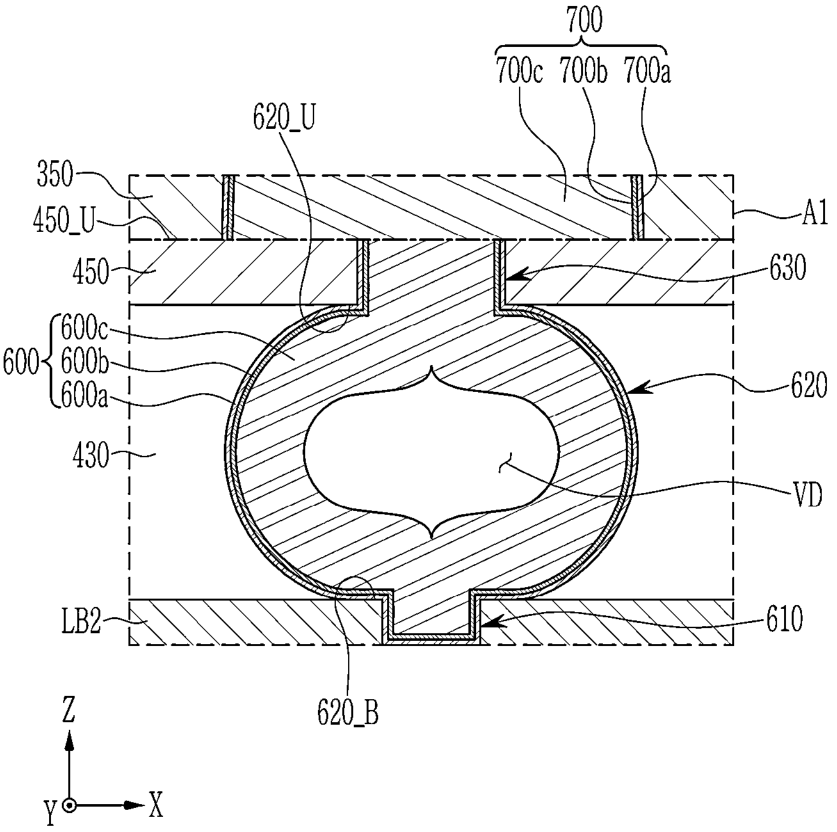

Referring to FIG. 1 and FIG. 10, the bottom surface 620_B of the second portion 620 according to some embodiments may contact the second lower barrier layer LB2.

In some embodiments, the first portion 610 may not penetrate the plurality of lower interlayer insulation layers 410, 420, and 430. That is, the first portion 610 may penetrate the second lower barrier layer LB2, and may completely overlap the second lower barrier layer LB2 and the horizontal direction (the first direction (X direction) and/or the second direction (Y direction)).

In some embodiments, the second portion 620 may be located within the third lower interlayer insulation layer 430. The second portion 620 may completely penetrate the third lower interlayer insulation layer 430. That is, the bottom surface 620_B of the second portion 620 may contact the second lower barrier layer LB2, and the upper surface 620_U of the second portion 620 may contact the first bonding insulation layer 450.

Hereinafter, a semiconductor device according to some embodiments with be described in detail with reference to FIG. 11 and FIG. 12.

Figure 11:
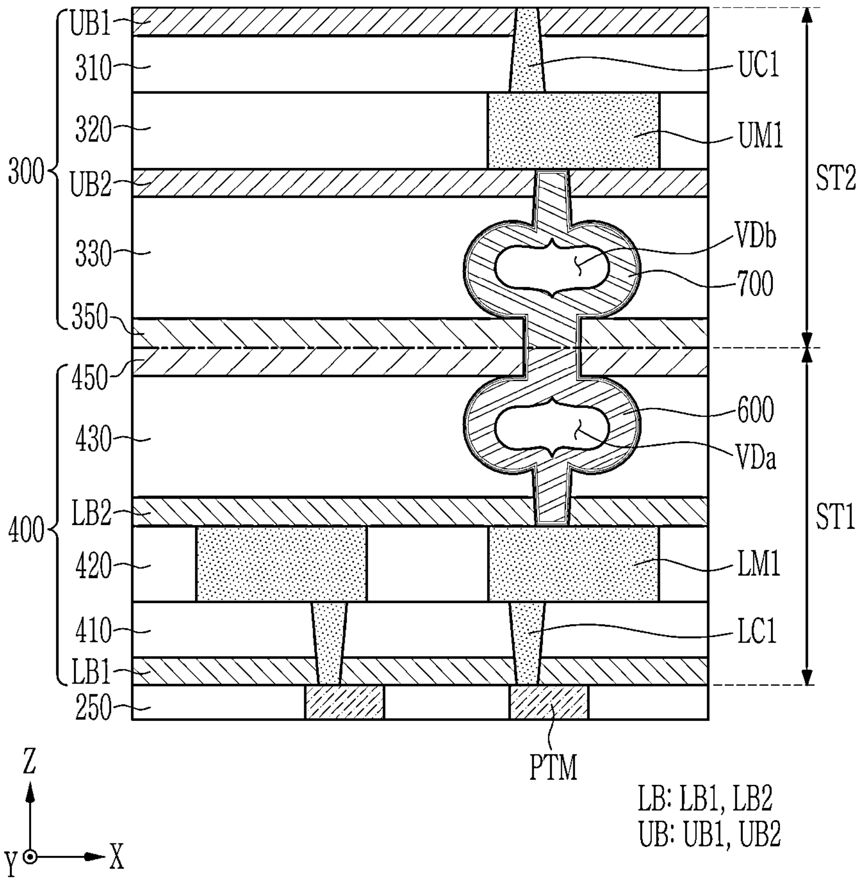
FIG. 11 to FIG. 15 is a cross-sectional view showing a semiconductor device according to some embodiments.
Figure 12:
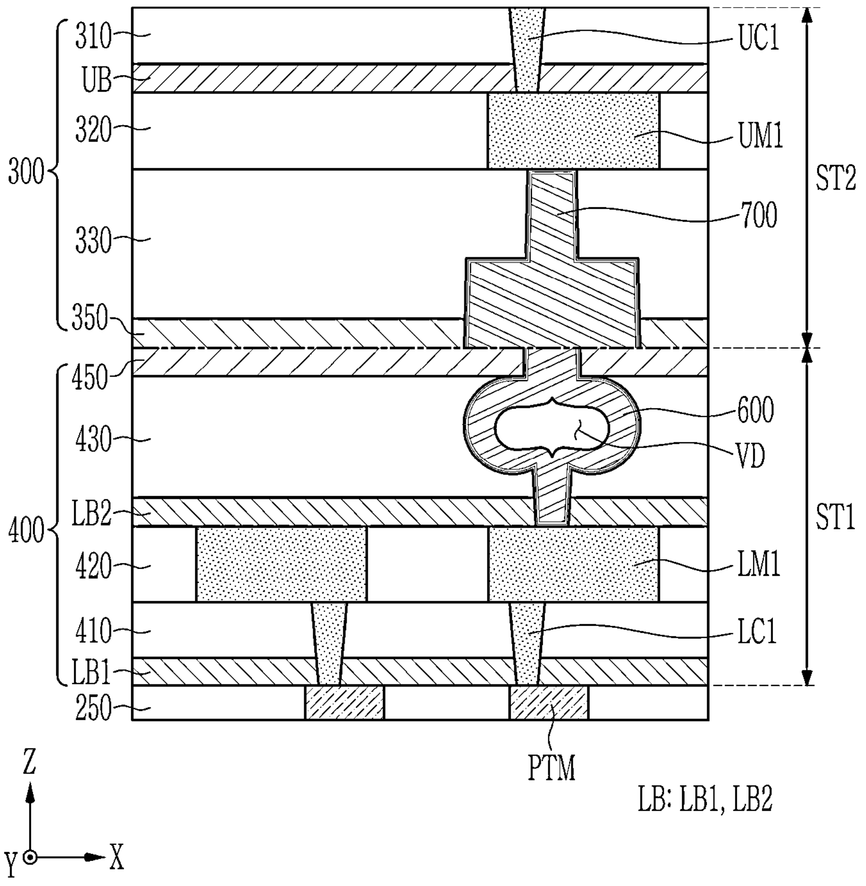

FIG. 11 and FIG. 12 is a cross-sectional view showing a semiconductor device according to some embodiments.

A semiconductor device according to the embodiment shown in FIG. 11 and FIG. 12 has many of the same parts with a semiconductor device according to the embodiment shown in FIG. 1 and FIG. 2, and thus, in the description below, differences are focused on, omitting redundant description to the same parts. In addition, same reference numerals are used to the same element as the above embodiments. In the present embodiment, the shape of the second contact pad 700 of the second contact structure ST2 is different from the above embodiments, which will be described below.

Referring to FIG. 11 and FIG. 12, a semiconductor device according to some embodiments may include the circuit element wire PTM, the first contact structure ST1 located on the circuit element wire PTM, and the second contact structure ST2 located on the first contact structure ST1.

The first contact structure ST1 of a semiconductor device according to some embodiments may include the first insulation structure 400 located on the circuit element wire PTM, the lower contact via LC1 and the lower wire LM1 penetrating at least a portion of the first insulation structure 400, and the first contact pad 600 electrically connected to the lower wire LM1. In addition, the second contact structure ST2 of a semiconductor device according to some embodiments may include the second insulation structure 300 located on the first contact structure ST1, the upper contact via UC1 and the upper wire UM1 penetrating at least a portion of the first insulation structure 400, and the second contact pad 700 electrically connecting the upper wire UM1 and the first contact pad 600.

Referring to FIG. 11, the second contact pad 700 may include a portion penetrating the second bonding insulation layer 350, a portion protruding from the portion penetrating the second bonding insulation layer 350 and interiorly including a second void VDb, and a portion extending in the third direction (Z direction) and penetrating the second upper barrier layer UB2.

In some embodiments, the second contact pad 700 may have a shape symmetrical to the first contact pad 600 with respect to the bottom surface of the second bonding insulation layer 350. That is, the second contact pad 700 includes the second void VDb, and may have a shape symmetrical to first void VDa of the first contact pad 600 with respect to the bottom surface of the second bonding insulation layer 350. The description on the second contact pad 700 is substantially the same as the description on the first contact pad 600 of the embodiment of FIG. 1 and FIG. 2, and is not proved herein again.

Referring to FIG. 12, in some embodiments, the side surface of the second contact pad 700 may have an inclined shape with respect to the upper surface of the circuit element wire PTM, and at this time, inclined surface may have an inverse taper shape. That is, the width of the second contact pad 700 along the horizontal direction (the first direction (X direction) and/or the second direction (Y direction)) may increase away from the upper surface of the circuit element wire PTM. In other words, the width of the second contact pad 700 along the horizontal direction (the first direction (X direction) and/or the second direction (Y direction)) may increase away from the upper surface of the second bonding insulation layer 350.

Hereinafter, a semiconductor device according to some embodiments with be described in detail with reference to FIG. 13 to FIG. 16.

Figure 13:
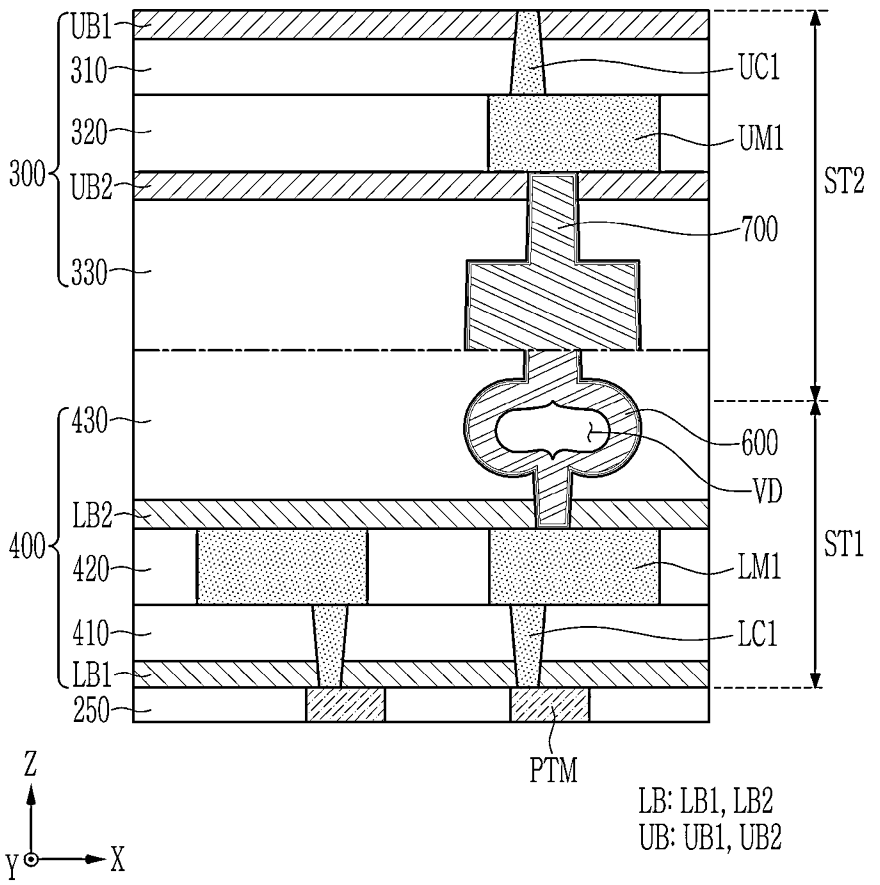
Figure 14:
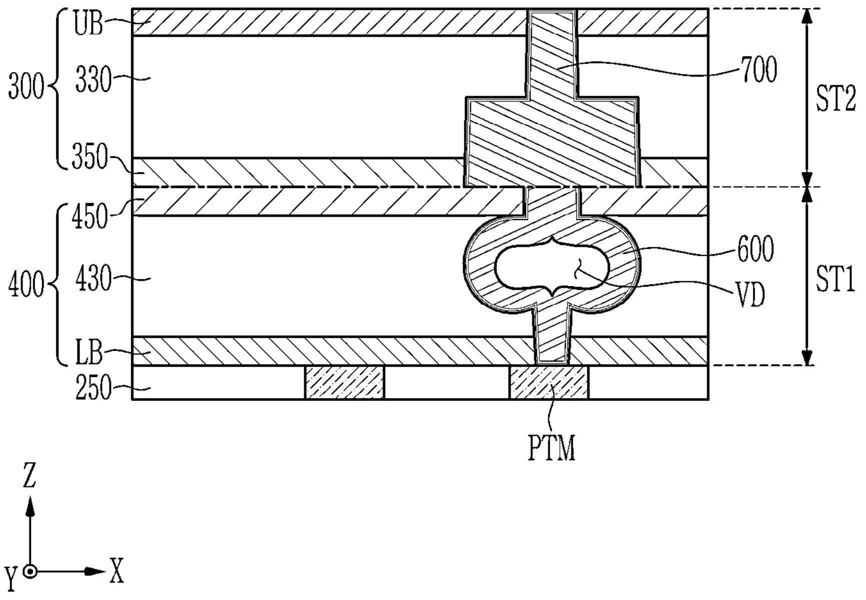
Figure 15:
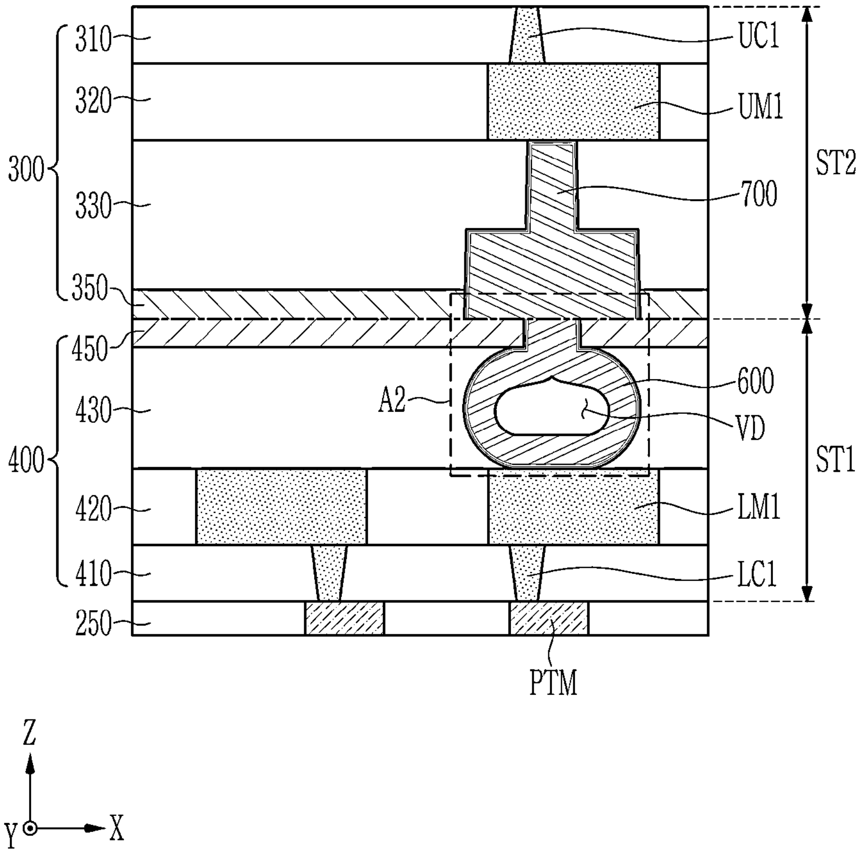
Figure 16:
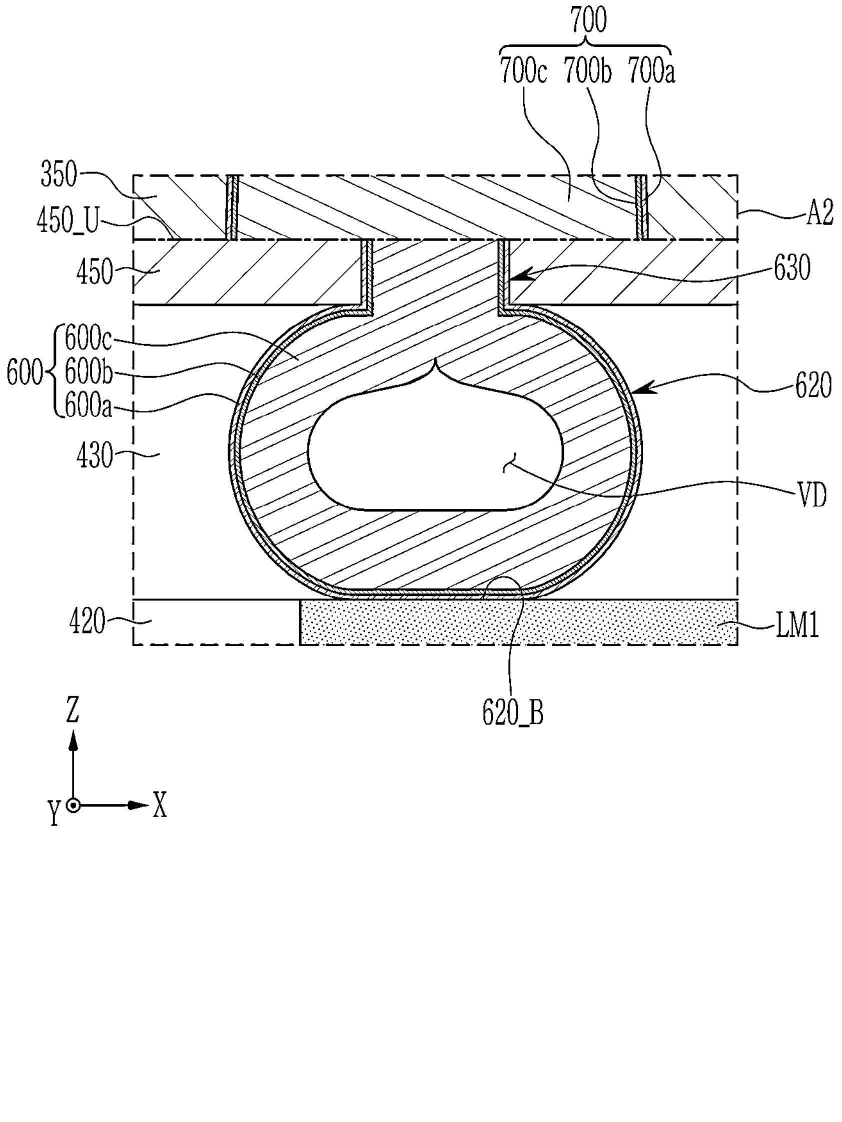
FIG. 16 is an enlarged cross-sectional view of region A2 of FIG. 15.

FIG. 13 to FIG. 15 is a cross-sectional view showing a semiconductor device according to some embodiments. FIG. 16 is an enlarged cross-sectional view of region A2 of FIG. 15.

A semiconductor device according to the embodiment shown in FIG. 13 to FIG. 16 has many of the same parts with a semiconductor device according to the embodiment shown in FIG. 1 and FIG. 2, and thus, in the description below, differences are focused on, omitting redundant description to the same parts. In addition, same reference numerals are used to the same element as the above embodiments. In the present embodiment, the configuration of the first contact structure ST1 is different from the above embodiments, which will be described below.

Referring to FIG. 13 to FIG. 16, a semiconductor device according to some embodiments may include the circuit element wire PTM, the first contact structure ST1 located on the circuit element wire PTM, and the second contact structure ST2 located on the first contact structure ST1.

The first contact structure ST1 of a semiconductor device according to some embodiments may include the first insulation structure 400 located on the circuit element wire PTM, the lower contact via LC1 and the lower wire LM1 penetrating at least a portion of the first insulation structure 400, and the first contact pad 600 electrically connected to the lower wire LM1. In addition, the second contact structure ST2 of a semiconductor device according to some embodiments may include the second insulation structure 300 located on the first contact structure ST1, the upper contact via UC1 and the upper wire UM1 penetrating at least a portion of the first insulation structure 400, and the second contact pad 700 electrically connecting the upper wire UM1 and the first contact pad 600.

In the above embodiments, the first insulation structure 400 may include the first bonding insulation layer 450 located on the third lower interlayer insulation layer 430. The upper surface of the first bonding insulation layer 450 may configure bonding surface where the first contact structure ST1 and the second contact structure ST2 are bonded.

In some embodiments, the first insulation structure 400 may not include at least one of the plurality of lower barrier layers LB1 and LB2, the plurality of lower interlayer insulation layers 410, 420, and 430, the first bonding insulation layer 450, the lower contact via LC1, and the lower wire LM1. In addition, the second insulation structure 300 may not include at least one of the plurality of upper barrier layers UB1 and UB2, the plurality of upper interlayer insulation layers 310, 320, and 330, the second bonding insulation layer 350, the upper contact via UC1, and the upper wire UM1.

For example, referring to FIG. 13, the first insulation structure 400 of a semiconductor device according to some embodiments may not include the first bonding insulation layer 450. In addition, the second insulation structure 300 may not include the second bonding insulation layer 350. That is, the first insulation structure 400 of a semiconductor device according to some embodiments may include the plurality of lower barrier layers LB1 and LB2 and the plurality of lower interlayer insulation layers 410, 420, and 430. In addition, the second insulation structure 300 may include the plurality of upper barrier layers UB1 and UB2 and the plurality of upper interlayer insulation layers 310, 320, and 330.

In some embodiments, an upper surface of the third lower interlayer insulation layer 430 and a bottom surface of the third upper interlayer insulation layer 330 may configure bonding surface where the first contact structure ST1 and the second contact structure ST2 are bonded. For example, the third lower interlayer insulation layer 430 may be bonded to the third upper interlayer insulation layer 330, to configure a portion of the bonding surface between the first contact structure ST1 and the second contact structure ST2.

At this time, the third lower interlayer insulation layer 430 may include the same material as the third upper interlayer insulation layer 330. For example, the third lower interlayer insulation layer 430 and the third upper interlayer insulation layer 330 may include silicon carbonitride. However, but example embodiments are not limited thereto, and the third lower interlayer insulation layer 430 and the third upper interlayer insulation layer 330 may include at least one of silicon oxide, silicon nitride oxide, and silicon carbonitride.

As another example, referring to FIG. 14, the first contact structure ST1 of a semiconductor device according to some embodiments may not include the lower contact via LC1 and the lower wire LM1. In addition, the second contact structure ST2 may not include the upper contact via UC1 and the upper wire UM1. At this time, the first contact pad 600 may penetrate the third lower interlayer insulation layer 430 and lower barrier layer LB, and contact the circuit element wire PTM.

As a still another example, referring to FIG. 15 and FIG. 16, the first insulation structure 400 of a semiconductor device according to some embodiments may not include the plurality of lower barrier layers LB1 and LB2. In addition, the second insulation structure 300 may not include the plurality of upper barrier layers UB1 and UB2. That is, the first insulation structure 400 of a semiconductor device according to some embodiments may include the plurality of lower barrier layers LB1 and LB2 and the first bonding insulation layer 450. In addition, the second insulation structure 300 may include the plurality of upper barrier layers UB1 and UB2 and the second bonding insulation layer 350.

At this time, the first contact pad 600 may not include the first portion 610. That is, the first contact pad 600 may be located on the second portion 620 and the second portion 620 located within the third lower interlayer insulation layer 430, and may include the third portion 630 penetrating the first bonding insulation layer 450. As shown inn FIG. 16, the second portion 620 may penetrate the third lower interlayer insulation layer 430, and be connected to the lower wire LM1. That is, a bottom surface of the second portion 620 may contact the lower wire. Remaining description on the second portion 620 and the third portion 630 of the first contact pad 600 is substantially the same as the description on the second portion 620 and the third portion 630 of the first contact pad 600 of the embodiment of FIG. 1 and FIG. 2, and is not proved herein again.

Hereinafter, a semiconductor device according to some embodiments with be described in detail with reference to FIG. 17.

Figure 17:
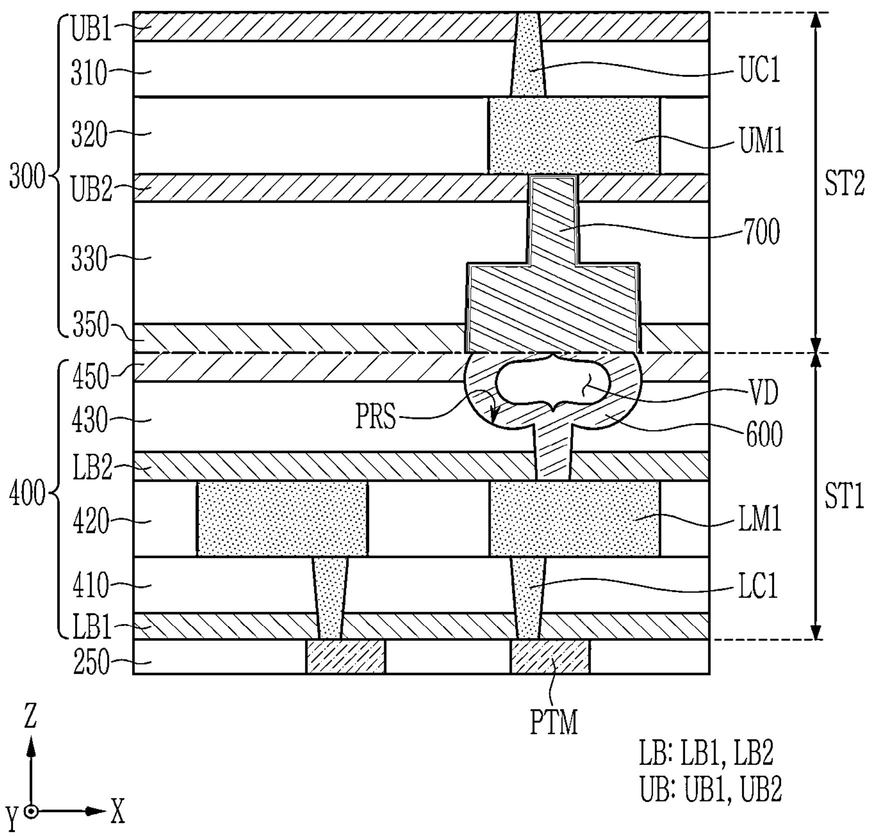
FIG. 17 is a cross-sectional view showing a semiconductor device according to some embodiments.

FIG. 17 is a cross-sectional view showing a semiconductor device according to some embodiments.

A semiconductor device according to the embodiment shown in FIG. 17 has many of the same parts with a semiconductor device according to the embodiment shown in FIG. 1 and FIG. 2, and thus, in the description below, differences are focused on, omitting redundant description to the same parts. In addition, same reference numerals are used to the same element as the above embodiments. In the present embodiment, the shape of the first contact pad 600 is different from the above embodiments, which will be described below.

Referring to FIG. 17, a semiconductor device according to some embodiments may include the circuit element wire PTM, the first contact structure ST1 located on the circuit element wire PTM, and the second contact structure ST2 located on the first contact structure ST1.

The first contact structure ST1 of a semiconductor device according to some embodiments may include the first insulation structure 400 located on the circuit element wire PTM, the lower contact via LC1 and the lower wire LM1 penetrating at least a portion of the first insulation structure 400, and the first contact pad 600 electrically connected to the lower wire LM1. In addition, the second contact structure ST2 of a semiconductor device according to some embodiments may include the second insulation structure 300 located on the first contact structure ST1, the upper contact via UC1 and the upper wire UM1 penetrating at least a portion of the first insulation structure 400, and the second contact pad 700 electrically connecting the upper wire UM1 and the first contact pad 600.

In the above embodiments, the first contact pad 600 may include the first portion 610 penetrating the third lower interlayer insulation layer 430, the second portion 620 including the void VD on the first portion 610, and the third portion located on the second portion 620.

Referring to FIG. 17, the first contact pad 600 of a semiconductor device according to some embodiments may not include the third portion 630. That is, the first portion 610 penetrating the third lower interlayer insulation layer 430 and the second portion 620 including the void VD on the first portion 610 may be included.

The first portion 610 of the first contact pad 600 may be located on the second lower interlayer insulation layer 420. The first portion 610 may extend in the third direction (Z direction) and penetrate the second lower barrier layer LB2, and may penetrate at least a portion of the third lower interlayer insulation layer 430. The description on the first portion 610 is substantially the same as the description on the first portion 610 of the first contact pad 600 of the embodiment of FIG. 1 and FIG. 2, and is not proved herein again.

In some embodiments, the second portion 620 of the first contact pad 600 may be located on the first portion 610. The second portion 620 may penetrate at least a portion of the third lower interlayer insulation layer 430 and the first bonding insulation layer 450. That is, the second portion 620 may be located between the second lower barrier layer LB2 and the second bonding insulation layer 350. That is, the second portion 620 may be located on the bottom surface of the second bonding insulation layer 350. For example, an upper surface of the second portion 620 may contact the bottom surface of the second bonding insulation layer 350, but example embodiments are not limited thereto.

In some embodiments, the second portion 620 may include the void VD located inside the contact recess PRS. The second portion 620 may surround at least a portion of the void VD. For example, the void VD may be located in the upper portion of the second portion 620, and a portion of the upper surface of the void VD may not be surrounded by the second portion 620. That is, the void VD may be defined by the inner surface of the second portion 620 and a bottom surface of the second contact pad 700. This may be due to the process characteristics for removing the residue (e.g., sulfuric acid) within the void VD in the process of forming the first contact pad 600 including the void VD within the contact recess PRS.

In some embodiments, the upper surface of the second portion 620 may configure the bonding surface between the first contact structure ST1 and the second contact structure ST2 together with the first bonding insulation layer 450. For example, the second portion 620 may be bonded to the second contact pad 700, and the first bonding insulation layer 450 may be bonded to the second bonding insulation layer 350. At this time, the upper surface of the second portion 620 may be located at the same or substantially the same level as the upper surface of the first bonding insulation layer 450. That is, the upper surface of the second portion 620 and the upper surface of the first bonding insulation layer 450 may be located at substantially the same distance from the upper surface of the circuit element wire PTM.

Hereinafter, a manufacturing method of a semiconductor device according to an embodiment will be described in detail with reference to FIG. 18 to FIG. 29.

FIG. 18 to FIG. 29 are drawings for intermediate operations for explaining a manufacturing method of a semiconductor memory device according to an embodiment. For convenience of description, descriptions of overlapping contents with those described with reference to FIG. 1 to FIG. 2 may be omitted.

Figure 18:
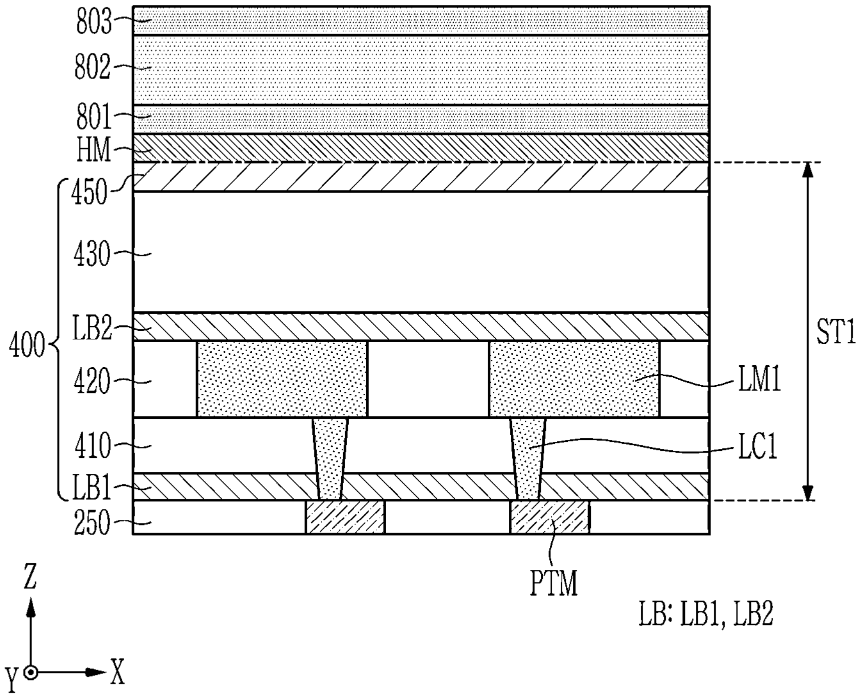
FIG. 18 to FIG. 29 are cross-sectional views showing intermediate operations of a manufacturing method of a semiconductor device according to an embodiment.

Referring to FIG. 18, the first insulation structure 400, a hard mask pattern HM, and first to third etch stop layers 801, 802, and 803 may be formed on the circuit element wire PTM and the interwire insulation layer 250.

First, the first lower barrier layer LB1 may be formed on the circuit element wire PTM and the interwire insulation layer 250, and the first lower interlayer insulation layer 410 and the second lower interlayer insulation layer 420 may be formed on the first lower barrier layer LB1. Subsequently, the lower contact via LC1 penetrating the first lower interlayer insulation layer 410 may be formed, and the lower wire LM1 penetrating the second lower interlayer insulation layer 420 may be formed. Subsequently, the second lower barrier layer LB2 may be formed on the second lower interlayer insulation layer 420 and the lower wire LM1, and the third lower interlayer insulation layer 430 may be formed on the second lower barrier layer LB2.

In an embodiment, for example, the plurality of lower barrier layers LB1 and LB2 may include silicon nitride. However, example embodiments are not limited thereto, and each of the plurality of lower barrier layers LB1 and LB2 may include at least one of silicon nitride oxide, silicon carbonitride, and silicon carbonitride. In addition, in an embodiment, the plurality of lower interlayer insulation layers 410, 420, and 430 may include an insulating material. The plurality of lower interlayer insulation layers 410, 420, and 430 may include the same material, but example embodiments are not limited thereto. The plurality of lower interlayer insulation layers 410, 420, and 430 may include a material having etch selectivity with respect to the plurality of lower barrier layers LB1 and LB2. For example, the plurality of lower interlayer insulation layers 410, 420, and 430 may include silicon oxide. However, example embodiments are not limited thereto, and each of the plurality of lower interlayer insulation layers 410, 420, and 430 may include at least one of silicon nitride oxide, silicon carbonitride, and silicon carbonitride.

Subsequently, the first insulation structure 400 may be formed by forming the first bonding insulation layer 450 on the third lower interlayer insulation layer 430. The first bonding insulation layer 450 may include an insulating material. The first bonding insulation layer 450 may include a material having etch selectivity with respect to the plurality of lower interlayer insulation layers 410, 420, and 430. Specifically, the first bonding insulation layer 450 may include the material having etch selectivity with respect to the third lower interlayer insulation layer 430 in contact with the first bonding insulation layer 450. For example, the first bonding insulation layer 450 may include silicon carbonitride. However, but example embodiments are not limited thereto, and the first bonding insulation layer 450 may be changed in various ways within the range of having have etch selectivity with respect to the third lower interlayer insulation layer 430.

Subsequently, the hard mask pattern HM may be formed on the first bonding insulation layer 450, and the first to third etch stop layers 801, 802, and 803 may be formed on the hard mask pattern HM. The hard mask pattern HM may include at least one of silicon oxide, silicon nitride oxide, and spin on hardmask (SOH). First and third etch stop layers 801 and 803 may include silicon nitride oxide. A second etch stop layer 802 may include a spin on hardmask (SOH), but example embodiments are not limited thereto.

Figure 19:
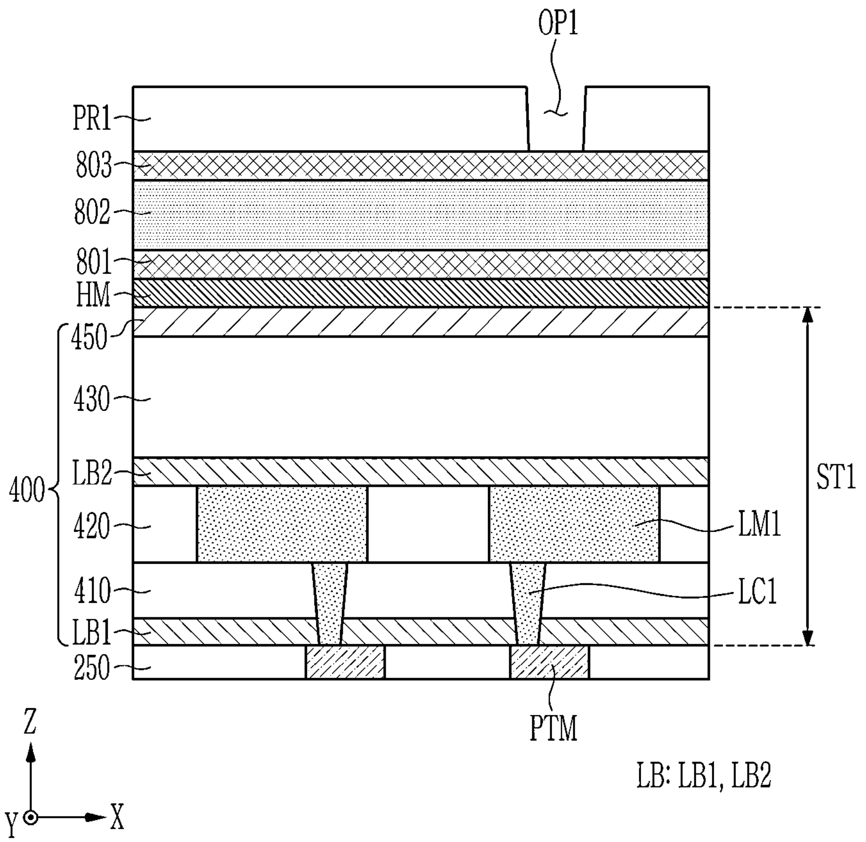

Referring to FIG. 19, a first photoresist PR1 including a first opening OP1 may be formed on a third etch stop layer 803. The first photoresist PR1 may include a photosensitivity material. At this time, the first opening OP1 of the first photoresist PR1 may overlap the lower wire LM1 in the third direction (Z direction).

Figure 20:
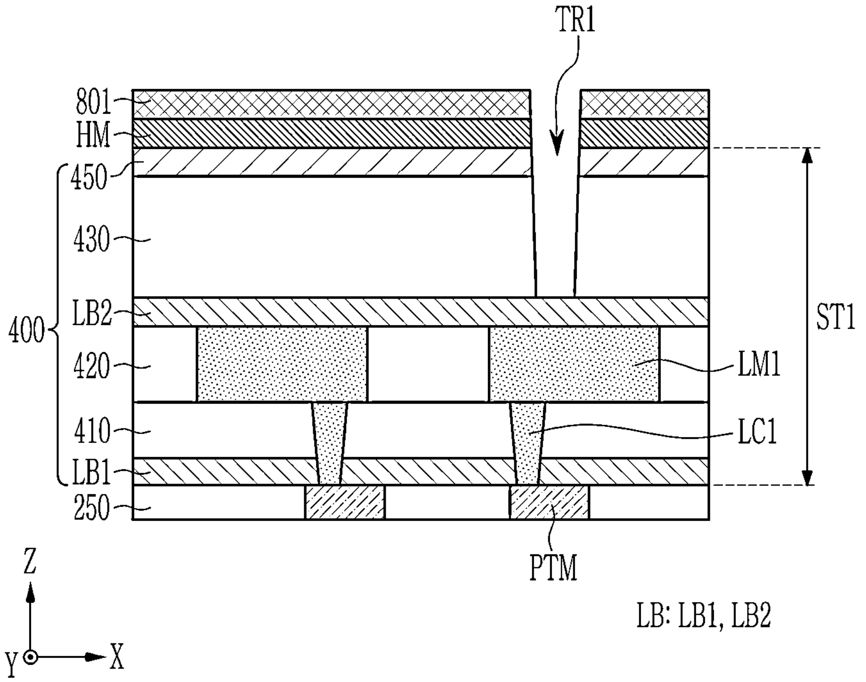

Referring to FIG. 20, by a photo process using the first photoresist PR1 as a mask, the first to third etch stop layers 801, 802, and 803 and at least a portion of the first insulation structure 400 may be removed, thereby forming a first trench TR1.

In more detail, the first to third etch stop layers 801, 802, and 803, the hard mask pattern HM, and the third lower interlayer insulation layer 430 that are exposed by the first opening OP1 may be removed, thereby forming the first trench TR1. The process of forming the first trench TR1 may be performed by using a dry etching process, but example embodiments are not limited thereto. The first trench TR1 may overlap the lower wire LM1 in the third direction (Z direction). As the first trench TR1 is formed, an upper surface of the second lower barrier layer LB2 may be exposed. Subsequently, the first photoresist PR1, the third etch stop layer 803, and the second etch stop layer 802 may be removed to expose a first etch stop layer 801.

Figure 21:
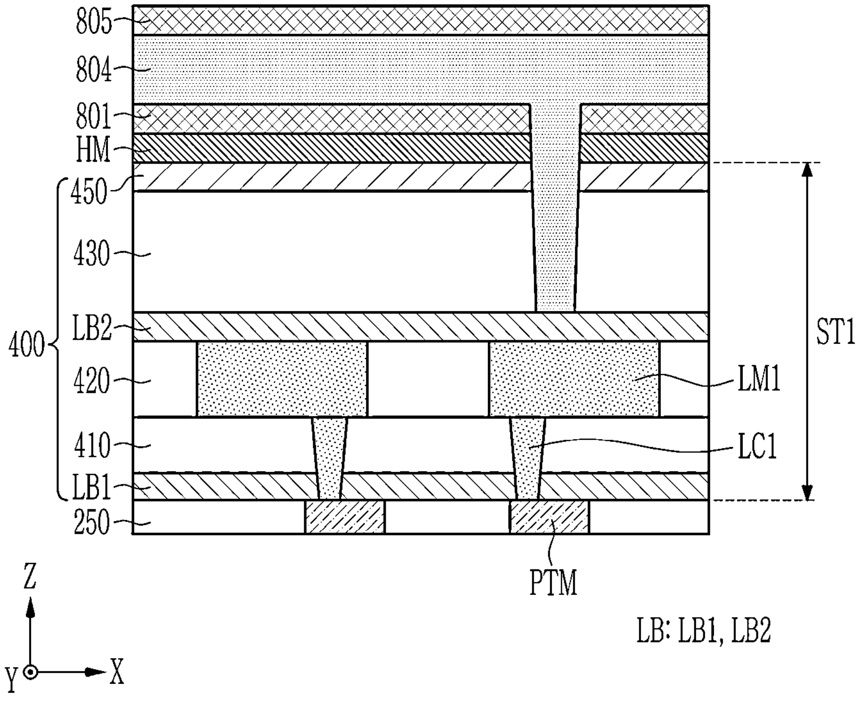

Referring to FIG. 21, fourth and fifth etch stop layers 804 and 805 may be sequentially formed on the first trench TR1 and the first etch stop layer 801. For example, a fourth etch stop layer 804 may include a SOH. A fifth etch stop layer 805 may include silicon nitride oxide. At this time, the fourth etch stop layer 804 may fill the interior of the first trench TR1.

Figure 22:
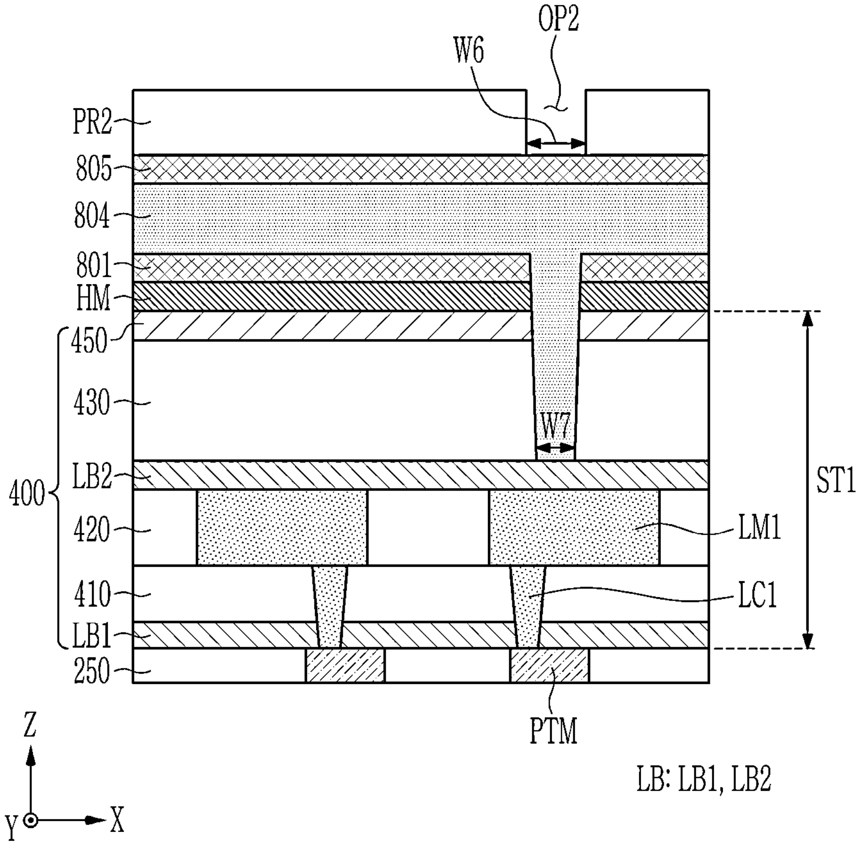

Referring to FIG. 22, a second photoresist PR2 including a second opening OP2 on the fifth etch stop layer 805 may be formed. The second photoresist PR2 may include a photosensitivity material. The second opening OP2 may overlap the first trench TR1 in the third direction (Z direction), but may partially overlap the first trench TR1 according to an embodiment in the third direction (Z direction). For example, as in the embodiment of FIG. 1 and FIG. 2, the second opening OP2 may overlap the first trench TR1 in the third direction (Z direction). Alternatively, as in the embodiment of FIG. 6, when the first portion 610 and the third portion 630 of the first contact pad 600 are misaligned, the second opening OP2 and the first trench TR1 may partially overlap the third direction (Z direction). At this time, a sixth width W6 of the second opening OP2 along the horizontal direction (the first direction (X direction) and/or the second direction (Y direction)) may be greater than or equal to a seventh width W7 of the first trench TR1 along the horizontal direction (the first direction (X direction) and/or the second direction (Y direction)).

Figure 23:
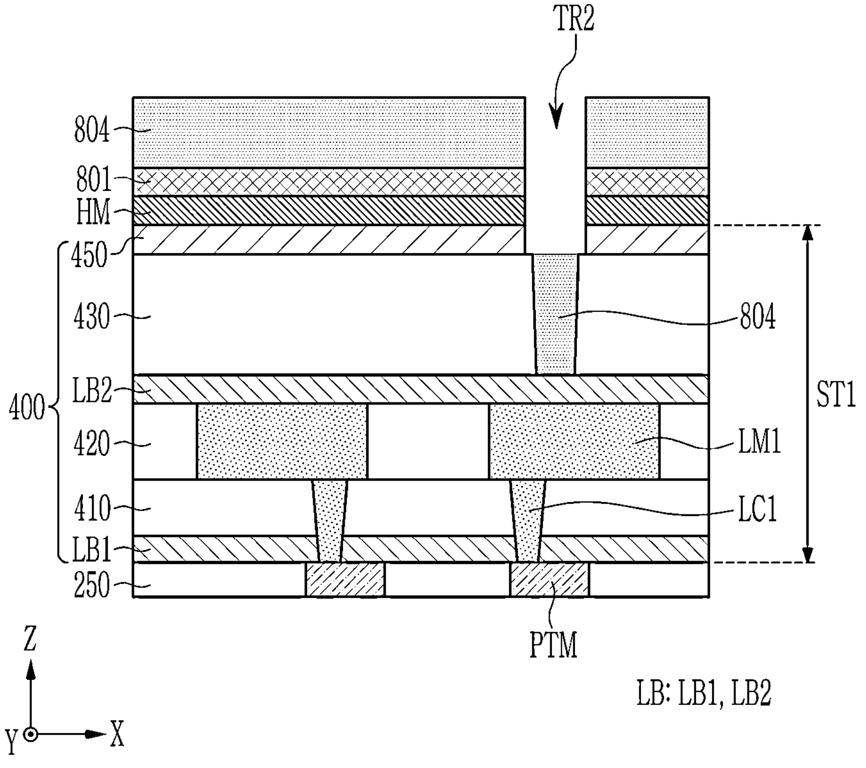

Referring to FIG. 23, by a photo process using the second photoresist PR2 as a mask, the first etch stop layer 801, the fourth and fifth etch stop layers 804 and 805, the hard mask pattern HM, and at least a portion of the first bonding insulation layer 450 may be removed, thereby forming a second trench TR2. Thereafter, the second photoresist PR2 and the fifth etch stop layer 805 may be removed, and by the second trench TR2, a side wall of the first etch stop layer 801, a side wall of the fourth etch stop layer 804, a side wall of the hard mask pattern HM, a side wall of the first bonding insulation layer 450, the upper surface of the third lower interlayer insulation layer 430, and a portion of the fourth etch stop layer 804 located within the first trench TR1 may be exposed.

Figure 24:
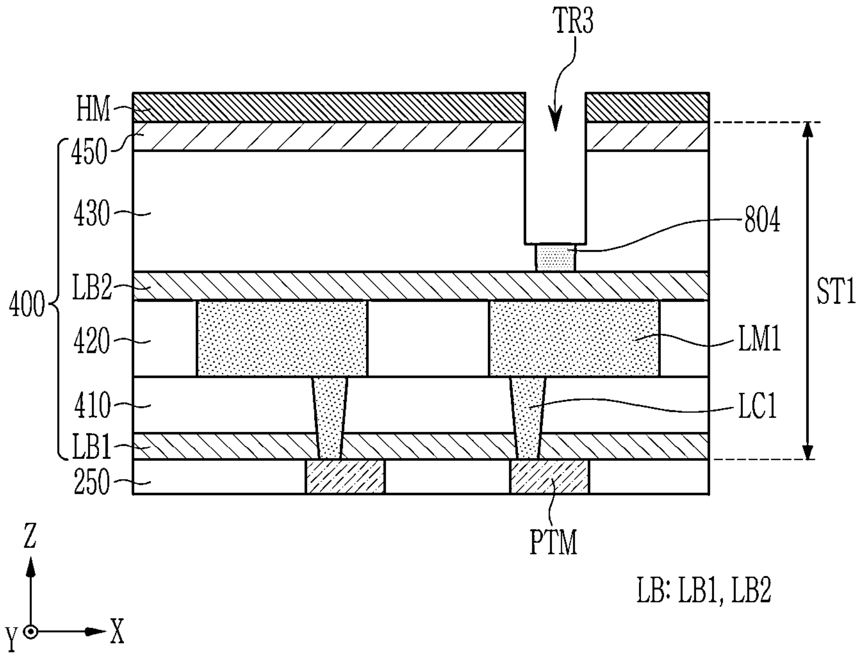

Referring to FIG. 24, at least a portion of the third lower interlayer insulation layer 430 may be removed, thereby forming a third trench TR3.

For example, according to a side wall of the second trench TR2, at least a portion of the third lower interlayer insulation layer 430 may be removed, thereby forming the third trench TR3. Accordingly, side wall of the third lower interlayer insulation layer 430 may be additionally exposed. Subsequently, the first etch stop layer 801 and the portion of the fourth etch stop layer 804 located on the first etch stop layer 801 may be sequentially removed. At this time, the portion of the fourth etch stop layer 804 located within the third trench TR3 may be removed together. Accordingly, the hard mask pattern HM may be exposed.

Figure 25:
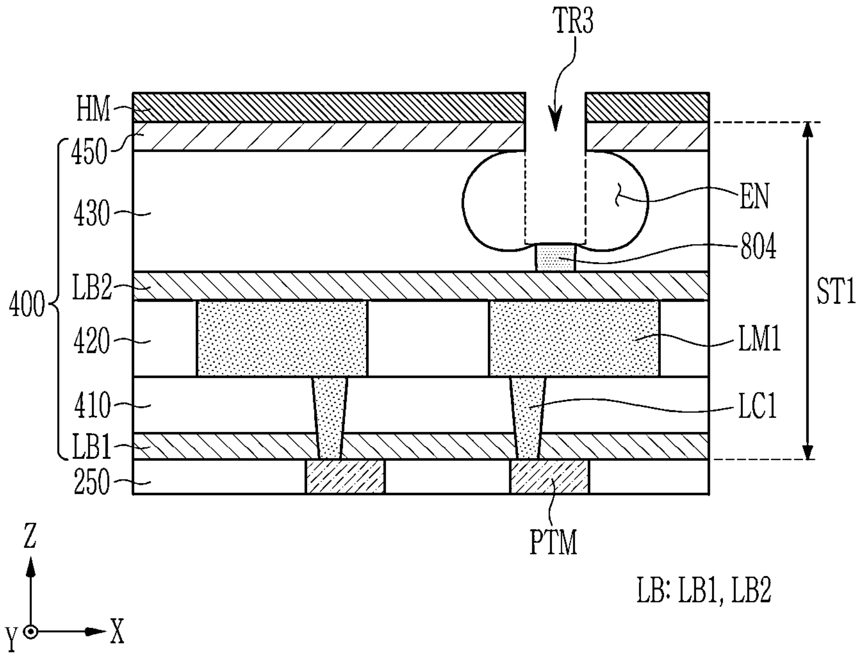

Referring to FIG. 25, at least a portion of the third lower interlayer insulation layer 430 exposed by the third trench TR3 may be removed by an etch back process, thereby forming the extension portion EN.

The process of removing at least a portion of the third lower interlayer insulation layer 430 exposed by the third trench TR3 may be performed by using an etchant having etch selectivity with respect to the first bonding insulation layer 450, but example embodiments are not limited thereto. Accordingly, even if at least a portion of the third lower interlayer insulation layer 430 is removed, the first bonding insulation layer 450 may not be removed. Therefore, maximum width of the first bonding insulation layer 450 along the horizontal direction (the first direction (X direction) and/or the second direction (Y direction)) may be smaller than a maximum width of the extension portion EN along the horizontal direction (the first direction (X direction) and/or the second direction (Y direction)).

Figure 26:
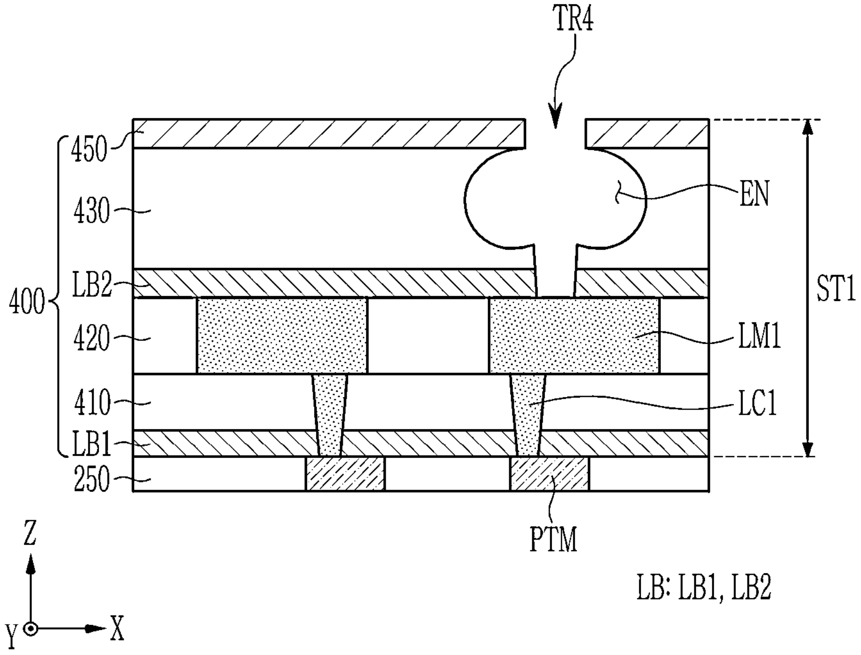

Referring to FIG. 26, at least a portion of the second lower barrier layer LB2 and the fourth etch stop layer 804 exposed by the third trench TR3 may be sequentially removed, thereby forming a fourth trench TR4.

First, the fourth etch stop layer 804 exposed by the third trench TR3 may be removed. Accordingly, the upper surface of the second lower barrier layer LB2 may be exposed. Subsequently, at least a portion of the exposed second lower barrier layer LB2 may be removed, thereby forming the fourth trench TR4. The process of removing at least a portion of the second lower barrier layer LB2 may be performed by using a dry etching or wet etching process, but example embodiments are not limited thereto. Accordingly, a portion of the upper surface of the lower wire LM1 may be exposed.

Subsequently, the hard mask pattern HM may be removed to expose the first bonding insulation layer 450. In an embodiment, it is described that the hard mask pattern HM may be removed after removing the fourth etch stop layer 804, but example embodiments are not limited thereto. For example, the fourth etch stop layer 804 may be removed after removing the hard mask pattern HM.

Figure 27:
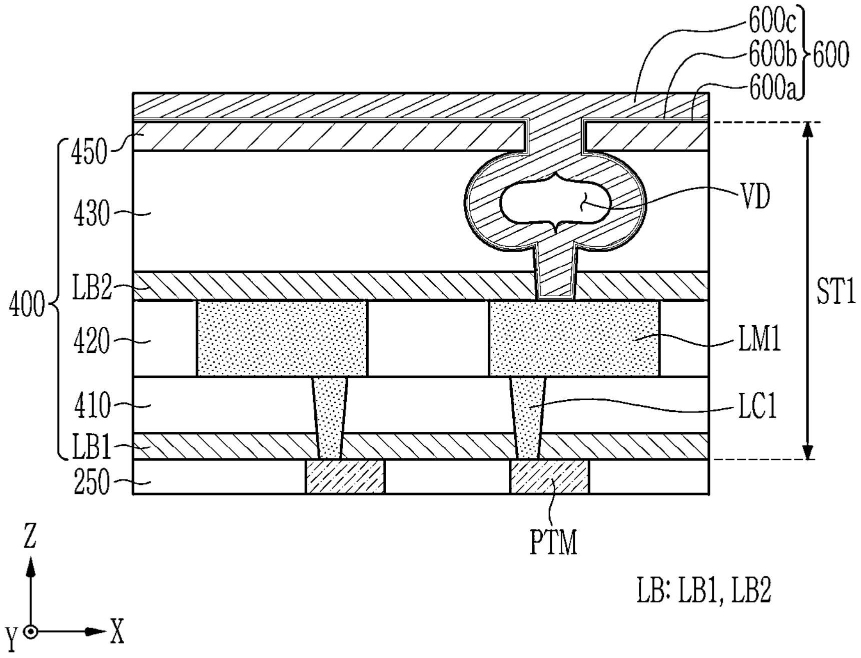

Referring to FIG. 27, the first contact pad 600 may be formed within the fourth trench TR4.

First, inner sidewall of the first conductive layer 600*a* and the second conductive layer 600*b* may be formed conformally and sequentially on the fourth trench TR4 and the upper surface of the first bonding insulation layer 450. For example, the first conductive layer 600*a* may include tantalum, and the second conductive layer 600*b* may include tantalum nitride, but example embodiments are not limited thereto.

Subsequently, the third conductive layer 600*c* may be formed on the upper surface of the second conductive layer 600*b* and an inner surface of the second conductive layer 600*b* located within the fourth trench TR4. The third conductive layer 600*c* may fill at least a portion the fourth trench TR4. For example, the third conductive layer 600*c* may fill at least a portion of the fourth trench TR4 along the inner surface of the second conductive layer 600*b* such that the void VD may be provided in an interior (e.g., a central portion) of the fourth trench TR4. The third conductive layer 600*c* may include a conductive material. For example, the third conductive layer 600*c* may include copper, but example embodiments are not limited thereto. Here, the fourth trench TR4 may correspond to a contact recess RCS of FIG. 2.

Figure 28:
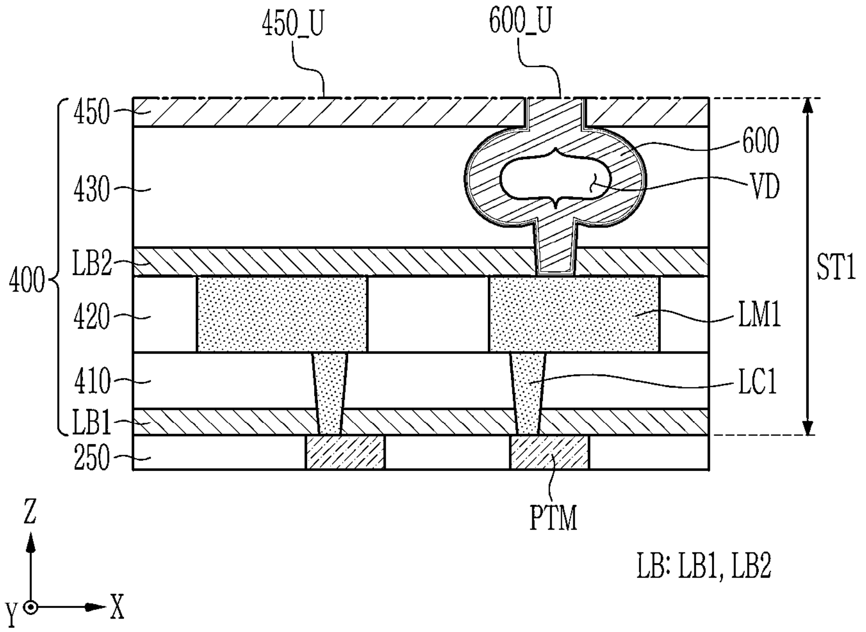

Referring to FIG. 28, at least a portion of first to third conductive layers 600*a* to 600*c* may be removed by using the chemical mechanical polishing process, thereby forming the first contact pad 600. For example, a planarization process (e.g., CMP, chemical mechanical process) may be performed by using the chemical mechanical polishing process, such that upper surface of first to third conductive layers 600*a* to 600*c* and the upper surface of the first bonding insulation layer 450 may be located on the same plane, thereby forming the first contact pad 600. At this time, an upper surface 600_U of the first contact pad 600 may be located at the same or substantially the same level as an upper surface 450_U of first bonding insulation layer.

Figure 29:
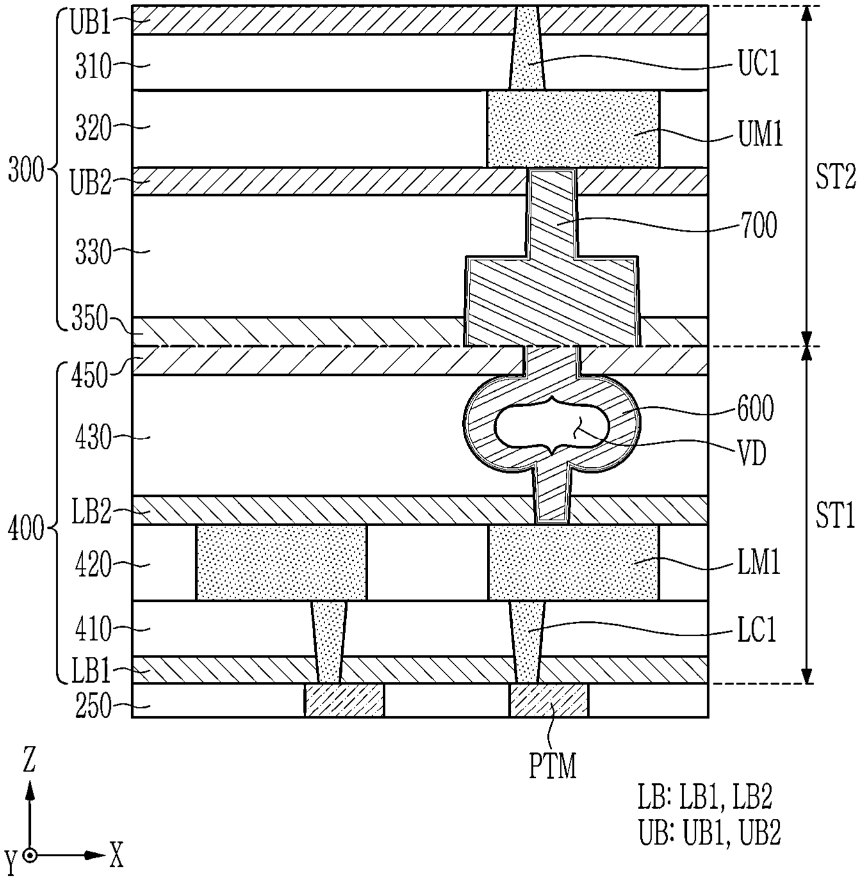

Referring to FIG. 29, the second contact structure ST2 may be bonded on the first contact structure ST1.

First, the second contact structure ST2 may be located on the first contact structure ST1 such that the second bonding insulation layer 350 and the second contact pad 700 may contact the first bonding insulation layer 450 and the first contact pad 600, respectively. At this time, an interface between the first bonding insulation layer 450 and the second bonding insulation layer 350 and an interface of the first contact pad 600 and the second contact pad 700 may configure the bonding surface between the first contact structure ST1 and the second contact structure ST2. In an embodiment, the process of forming the second bonding insulation layer 350 of the second contact structure ST2, the plurality of upper interlayer insulation layers 310, 320, and 330 located on the second bonding insulation layer 350, and the plurality of upper barrier layers UB1 and UB2 is substantially the same as the process of forming the first contact structure ST1, and is not included herein.

Subsequently, the second bonding insulation layer 350 may be bonded to the first bonding insulation layer 450 by hybrid bonding. Accordingly, the bottom surface of the second bonding insulation layer 350 may configure a portion of the bonding surface between the first contact structure ST1 and the second contact structure ST2.

Subsequently, by using the annealing process, the first contact pad 600 and the second contact pad 700 may be bonded, thereby bonding the first contact structure ST1 and the second contact structure ST2.

For example, the second contact pad 700 may be bonded to the first contact pad 600 in a directly contacting state, and may form metal bonding. Accordingly, the first contact pad 600 and the second contact pad 700 may be bonded, and may provide an electrical connection path between the first contact structure ST1 and the second contact structure ST2. For example, an external element connected to the second contact structure ST2 may be electrically connected to the circuit element connected to the circuit element wire PTM by the first contact pad 600 and the second contact pad 700.

At this time, when the first contact pad 600 and the second contact pad 700 are bonded through the annealing process, the first contact pad 600 and/or the second contact pad 700 may be thermally expanded. The second portion 620 of a semiconductor device according to an embodiment may be provided with the void VD in a central portion. Therefore, when the annealing process is performed, the first contact pad 600 of a semiconductor device according to an embodiment may thermally expand into the void VD. That is, the void VD may provide a space allowing expansion of the first contact pad 600. Accordingly, when the annealing process is performed, the first contact structure ST1 and the second contact structure ST2 may be limited and/or prevented from being separated.

Since the first contact pad 600 of a semiconductor device according to an embodiment may thermally expand into the void VD, the first contact pad 600 may not protrude from the upper surface of the first contact structure ST1 even if the annealing process is performed. Therefore, the chemical mechanical polishing process of removing at least a portion of the first contact pad 600 and the second contact pad 700 may be streamlined or omitted. Accordingly, non-bonding of the first contact pad 600 and the second contact pad 700 due to excessive chemical mechanical polishing process may be limited and/or prevented, and the reliability of a semiconductor device may be improved.

Hereinafter, referring to FIG. 30 to FIG. 35, a manufacturing method of a semiconductor device according to some embodiments will be described in detail.

FIG. 30 to FIG. 35 are drawings for intermediate operations for explaining a manufacturing method of a semiconductor memory device according to some embodiments. For convenience of description, descriptions of overlapping contents with those described with reference to FIG. 18 to FIG. 29 may be omitted.

Figure 30:
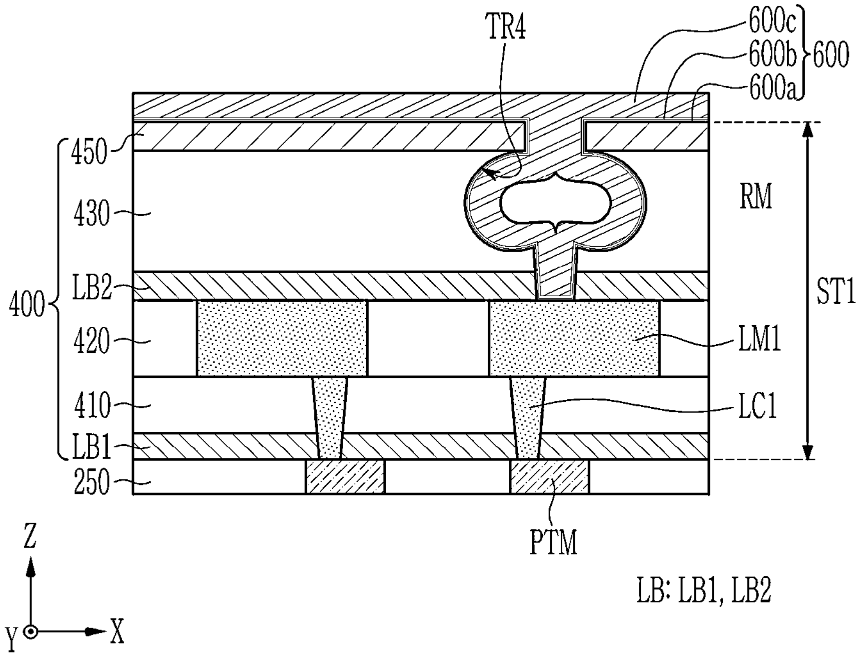
FIG. 30 to FIG. 35 are cross-sectional views showing intermediate operations of a manufacturing method of a semiconductor device according to some embodiments.

Referring to FIG. 30, the first contact pad 600 may be formed within the fourth trench TR4.

First, the first conductive layer 600*a* and the second conductive layer 600*b* may be formed conformally and sequentially on the inner sidewall of the fourth trench TR4 and the upper surface of the first bonding insulation layer 450. Subsequently, the third conductive layer 600*c* may be formed on the upper surface of the second conductive layer 600*b* and the inner surface of the second conductive layer 600*b* located within the fourth trench TR4.

In some embodiments, the third conductive layer 600*c* may fill at least a portion the fourth trench TR4. For example, the third conductive layer 600*c* may fill at least a portion of the fourth trench TR4 along the inner surface of the second conductive layer 600*b* such that the void VD may be provided in an interior (e.g., a central portion) of the fourth trench TR4. The third conductive layer 600*c* may include a conductive material. For example, the third conductive layer 600*c* may include copper, but example embodiments are not limited thereto.

At this time, during the process of forming the third conductive layer 600*c*, a residue RM may be formed within the void VD. For example, the residue RM may include sulfuric acid, but example embodiments are not limited thereto. The residue RM may completely fill the void VD be, but example embodiments are not limited thereto, and at least a portion of the void VD may be filled.

Figure 31:
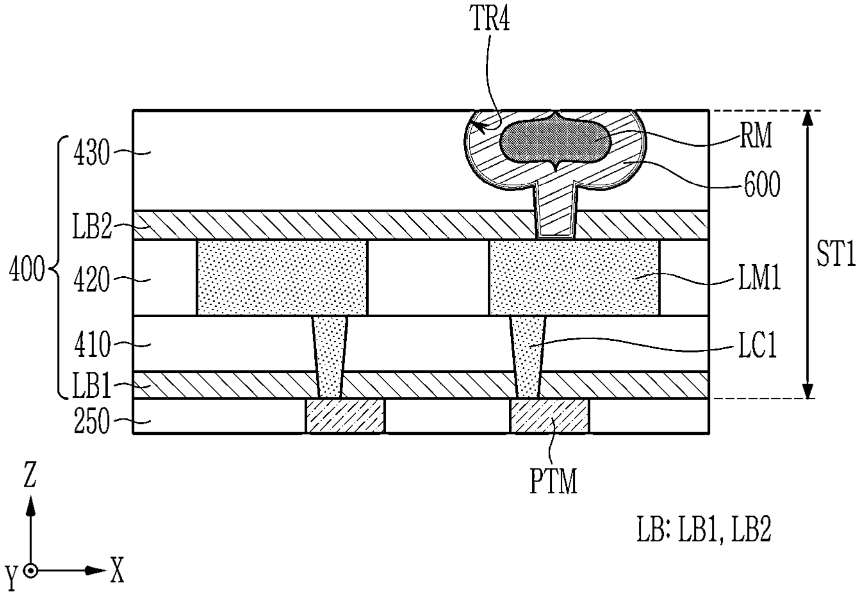

Referring to FIG. 31, at least a portion of first to third conductive layers 600*a* to 600*c*, the hard mask pattern HM, the first bonding insulation layer 450, and at least a portion of the third lower interlayer insulation layer 430 may be removed such that the residue RM may be exposed. The process of removing the at least a portion of first to third conductive layers 600*a* to 600*c*, the hard mask pattern HM, the first bonding insulation layer 450, and the at least a portion of the third lower interlayer insulation layer 430 may be performed by using the chemical mechanical polishing process, but example embodiments are not limited thereto.

Figure 32:
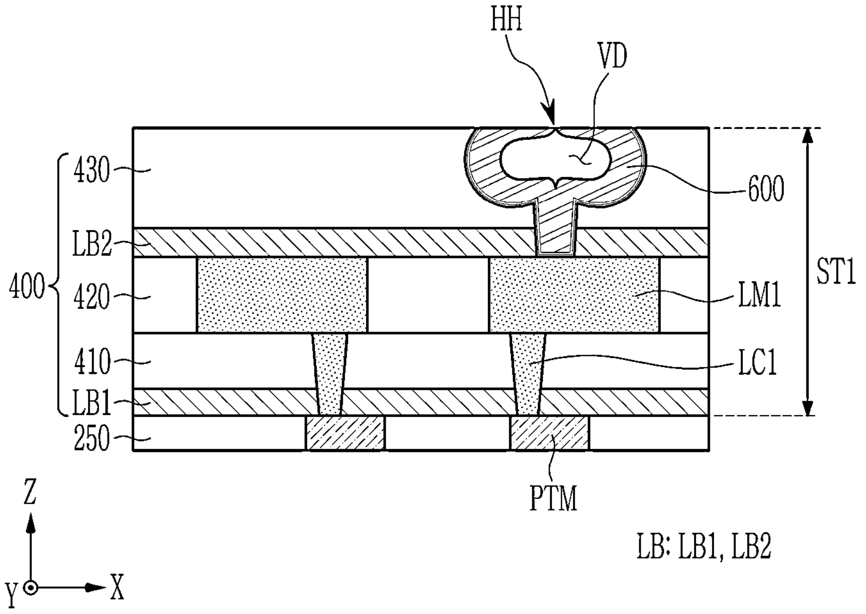

Referring to FIG. 32, the exposed residue RM may be removed to expose the void VD. Accordingly, inner the surface of the third conductive layer 600*c* may be exposed. Meanwhile, a hole HH of the void VD exposed at a level substantially the same as the upper surface of the third lower interlayer insulation layer 430 may have a sufficiently small size.

Figure 33:
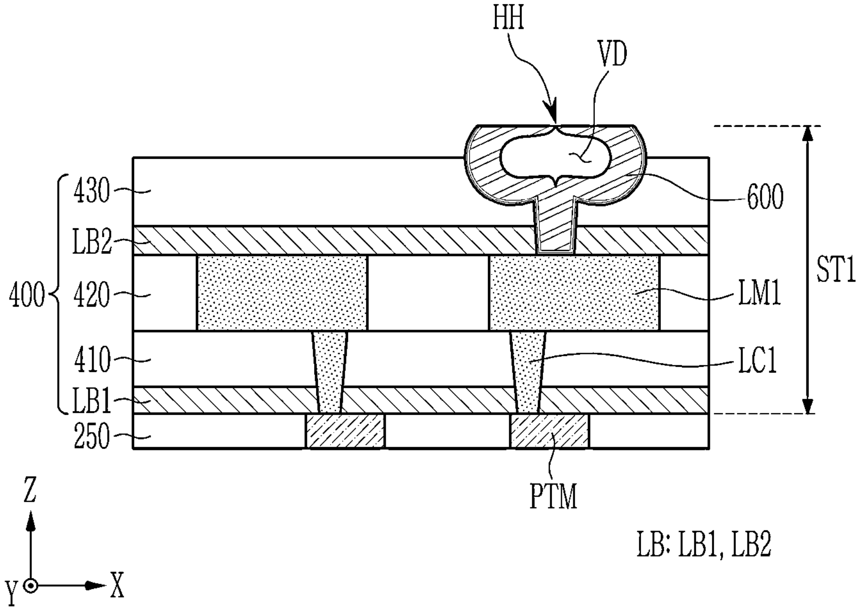

Referring to FIG. 33, the at least a portion of the third lower interlayer insulation layer 430 may be removed. For example, the process of removing the at least a portion of the third lower interlayer insulation layer 430 may be performed by using a material having etch selectivity with respect to the first contact pad 600. Accordingly, the first contact pad 600 may not be etched. At this time, an upper surface of the first contact pad 600 may be located at a higher level than the upper surface of the third lower interlayer insulation layer 430.

Figure 34:
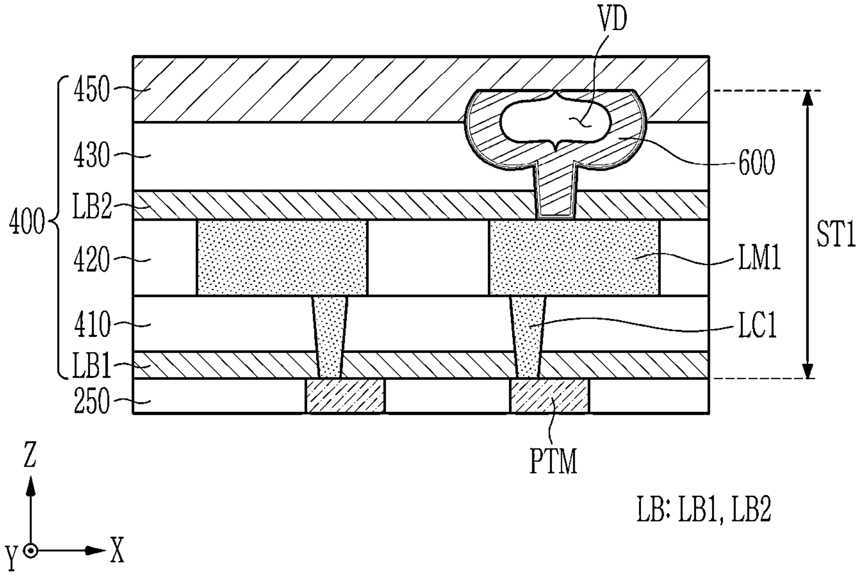
Figure 35:
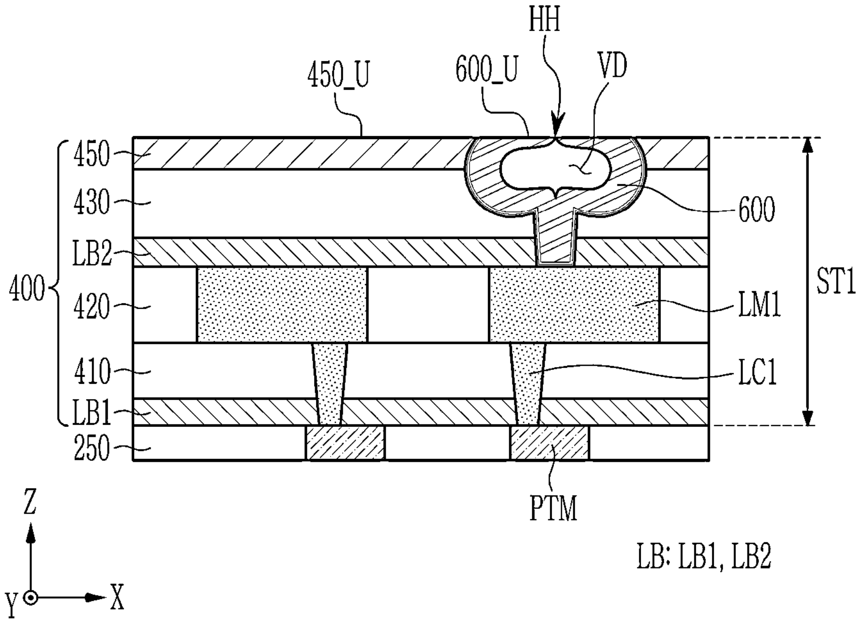

Referring to FIG. 34 and FIG. 35, the first bonding insulation layer 450 may be formed on the upper surface of the third lower interlayer insulation layer 430.

First, the first bonding insulation layer 450 may be formed on the upper surface of the third lower interlayer insulation layer 430 and the upper surface of the first contact pad 600. The first bonding insulation layer 450 may be formed in a sufficient thickness to cover the upper surface of the third lower interlayer insulation layer 430 and the upper surface of the first contact pad 600. At this time, since the hole HH of the exposed void VD has a sufficiently small size, the material layer configuring the first bonding insulation layer 450 may not be formed within the void VD. However, example embodiments are not limited thereto, and a material layer configuring the first bonding insulation layer 450 within the void VD through the hole HH of the exposed void VD may be formed together.

Subsequently, by performing the chemical mechanical polishing process, at least a portion of the first bonding insulation layer 450 may be removed. For example, by performing the chemical mechanical polishing process, at least a portion of the first bonding insulation layer 450 may be removed such that the first contact pad 600 may be exposed. Accordingly, the hole HH of the void VD may be exposed together.

Subsequently, a semiconductor device according to the embodiment of FIG. 17 may be formed by forming the second contact structure ST2 on the first contact structure ST1.

Hereinafter, a semiconductor device according to an embodiment will be described in detail with reference to FIG. 36 to FIG. 39.

Figure 36:
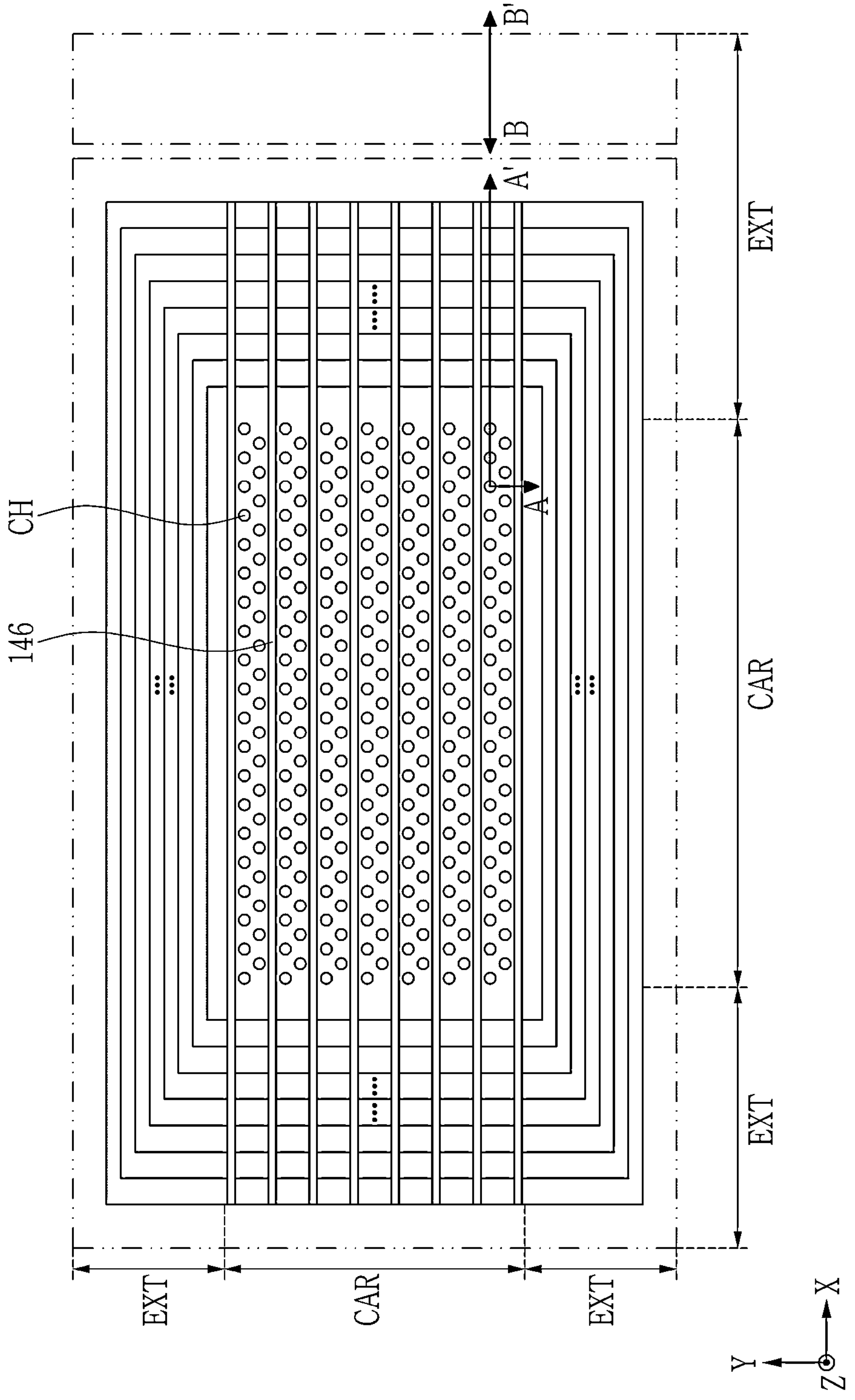
FIG. 36 is a top plan view schematically showing a semiconductor device according to an embodiment.
Figure 37:
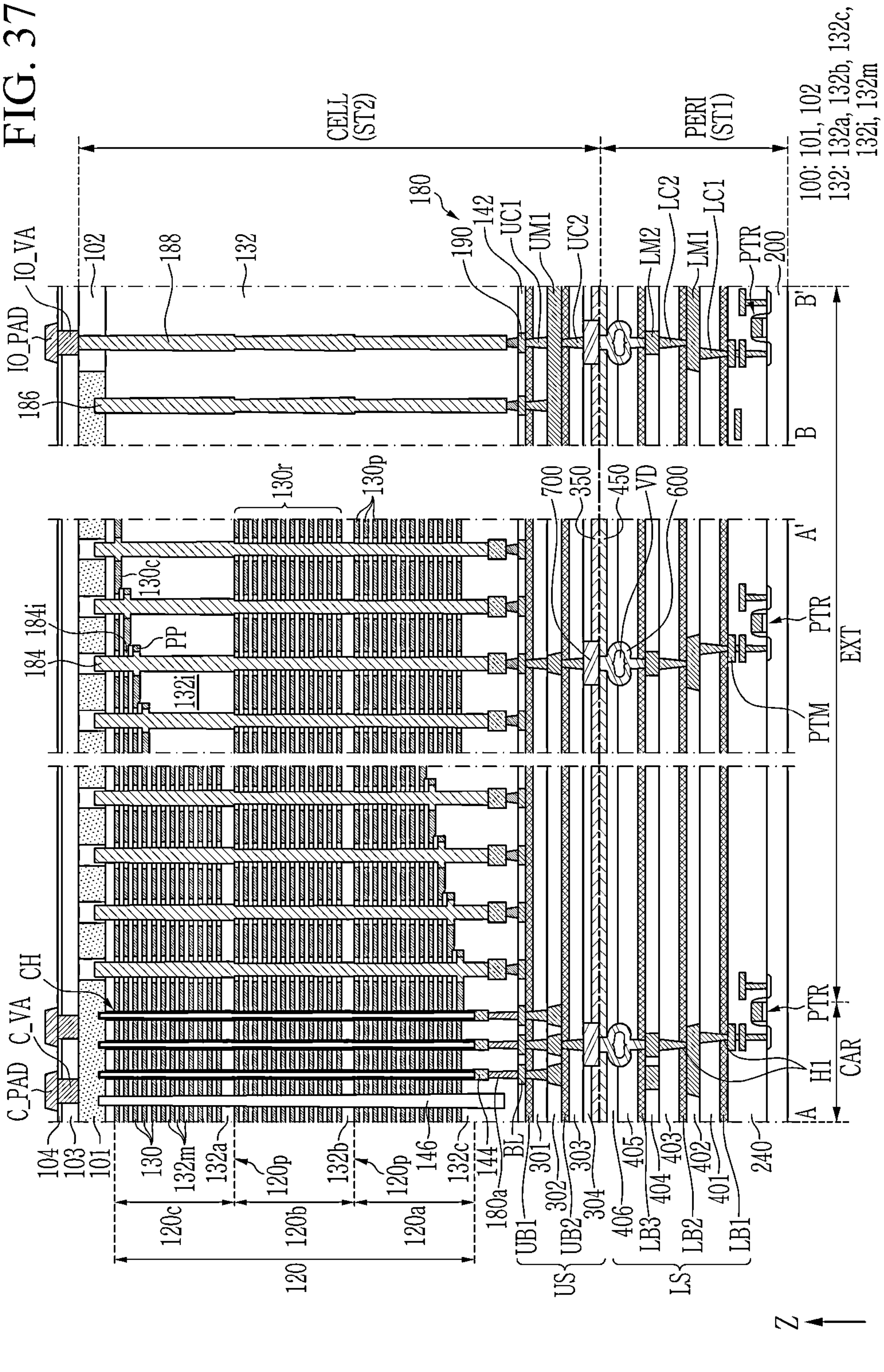
FIG. 37 is a cross-sectional view schematically showing a semiconductor device according to an embodiment.
Figure 38:
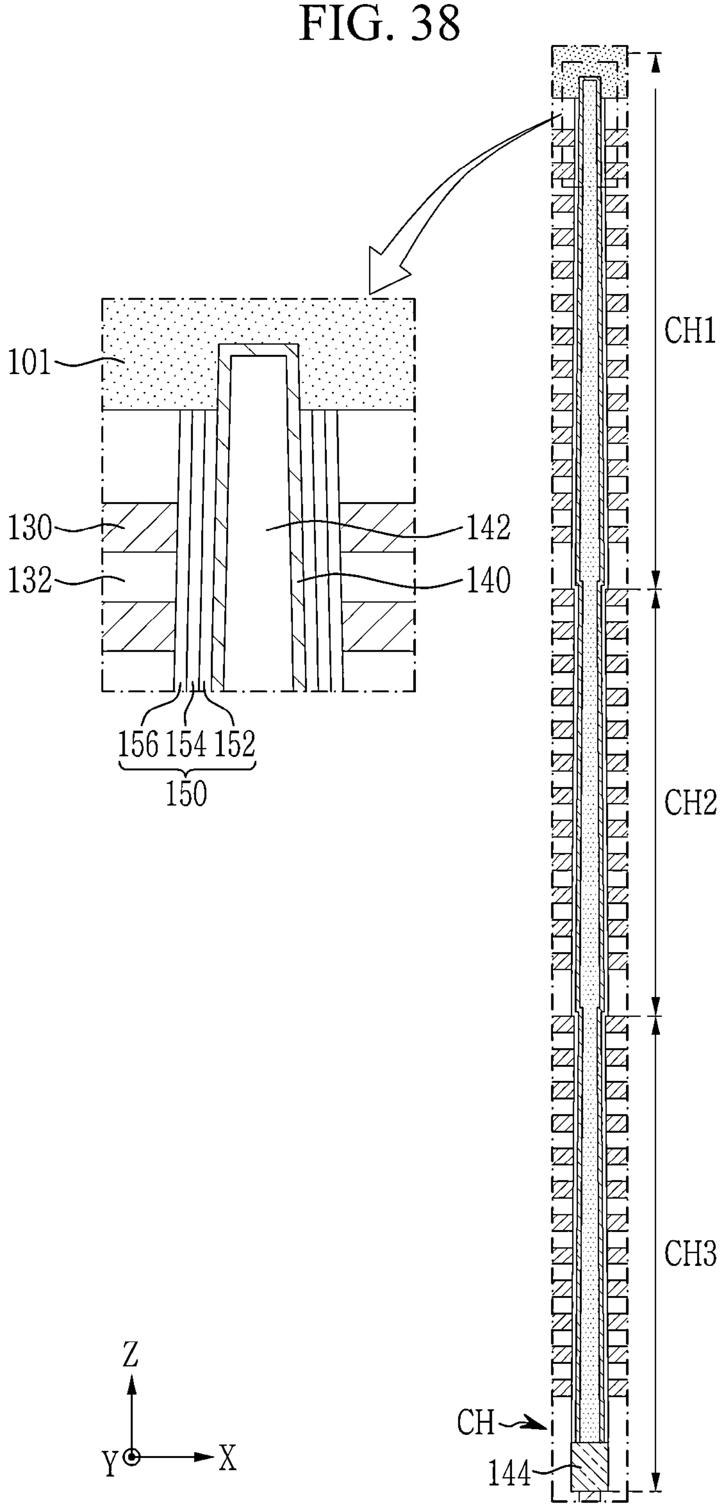
FIG. 38 is a cross-sectional view showing a channel structure of a semiconductor device according to an embodiment.
Figure 39:
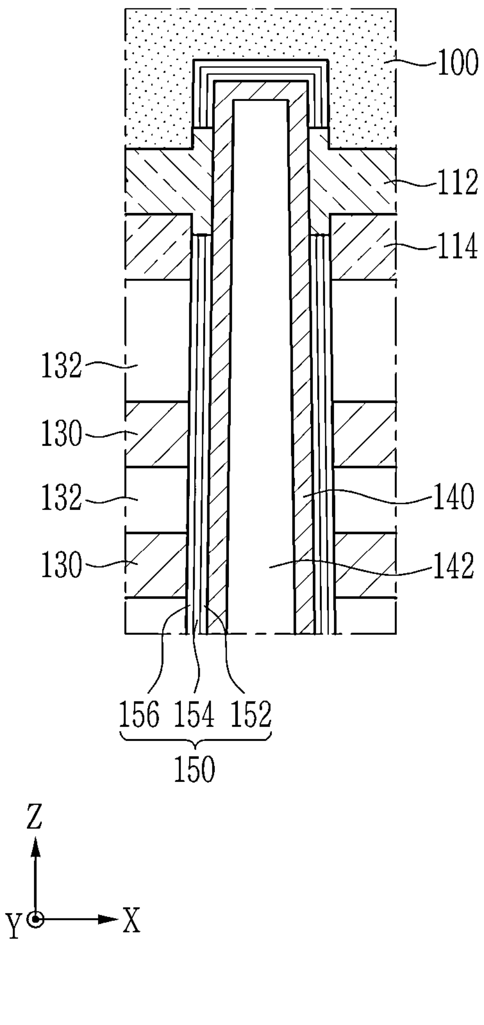
FIG. 39 is a cross-sectional view showing a channel structure of a semiconductor device according to some embodiments.

FIG. 36 is a top plan view schematically showing a semiconductor device according to an embodiment. FIG. 37 is a cross-sectional view schematically showing a semiconductor device according to an embodiment. FIG. 38 is a cross-sectional view showing a channel structure of a semiconductor device according to an embodiment. FIG. 39 is a cross-sectional view showing a channel structure of a semiconductor device according to some embodiments.

In the embodiment of FIG. 36 to FIG. 39, the bonding structure of the first contact structure ST1 and the second contact structure ST2 of FIG. 1 to FIG. 17 may be applied.

First, referring to FIG. 36 and FIG. 37, a semiconductor device according to an embodiment may include the cell structure CELL provided with a memory cell structure and the peri structure PERI provided with the peripheral circuit structure for control the operation of the memory cell structure. At this time, the cell structure CELL and the peri structure PERI may be the bonded semiconductor device of a chip-to-chip (C2C) structure bonded by the wafer bonding method (e.g., hybrid bonding). For example, the peri structure PERI and the cell structure CELL may be portions corresponding to a first structure 1100F and a second structure 1100S of the semiconductor device 1100 included in the electronic system 1000 shown in FIG. 40, respectively. Alternatively, the peri structure PERI and the cell structure CELL may be portions including the first structure 4100 and the second structure 4200 of the semiconductor chip 2200 shown in FIG. 42, respectively.

Here, the peri structure PERI may include the peripheral circuit structure formed on a first substrate 200, and the cell structure CELL may be provided with a gate stacking structure 120 and a channel structure CH formed in a cell region CR as the memory cell structure. An insulating layer 240 may be between the lower structure LS and the first substrate 200. The insulating layer 240 may cover circuit elements PTR.

In an embodiment, the peri structure PERI may correspond to the first contact structure ST1 of embodiments of FIG. 1 to FIG. 17, and the cell structure CELL may correspond to the second contact structure ST2 of embodiments of FIG. 1 to FIG. 17. That is, the chip-to-chip (C2C) structure in which the peri structure PERI and the cell structure CELL are bonded by the wafer bonding method (e.g., hybrid bonding) may be substantially the same as the bonding structure between the first contact structure ST1 and the second contact structure ST2.

In an embodiment, the cell structure CELL may be located on the peri structure PERI. According to this, since an area corresponding to the peri structure PERI may not be secured separately from the cell structure CELL, the area of a semiconductor device may be reduced. However, example embodiments are not limited thereto, and numerous variations are available.

A semiconductor device according to an embodiment may include a cell array region CAR and an extension region EXT.

A memory cell array including a plurality of memory cells may be formed on the cell array region CAR. For example, the channel structure CH, a plurality of gate electrodes 130, a bit line BL, and the like, which is described later, may be located in the cell array region CAR. In the description below, a surface of a second substrate 100 on which the memory cell array is disposed may be referred to as the first surface or front side. To the contrary, the surface of the second substrate 100 opposite to a front surface of the second substrate 100 may be referred to as the second surface or back side (back side) of the second substrate 100. That is, the first surface of the second substrate 100 may be a surface facing the peri structure PERI, and the second surface of the second substrate 100 may be a surface facing away from the first surface of the second substrate 100.

The extension region EXT may be defined around the cell array region CAR. For example, the extension region EXT may surround the cell array region CAR in a plan view. In the extension region EXT, a structure or wire for connect the gate stacking structure 120 and/or the channel structure CH located in the cell array region CAR to the peri structure PERI or external circuit may be located. In addition, in the extension region EXT, a source contact 186, an input/output contact 188 and the like, which is described later, may be located.

The cell structure CELL according to an embodiment may include the second substrate 100, the gate stacking structure 120, the channel structure CH, a channel pad 144, a separation structure 146, a cell wiring portion 180, and the second insulation structure 300.

The second substrate 100 may include a common source plate 101 and an insulation pattern 102. The common source plate 101 may be provided in the cell region CR and a portion of the extension region EXT. The common source plate 101 may be connected to the channel structure CH and the source contact 186. For example, the common source plate 101 may be connected to a channel layer 140 of the channel structure C in the cell array region CAR. The common source plate 101 may be connected to the source contact 186 in the extension region EXT. The common source plate 101 may be provided as a common source line (e.g., CSL of FIG. 40) of a non-volatile memory device. The common source plate 101 may include, for example, polycrystalline silicon or metal doped with impurities, but example embodiments are not limited thereto.

In an embodiment, the common source plate 101 may not overlap a gate contact 184 and the input/output contact 188 in the third direction (Z direction).

The insulation pattern 102 may be provided in a portion of the extension region EXT. The insulation pattern 102 may not be provided in the cell array region CAR. The insulation pattern 102 may be located around the common source plate 101. For example, the insulation pattern 102 may be located between the common source plate 101 and the common source plate 101. The insulation pattern 102 may surround a portion of the gate contact 184 and a portion of the input/output contact 188. The insulation pattern 102 may overlap the gate contact 184 and the input/output contact 188 in the third direction (Z direction).

The insulation pattern 102 may include, for example, at least one of silicon oxide, silicon nitride, silicon nitride oxide and silicon carbide, but example embodiments are not limited thereto. Specifically, the insulation pattern 102 may include for example, flowable oxide (Fox), TOSZ (Tonen Silazen), USG (undoped silica glass), BSG (borosilica glass), PSG (PhosphoSilica glass), BPSG (BoroPhosphosilica glass), PE-TEOS (plasma enhanced tetra-ethyl orthosilicate), FSG (Fluoride silicate glass), high density plasma (HDP), PEOX (plasma enhanced oxide), FCVD (Flowable CVD) or a combination thereof.

FIG. 37 illustrates that a lower surface of the insulation pattern 102 is located as a common surface with a lower surface of the common source plate 101, but this is a mere example. As another example, the lower surface of the insulation pattern 102 may be lower than the lower surface of the common source plate 101.

The second substrate 100 may include a front side and a back side that face each other. A front side of the second substrate 100 may face the peri structure PERI. Here, a front side of the common source plate 101 and a front side of the insulation pattern 102 may be the front side of the second substrate 100. A back side of the common source plate 101 and a back side of the insulation pattern 102 may be a back side of the second substrate 100.

The gate stacking structure 120 may be located on the front side of the second substrate 100. The gate stacking structure 120 may include a plurality of cell insulation layers 132 and the plurality of gate electrodes 130 alternately stacked with each other.

In the gate stacking structure 120, a cell insulation layer 132 may include, an interlayer insulation layer 132*m* located between neighboring two gate electrodes 130 and a pad insulating portion 132*i* located below the gate stacking structure 120. In addition, the cell insulation layer 132 may include a plurality of lower cell insulation layers 132*a*, 132*b*, and 132*c* that cover a bottom surface of each of a plurality of gate stacking structure 120*a*, 120*b*, and 120*c*. For simplicity of illustration, FIG. 37 shows that the cell insulation layer 132 is provided as one without a boundary in the extension region EXT. However, the cell insulation layer 132 located in the extension region EXT may have various structures including one or a plurality of insulation layers, and example embodiments are not limited thereto.

In an embodiment, a gate electrode 130 and the interlayer insulation layer 132*m* of the gate stacking structure 120 may extend in the first direction (X direction) and/or the second direction (Y direction). For example, in a direction away from the cell array region CAR, a length of the plurality of gate electrodes 130 may include a step shape that sequentially lengthened toward the second substrate 100. At this time, the plurality of gate electrodes 130 may include a portion having a step shape in one direction or plurality of directions. Accordingly, some gate electrodes 130 may extend in different lengths to form steps, and each bottom surface of the gate electrodes 130 may include a pad portion PP in contact with the pad insulating portion 132*i*. The pad portion PP may mean a region where the gate contact 184 and the gate electrode 130 contact each other.

A height of the gate electrode 130 along the third direction (Z direction) contacting the gate contact 184 in the pad portion PP may be higher than another height of the gate electrode 130 along the third direction (Z direction). Here, the third direction (Z direction) may be a perpendicular direction to the front side of the second substrate 100. Accordingly, a contact area where the gate contact 184 and the gate electrode 130 contact each other may be increased, but example embodiments are not limited thereto.

The gate electrode 130 may include a various conductive material. For example, the gate electrode 130 may include a metallic material such as tungsten (W), copper (Cu), aluminum (Al), or the like, polycrystalline silicon, metal nitride (e.g., titanium nitride (TiN), tantalum nitride (TaN), or the like), or a combination thereof. In an embodiment, an insulating material may be further located outside the gate electrode 130. The cell insulation layer 132 may include various insulating materials. For example, the cell insulation layer 132 may include silicon oxide, silicon nitride, silicon nitride oxide, a low dielectric constant material having smaller dielectric constant than silicon oxide, or a combination thereof.

The channel structure CH may be located within the gate stacking structure 120 of the cell array region CAR. The channel structure CH may penetrate the gate stacking structure 120 and extend in a cross direction (e.g., the third direction (Z direction)) crossing (e.g., vertical) the second substrate 100. The channel structure CH may have a pillar shape. For example, the channel structure CH may have an inclined side surface whose width narrows as it is closer to the second substrate 100 depending on the aspect ratio, when viewed in cross-section. However, example embodiments are not limited thereto, and structure, shape, or the like of the channel structure CH may be modified in various ways.

The channel structure CH may form one memory cell string, respectively, and in a plan view, a plurality of channel structures CH may be located to be apart from each other while forming rows and columns. For example, in a plan view, the plurality of channel structures CH may be located in various forms of a lattice form, a zigzag form, or the like. However, example embodiments are not limited thereto, and arrangement, shape, or the like of the channel structure CH may be modified in various ways.

Referring further to FIG. 38, the channel structure CH may include a gate dielectric layer 150 located on the channel layer 140 between the channel layer 140 and the gate electrode 130 and the channel layer 140. The channel structure CH may further include a core insulation layer 142 located in an interior (e.g., central region) of the channel layer 140, but as a different example, the core insulation layer 142 may not be provided.

The gate dielectric layer 150 may include a tunneling layer 152, a charge storage layer 154 and a blocking layer 156, which are sequentially formed on the channel layer 140. In an embodiment, the channel structure CH may further include the channel pad 144 connected to the channel layer 140.

The channel layer 140 may include a semiconductor material, for example, polycrystalline silicon. The core insulation layer 142 may include a various insulating material. For example, the core insulation layer 142 may include silicon oxide, silicon nitride, silicon nitride oxide, or a combination thereof. The tunneling layer 152 may include an insulating material enabling tunneling of charges. For example, the tunneling layer 152 may include silicon oxide, silicon nitride oxide, or the like. The charge storage layer 154 may be used as a data storage region, and may include polycrystalline silicon, silicon nitride, or the like. The blocking layer 156 may include an insulating material capable of limiting and/or preventing charges from undesirably flowing into the gate electrode 130. For example, the blocking layer 156 may include silicon oxide, silicon nitride, silicon nitride oxide, a high dielectric constant material having a higher dielectric constant than silicon oxide, or a combination thereof.

However, material, stacking structure, or the like of the channel layer 140, the core insulation layer 142 and the gate dielectric layer 150 may be modified in various ways, and example embodiments are not limited thereto.

In an embodiment, as shown in FIG. 38, the channel structure CH may include a portion protruding toward the back side of the second substrate 100 than the first surface of the gate stacking structure 120. That is, a first end of the channel structure CH may be located between the front side and the back side of the common source plate 101. At this time, a portion of the gate dielectric layer 150 located at the first end of the channel structure CH may be removed. An upper surface of the gate dielectric layer 150 may contact a bottom surface of the common source plate 101. An upper surface of the channel layer 140 and/or the core insulation layer 142 may be located between the front side of the common source plate 101 and back side. Accordingly, the channel layer 140 may be connected to the common source plate 101 on the cell array region CAR. The upper surface of the channel layer 140 may be located between the front side and the back side of the second substrate 100. That is, a portion of the channel layer 140 may be provided within the common source plate 101 be. A portion of the upper surface and side surface of the channel layer 140 may contact the common source plate 101.

However, example embodiments are not limited thereto, and as shown in and FIG. 39, the channel layer 140 may be connected to horizontal conductive layers 112 and 114. Specifically, in an embodiment, the cell array region CAR may further include the horizontal conductive layers 112 and 114 located between the second substrate 100 and the gate stacking structure 120.

The horizontal conductive layers 112 and 114 may be connected to the channel structure CH and function as the common source line. For example, the horizontal conductive layers 112 and 114 may be (e.g., directly) connected to the channel layer 140 of the channel structure CH. At this time, the horizontal conductive layers 112 and 114 may be electrically connected to the source contact 186.

First and second horizontal conductive layers 112 and 114 may include a semiconductor material (e.g., polycrystalline silicon). For example, a first horizontal conductive layer 112 may be a polycrystalline silicon layer doped with impurities, and second horizontal conductive layer 114 may be a polycrystalline silicon layer doped with impurities or a layer including impurities diffused from the first horizontal conductive layer 112. However, example embodiments are not limited thereto, and the second horizontal conductive layer 114 may be formed of an insulating material. Alternatively, the second horizontal conductive layer 114 may not be provided separately.

The channel pad 144 may be connected on a bottom surface of the channel structure CH. For example, the channel pad 144 may be located on a bottom surface of the core insulation layer 142, and may be located to be connected to the channel layer 140. The channel pad 144 may include, conductive material, polycrystalline silicon doped with for example, impurities, but example embodiments are not limited thereto.

In an embodiment, the gate stacking structure 120 may include the plurality of gate stacking structure 120*a*, 120*b*, and 120*c* sequentially stacked on a bottom surface of the second substrate 100, and the channel structure CH may include the plurality of channel structures CH1, CH2, and CH3 penetrating the plurality of gate stacking structure 120*a*, 120*b*, and 120*c*. Then, since the number of stacked gate electrodes 130 may be increased, the number of memory cells may be increased in a stable structure. Although drawings illustrate that the gate stacking structure 120 is provided in a quantity of three, example embodiments are not limited thereto. Accordingly, the gate stacking structure 120 may be formed of one or two gate stacking structures, and may include four or more gate stacking structure.

In addition, the plurality of channel structures CH1, CH2, and CH3 forming one channel structure CH may have a form connected to each other. Each of the plurality of channel structures CH1, CH2, and CH3 may have an inclined side surface whose width narrows as it is closer to the second substrate 100 depending on the aspect ratio, when viewed in cross-section. In addition, as shown in FIG. 38, a bent portion may be provided in a portion where a first channel structure CH1 and a second channel structure CH2 are connected, according to a width difference. As another example, the plurality of channel structures CH1, CH2, and CH3 may be provided with an inclined side surface that continuously extends without a bent portion.

FIG. 37 and FIG. 38 illustrate an integral structure in which the gate dielectric layer 150, the channel layer 140 and the core insulation layer 142 of the plurality of channel structures CH1, CH2, and CH3 extend with each other. However, example embodiments are not limited thereto, and the gate dielectric layer 150, the channel layer 140 and the core insulation layer 142 the plurality of channel structures CH1, CH2, and CH3 may be separately formed and then electrically connected to each other. In addition, separate channel pad may be additionally provided to a connection portion of the plurality of channel structures CH1, CH2, and CH3. As such, the embodiment is not limited to the shape of the plurality of channel structures CH1, CH2, and CH3.

Referring back to FIG. 37, in an embodiment, the separation structure 146 may penetrate the gate stacking structure 120. The separation structure 146 may extend in a direction (e.g., the third direction (Z direction)) crossing (e.g., vertical) the second substrate 100. Accordingly, the gate stacking structure 120 may be partitioned by the separation structure 146 into a plural quantity, in a plan view. For example, the separation structure 146 is illustrated to have an inclined side surface whose width gradually decrease toward the second substrate 100 due to a high aspect ratio, when viewed in cross-section, but example embodiments are not limited thereto. A side surface of the separation structure 146 may perpendicular to the second substrate 100, or a bent portion may be provided at the connection portion of the plurality of gate stacking structure 120*a*, 120*b*, and 120*c*.

A semiconductor device according to an embodiment may further include an upper separation region penetrating at least a portion of the gate stacking structure 120. In a plan view, the separation structure 146 and/or the upper separation region may extend in the first direction (X direction), and may be spaced apart with each other at a desired and/or alternatively predetermined interval in the second direction (Y direction) crossing thereto. The separation structure 146 and/or the upper separation region may be provided in a plural quantity, but example embodiments are not limited thereto.

The separation structure 146 or the upper separation region may be filled with various insulating materials. For example, the separation structure 146 or the upper separation region may include an insulating material such as silicon oxide, silicon nitride, or silicon nitride oxide. As another example, the separation structure 146 may further include a semiconductor material, a metallic material, or the like. In this case, the separation structure 146 may include a spacer layer including an insulating material, and a portion formed on the spacer layer and including a semiconductor material, a metallic material, or the like. However, example embodiments are not limited thereto, and structure, shape, material, or the like of the separation structure 146 or the upper separation region may be modified in various ways.

In order to connect the gate stacking structure 120 and/or the channel structure CH provided in the cell array region CAR to the peri structure PERI or external circuit, the cell wiring portion 180 may be provided in the cell structure CELL.

Here, the cell wiring portion 180 may include all members electrically connecting the gate electrode 130, the channel structure CH, or the like to the peri structure PERI or external circuit. For example, the cell wiring portion 180 may include the bit line BL, the gate contact 184, an input/output pad IO_PAD, the input/output contact 188, and contact vias 180*a* connected thereto respectively. Depending on the embodiment, connection wires 190 connected to the bit line BL, the gate contact 184, and/or the input/output contact 188 may be further included.

In more detail, the bit line BL may be located on a bottom surface of the cell insulation layer 132 of the gate stacking structure 120 located in the cell array region CAR. The bit line BL may extend in a direction crossing the direction in which the gate electrode 130. The bit line BL may be electrically connected to the channel structure CH (e.g., the channel pad 144) the contact via 180*a*.

A member for connecting the gate electrode 130 and the peri structure PERI may be provided in the extension region EXT.

In more detail, the gate contact 184 may be provided in the extension region EXT. The gate contact 184 may extend in the third direction (Z direction) in the extension region EXT, and penetrate the cell insulation layer 132 and mold structure MS. The gate contact 184 may be connected to one of the plurality of gate electrodes 130 stacked in the step shape in the extension region EXT. For example, the gate contact 184 may contact a side wall of a connection gate electrode 130*c* including the pad portion PP. At this time, the pad portion PP of the connection gate electrode 130*c* may contact the pad insulating portion 132*i*. FIG. 37 illustrates that the number of the gate contact 184 is 8, for better understanding and ease of description, but example embodiments are not limited thereto.

In some embodiments, an upper surface of the gate contact 184 may be located within the insulation pattern 102. That is, the upper surface of the gate contact 184 may be provided between the front side and the back side of the insulation pattern 102. The gate contact 184 may not overlap the common source plate 101 in the third direction (Z direction). The gate contact 184 may not completely penetrate the second substrate 100. The gate contact 184 may include a conductive material. The gate contact 184 may include, for example, a metal such as copper (Cu), tungsten (W), cobalt (Co), or nickel (Ni), but the type of the metal is not limited thereto.

An insulation ring 184*i* may be provided within the gate stacking structure 120 be. The insulation ring 184*i* may be interposed between the gate contact 184 and each of the plurality of gate electrodes 130. The insulation ring 184*i* may electrically separate other gate electrodes excluding the gate electrode 130 including the pad portion PP from the gate contact 184. For example, the insulation ring 184*i* may limit and/or prevent the remaining gate electrodes excluding the connection gate electrode 130*c* connected to the gate contact 184 from contacting the gate contact 184. For example, the insulation ring 184*i* may be a cyclic structure that surrounds the gate contact 184.

The insulation ring 184*i* may include an insulating material. The insulation ring 184*i* may include, for example, an oxide-based insulating material. For example, the insulation ring 184*i* may include silicon oxide, but example embodiments are not limited thereto.

Drawings illustrate that the gate contact 184 penetrates the plurality of gate electrodes 130, is electrically connected to one the connection gate electrode 130*c*, and is located to be spaced apart from remaining gate electrodes 130 by the insulation pattern 102. However, example embodiments are not limited thereto, and the gate contact 184 may not penetrate the gate electrode 130 to connect the gate electrode 130 and the connection wire 190, but contact a bottom surface of the gate electrode 130.

The source contact 186 may be provided in the extension region EXT. The source contact 186 may be formed of a conductive material such as metal, metal compound, or polycrystalline silicon, and may be electrically connected to the common source plate 101. The source contact 186 may be electrically connected to the bit line BL through the connection wire 190. The connection wire 190 may include a conductive material. The connection wire 190 may include, for example, tungsten (W) or copper (Cu), but example embodiments are not limited thereto.

In an embodiment, upper surface of the source contact 186 may be provided between the front side and the back side of the second substrate 100. The source contact 186 may overlap the common source plate 101 in the third direction (Z direction). The source contact 186 may not overlap the insulation pattern 102 in the third direction (Z direction). The source contact 186 does not completely penetrate the common source plate 101.

The input/output contact 188 may penetrate the cell insulation layer 132, and be connected to the input/output pad IO_PAD to be described later. The input/output contact 188 may be provided in the extension region EXT. In an embodiment, the common source plate 101 may not be located in the region where the input/output contact 188 is located. The insulation pattern 102 may be located in the region where the input/output contact 188 is disposed. The input/output contact 188 may overlap the insulation pattern 102 in the third direction (Z direction).

In addition, the input/output contact 188 may not overlap the plurality of gate electrodes 130 in the third direction (Z direction). The input/output contact 188 may be electrically connected to the bit line BL through the connection wire 190.

A semiconductor device according to an embodiment may further include a first upper insulation layer 103, a second upper insulation layer 104, the input/output pad IO_PAD, a cell pad C_PAD, an input/output via IO_VA, and a cell via C_VA.

The first upper insulation layer 103 may be provided on the back side of the second substrate 100. The first upper insulation layer 103 may include an oxide-based insulating material that includes proton ($H^+$). For example, the first upper insulation layer 103 may include high density plasma (HDP) oxide. The first upper insulation layer 103 may be referred to as 'hydrogen passivation layer' or 'hydrogen supply layer'. However, example embodiments are not limited thereto, and the first upper insulation layer 103 may include, for example, flowable oxide (Fox) including proton ($H^+$), TOSZ (Tonen Silazen), USG (undoped silica glass), BSG (borosilica glass), PSG (PhosphoSilica glass), BPSG (BoroPhosphosilica glass), PE-TEOS (plasma enhanced tetra-ethyl ortho-silicate), FSG (Fluoride silicate glass), PEOX (plasma enhanced oxide), or a combination thereof.

The second upper insulation layer 104 may be provided on the first upper insulation layer 103. The second upper insulation layer 104 may include a material having etch selectivity with respect to the first upper insulation layer 103. The second upper insulation layer 104 may include, for example, silicon nitride (SiN), but example embodiments are not limited thereto.

The input/output pad IO_PAD may be provided on the second upper insulation layer 104 of the extension region EXT. The input/output pad IO_PAD may be connected to the input/output via IO_VA, and the input/output contact 188. The input/output pad IO_PAD may be electrically connected to the peri structure PERI through the input/output contact 188 and the input/output via IO_VA. In addition, the input/output pad IO_PAD may electrically interconnect an external device and a semiconductor device. The input/output pad IO_PAD may include a conductive material. For example, the input/output pad IO_PAD may include aluminum (Al), but example embodiments are not limited thereto. The input/output via IO_VA may penetrate the second upper insulation layer 104 and the first upper insulation layer 103, and be electrically connected to the input/output pad IO_PAD.

The cell pad C_PAD may be provided on the second upper insulation layer 104 of the cell array region CAR. The cell pad C_PAD may be connected to the cell via C_VA and the common source plate 101. The cell pad C_PAD may be electrically connected to the common source plate 101 through the cell via C_VA. The cell pad C_PAD may include a conductive material. For example, the cell pad C_PAD may include aluminum (Al), but example embodiments are not limited thereto. The cell via C_VA may penetrate the second upper insulation layer 104 and the first upper insulation layer 103 and be electrically connected to the cell pad C_PAD.

The cell structure CELL according to an embodiment may include an upper structure US located on a bottom surface of the cell wiring portion 180, upper contact vias UC1 and UC2 penetrating at least a portion of the upper structure US, upper wires UM1, and the second contact pad 700.

The upper structure US may be located on the bottom surface of the cell wiring portion 180. For example, the upper structure US may be located on a bottom surface of the bit line BL. The upper structure US may be located between the bit line BL and a lower structure LS. The upper structure US may be connected to the peri structure PERI.

The upper structure US may include the plurality of upper barrier layers UB1 and UB2, a plurality of upper interlayer insulation layers 301, 302, 303, and 304, and the second bonding insulation layer 350 that are sequentially stacked on the bottom surface of the bit line BL in the third direction (Z direction).

In an embodiment, the upper structure US may correspond to the second insulation structure 300 of the embodiments of FIG. 1 to FIG. 17. That is, as shown in FIG. 37, the plurality of upper barrier layers UB1 and UB2, the plurality of upper interlayer insulation layers 301, 302, 303, and 304, and the second bonding insulation layer 350 of the upper structure US may correspond the second bonding insulation layer 350, the plurality of upper barrier layers UB1 and UB2, and the plurality of upper interlayer insulation layers 310, 320, and 330 of the lower structure LS of each embodiment of FIG. 1 to FIG. 17.

Hereinafter, the peri structure PERI will be described in detail.

The peri structure PERI may include the first substrate 200, a circuit element PTR located on the first substrate 200, the lower structure LS located on the first substrate 200, lower contact vias LC1 and LC2 penetrating at least a portion of the lower structure LS, the lower wire LM1, and LM2, and the first contact pad 600.

The lower structure LS may be located on the first substrate 200. For example, the lower structure LS may be located on a front side of the first substrate 200. That is, the lower structure LS may be located between the cell structure CELL and the first substrate 200.

In an embodiment, the lower structure LS may include may include a plurality of lower barrier layers LB1, LB2, and LB3, a plurality of lower interlayer insulation layers 401, 402, 403, 404, 405, and 406, and the first bonding insulation layer 450 that are sequentially stacked on the first substrate 200 in the third direction (Z direction). The plurality of lower barrier layers LB1, LB2, and LB3 and the plurality of lower interlayer insulation layers 401, 402, 403, 404, 405, and 406 may be alternately stacked on the first substrate 200.

In an embodiment, the lower structure LS may correspond to the first insulation structure 400 of the embodiments of FIG. 1 to FIG. 17. That is, as shown in FIG. 37, the plurality of lower barrier layers LB1, LB2, and LB3, the plurality of lower interlayer insulation layers 401, 402, 403, 404, 405, and 406, and the first bonding insulation layer 450 of the lower structure LS may correspond to the first bonding insulation layer 450, the plurality of lower barrier layers LB1 and LB2, and the plurality of lower interlayer insulation layers 410, 420, and 430 of the first insulation structure 400 of embodiments of FIG. 1 to FIG. 17, respectively.

In an embodiment, the second bonding insulation layer 350 and the second contact pad 700 of the cell structure CELL and the first bonding insulation layer 450 and the first contact pad 600 of the peri structure PERI may be bonded by hybrid bonding as in the embodiments of FIG. 1 to FIG. 17.

In more detail, the first surface of the peri structure PERI adjacent to the cell structure CELL is a bonding surface to the cell structure CELL, and may be configured with the first contact pad 600 and the first bonding insulation layer 450. The first surface of the cell structure CELL adjacent to the peri structure PERI is a bonding surface to the peri structure PERI, and may be configured with the second contact pad 700 and the second bonding insulation layer 350. The first contact pad 600 may be electrically connected to the circuit element PTR through the lower wire LM1, and LM2. In addition, the second contact pad 700 may be electrically connected to the cell wiring portion 180 through the upper wire UM1.

The first surface of the cell structure CELL and the first surface of the peri structure PERI may be bonded by hybrid bonding. Specifically, the first contact pad 600 of the peri structure PERI and the second contact pad 700 of the cell structure CELL may be bonded in directly contact to form metal bonding. In addition, the first bonding insulation layer 450 of the peri structure PERI and the second bonding insulation layer 350 of the cell structure CELL may be bonded to form a bonding insulation layer.

As such, the first contact pad 600 of the peri structure PERI and the second contact pad 700 of the cell structure CELL may be bonded, and may provide an electrical connection path between the peri structure PERI and the cell structure CELL. For example, by the upper wire UM1 and the lower wire LM1, and LM2, the bit line BL and/or the gate electrode 130 connected to the channel structure CH may be electrically connected to the circuit element PTR of the peri structure PERI.

The first substrate 200 may include a front side and a back side that face each other. The front side of the first substrate 200 may face the cell structure CELL. A back side of the first substrate 200 may face away from the cell structure CELL.

The first substrate 200 may be a semiconductor substrate including a semiconductor material. For example, the first substrate 200 may be a semiconductor substrate formed of a semiconductor material, and a semiconductor substrate in which a semiconductor layer is formed on a base substrate. For example, the first substrate 200 may be formed of monocrystalline or polycrystalline silicon, epitaxial silicon, germanium, or silicon-germanium, silicon-on-insulator (SOI), germanium-on-insulator (GOI), or the like.

The circuit element PTR may be located on the first substrate 200. The circuit element PTR may include various circuit elements that control an operation of the memory cell structure provided in the cell structure CELL. For example, the circuit element PTR may configure the peripheral circuit structures of a decoder circuit (reference symbol 1110 in FIG. 40), a page buffer (the reference symbol 1120 in FIG. 40), logic circuit (the reference symbol 1130 in FIG. 40), or the like. The circuit element PTR may include, for example, a transistor, but example embodiments are not limited thereto. For example, the circuit element PTR may include not only active elements such as transistors but also passive elements such as capacitors, resistors, and inductors.

Hereinafter, an electronic system including a semiconductor device according to an embodiment will be described in detail with reference to FIG. 40 to FIG. 42.

Figure 40:
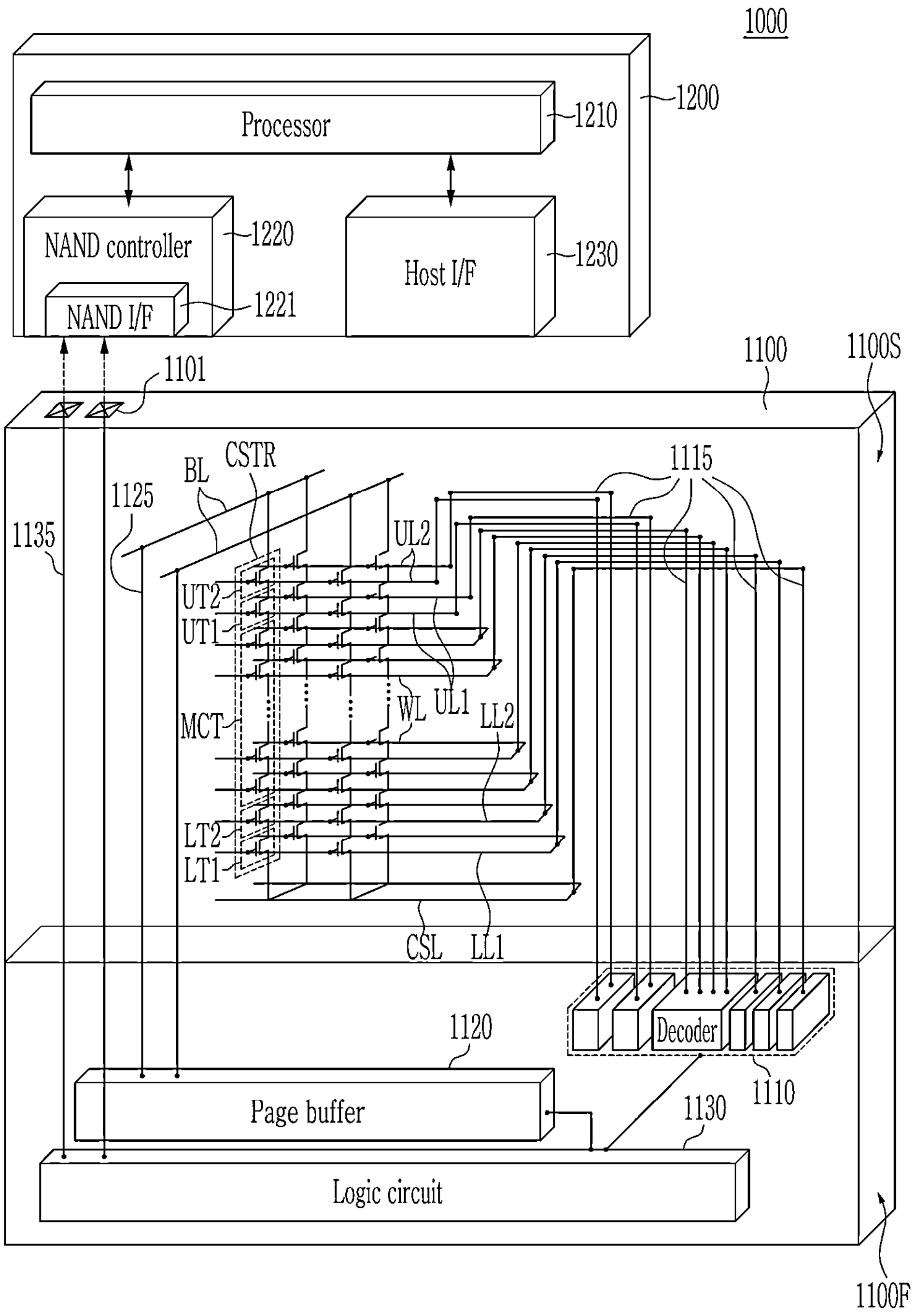
FIG. 40 is a drawing schematically showing an electronic system including a semiconductor device according to an embodiment.

FIG. 40 is a drawing schematically showing an electronic system including a semiconductor device according to an embodiment.

As shown in FIG. 40, the electronic system 1000 according to an embodiment may include the semiconductor device 1100 and a controller 1200 electrically connected to the semiconductor device 1100. The electronic system 1000 may be a storage device including one or a plurality of semiconductor devices 1100 or an electronic device including include a storage device. For example, the electronic system 1000 may be a solid-state drive (SSD) device, a universal serial bus (USB), a computing system, a medical device, or a communication device, which include the one or plurality of semiconductor devices 1100.

The semiconductor device 1100 may be a non-volatile memory device, and for example, the NAND flash memory device described above with reference to FIG. 36 to FIG. 39. The semiconductor device 1100 may include the first structure 1100F and the second structure 1100S on the first structure 1100F. In an embodiment, the first structure 1100F may be located side by side with the second structure 1100S. The first structure 1100F may be a peripheral circuit structure including a decoder circuit 1110, a page buffer 1120, and a logic circuit 1130. The second structure 1100S may be a memory cell structure including the bit line BL, a common source line CSL, a wordline WL, first and second gate upper lines UL1 and UL2, first and second gate lower line LL1 and LL2, and memory cell strings CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT located between the lower transistors LT1 and LT2 and the upper transistors UT1 and UT2. The number of the lower transistors LT1 and LT2 and the number of the upper transistors UT1 and UT2 may be changed in various ways depending on the embodiment.

In an embodiment, the lower transistors LT1 and LT2 may include a ground select transistor, and the upper transistors UT1 and UT2 may include a string select transistor. First and second gate the lower line LL1 and LL2 may be gate electrodes of the lower transistors LT1 and LT2, respectively. The wordline WL may be a gate electrode of the memory cell transistor MCT, and gate the upper line UL1 and UL2 may be a gate electrode of each the upper transistors UT1 and UT2.

The common source line CSL, first and second gate the lower line LL1 and LL2, the wordline WL, and first and second gate the upper line UL1 and UL2 may be electrically connected to the decoder circuit 1110 through a first connection wire 1115 extending to the second structure 1100S within the first structure 1100F. The bit line BL may be electrically connected to the page buffer 1120 through a second connection wire 1125 extending to the second structure 1100S within the first structure 1100F.

In the first structure 1100F, the decoder circuit 1110 and the page buffer 1120 may execute control operations with respect to at least one memory cell transistor selected from the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wire 1135 extending to the second structure 1100S within the first structure 1100F.

The controller 1200 may include a processor 1210, a NAND controller 1220, and a host interface 1230. Depending on the embodiment, the electronic system 1000 may include the plurality of semiconductor devices 1100, and in this case, the controller 1200 may control the plurality of semiconductor devices 1100.

The processor 1210 may control an overall operation of the electronic system 1000 including the controller 1200. The processor 1210 may operate according to a desired and/or alternatively predetermined firmware, and may access the semiconductor device 1100 by controlling the NAND controller 1220. The NAND controller 1220 may include a NAND interface 1221 for processing communication with the semiconductor device 1100. Through the NAND interface 1221, control commands for controlling the semiconductor device 1100, data to be written into the memory cell transistor MCT of the semiconductor device 1100, data to be read from the memory cell transistor MCT of the semiconductor device 1100, or the like may be transmitted. The host interface 1230 may provide communication function between the electronic system 1000 and the external host. Upon receiving a control command from an external host through the host interface 1230, the processor 1210 may control the semiconductor device 1100 in response to the control command.

Figure 41:
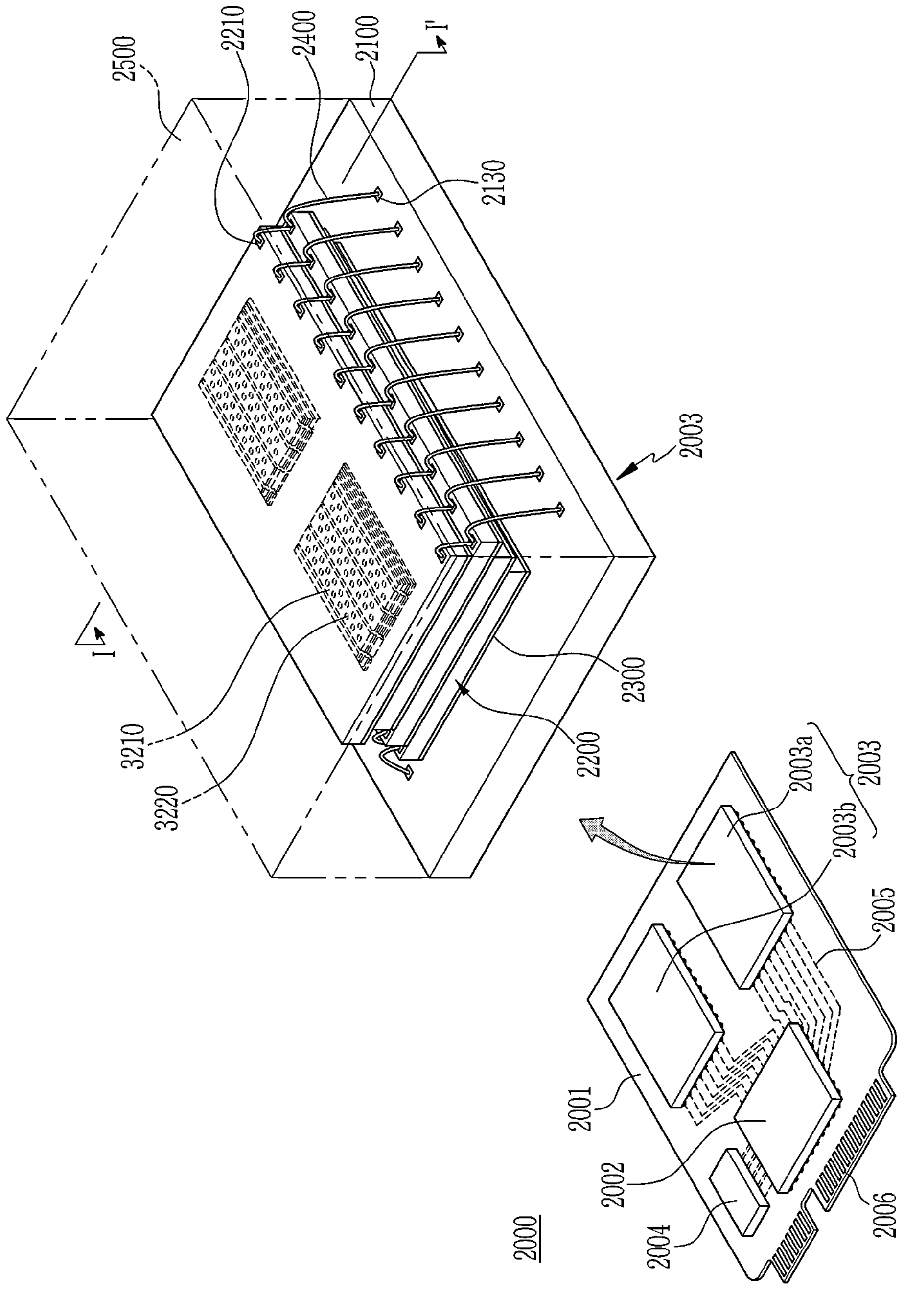
FIG. 41 is a perspective view schematically showing an electronic system including a semiconductor device according to an embodiment.

FIG. 41 is a perspective view schematically showing an electronic system including a semiconductor device according to an embodiment.

As shown in FIG. 41, an electronic system 2000 according to an embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by a wire pattern 2005 formed in the main substrate 2001.

The main substrate 2001 may include a connector 2006 including a plurality of pins coupled to the external host. The number and arrangement of the plurality of pins in the connector 2006 may vary depending on communication interface between the electronic system 2000 and the external host. In an embodiment, the electronic system 2000 may communicate with the external host according to one of interfaces of universal serial bus (USB), peripheral component interconnect express (PCI-Express), serial advanced technology attachment (SATA), M-Phy for Universal Flash Storage (UFS), or the like. In an embodiment, the electronic system 2000 may operate by the power supplied from the external host through the connector 2006. The electronic system 2000 may further include a power management integrated circuit (PMIC) that distributes the power supplied from the external host to the controller 2002 and the semiconductor package 2003.

The controller 2002 may record data in the semiconductor package 2003, or read data from the semiconductor package 2003, and may improve the operation speed of the electronic system 2000.

The DRAM 2004 may be a buffer memory for alleviating speed difference between the semiconductor package 2003, which is a data storage space, and the external host. The DRAM 2004 included in the electronic system 2000 may also act as a type of cache memory, and may provide a space for temporarily storing data during a control operation on the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, an adhesive layer 2300 located on each bottom surface of the semiconductor chips 2200, a connection structure 2400 electrically connecting the semiconductor chip 2200 and the package substrate 2100, and a molding layer 2500 covering the semiconductor chip 2200 and the connection structure 2400 on the package substrate 2100.

The package substrate 2100 may be a printed circuit board including a package upper pad 2130. Each semiconductor chip 2200 may include an input/output pad 2210. The input/output pad 2210 may correspond to the input/output pad 1101 of FIG. 40. Each semiconductor chip 2200 may include a gate stacking structure 3210 and a channel structure 3220. Each semiconductor chip 2200 may include a semiconductor device described with reference to FIG. 36 to FIG. 39.

In an embodiment, the connection structure 2400 may be a bonding wire that electrically connects the input/output pad 2210 and the package upper pad 2130. Therefore, in each of the first and second semiconductor packages 2003*a* and 2003*b*, the semiconductor chip 2200 may be electrically connected to each other by the bonding wire method, and may be electrically connected to the package upper pad 2130 of the package substrate 2100. Depending on the embodiment, in each of the first and second semiconductor packages 2003*a* and 2003*b*, the semiconductor chip 2200 may be electrically connected to each other through a connection structure including through-silicon via (TSV) instead of the connection structure 2400 of the bonding wire method.

In an embodiment, the controller 2002 and the semiconductor chip 2200 may be included in one package. For example, the controller 2002 and the semiconductor chip 2200 may be mounted on a separate interposer substrate other than the main substrate 2001, and the controller 2002 and the semiconductor chip 2200 may be connected to each other by wires formed in the interposer substrate.

Figure 42:
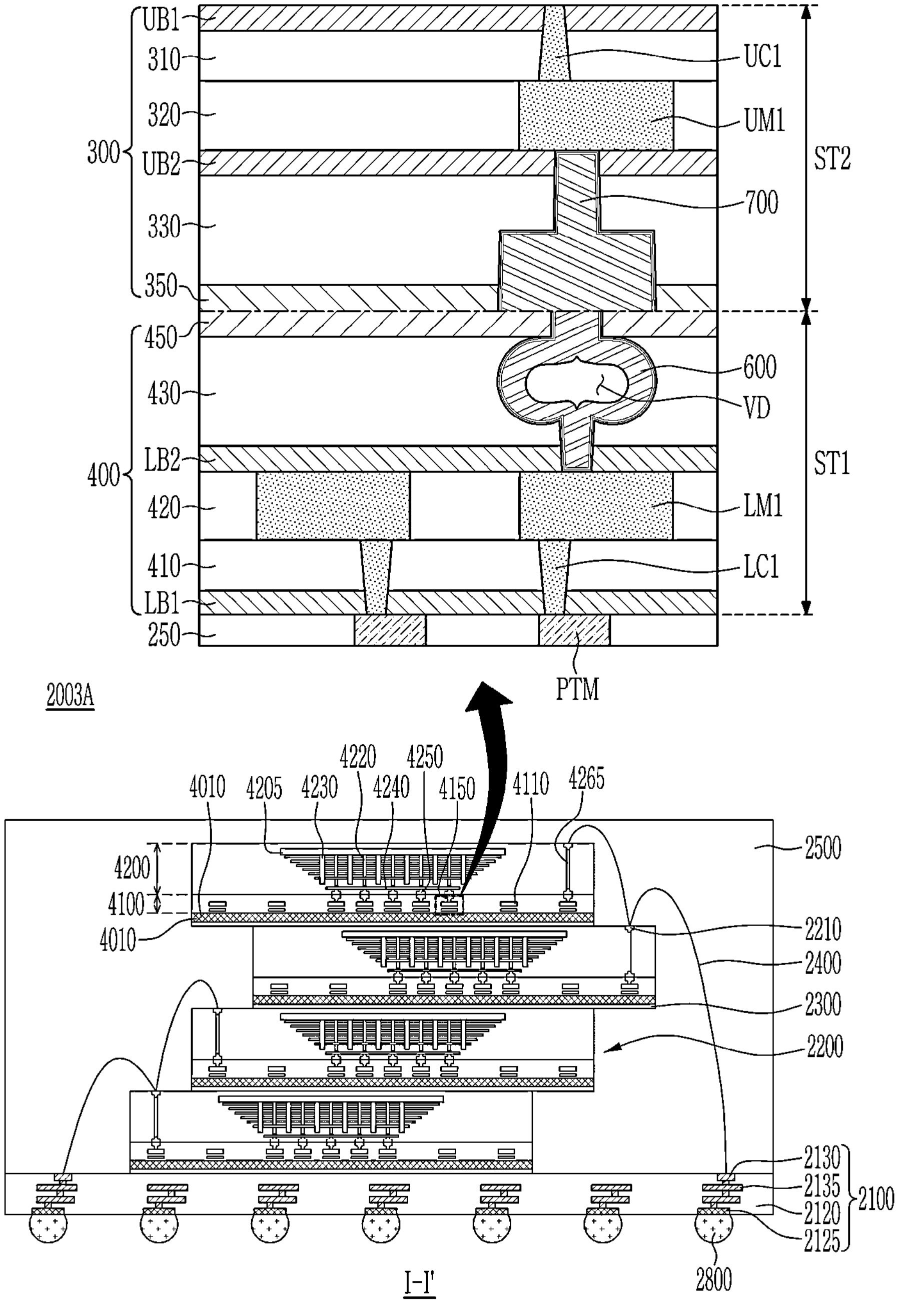
FIG. 42 is a cross-sectional view schematically showing a semiconductor package according to an embodiment.

FIG. 42 is a cross-sectional view schematically showing a semiconductor package according to an embodiment.

FIG. 42 shows an embodiment of the semiconductor package 2003 of FIG. 41, and conceptually illustrates a region taken along line I-I' of the semiconductor package 2003 of FIG. 41.

Referring to FIG. 42, in a semiconductor package 2003A, each semiconductor chip 2200 may include a semiconductor substrate 4010, the first structure 4100 on the semiconductor substrate 4010, and the second structure 4200 bonded to the first structure 4100 by the wafer bonding method on the first structure 4100.

The first structure 4100 may include a peripheral circuit region including a peripheral wire 4110 and a first bonding structure 4150. The second structure 4200 may include the common source line 4205, a gate stacking structure 4210 between the common source line 4205 and the first structure 4100, a channel structure 4220 and a separation structure 4230 penetrating the gate stacking structure 4210, and a second bonding structure 4250 electrically connected to wordlines (reference symbol WL of FIG. 40, the same in below) of the channel structure 4220 and the gate stacking structure 4210. For example, the second bonding structure 4250 may be electrically connected to the channel structure 4220 and the wordline WL, respectively, through a gate connection wire electrically connected to the wordline WL and a bit line 4240 electrically connected to the channel structure 4220. The first bonding structure 4150 of the first structure 4100 and the second bonding structure 4250 of the second structure 4200 may be boned to each other while being in contact with each other. The portion where the first bonding structure 4150 and the second bonding structure 4250 are bonded may be formed of, for example, copper (Cu).

In the semiconductor chip 2200 or semiconductor device according to an embodiment, since the second portion 620 of the first contact pad 600 includes the void VD, when the annealing process is performed, the first contact pad 600 of a semiconductor device according to an embodiment may thermally expand into the void VD, and furthermore, the first contact structure ST1 and the second contact structure ST2 may be limited and/or prevented from being separated or the first contact pad 600 and the second contact pad 700 may be limited and/or prevented from being disconnection. Accordingly, the reliability of a semiconductor device may be improved.

Each semiconductor chip 2200 may further include the input/output pad 2210 and an input/output connection wire 4265 below the input/output pad 2210. The input/output connection wire 4265 may be electrically connected to a portion of the second bonding structure 4250.

In an embodiment, the plurality of semiconductor chips 2200 in the semiconductor package 2003A may be electrically connected to each other by the connection structure 2400 having the form of bonding wire. As another example, the plurality of semiconductor chips 2200 or a plurality of portions constituting the same may be electrically connected by a connection structure including through-silicon via.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While embodiments of the present disclosure have been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS

ST1: first contact structure
ST2: second contact structure
400: first insulation structure
600: first contact pad
610: the first portion
620: the second portion
630: the third portion
300: second insulation structure
700: second contact pad

What is claimed is:

1. A semiconductor device, comprising:

a circuit element wire;

a lower wire connected to the circuit element wire;

a lower interlayer insulation layer on the lower wire; and a first contact pad penetrating the lower interlayer insulation layer, wherein the first contact pad includes a first portion, a second portion on the first portion, and a third portion on the second portion, the first portion of the first contact pad is connected to the lower wire, the second portion of the first contact pad includes a void on the first portion of the first contact pad, a maximum width of the second portion of the first contact pad along a horizontal direction is larger than a width of the third portion of the first contact pad along the horizontal direction, and the maximum width of the second portion of the first contact pad along the horizontal direction is from a first outer surface of the second portion of the first contact pad to a second outer surface of the second portion of the first contact pad.

2. The semiconductor device of claim 1, wherein a maximum width of the third portion of the first contact pad along the horizontal direction is greater than or equal to a maximum width of the first portion of the first contact pad along the horizontal direction.

3. The semiconductor device of claim 1, further comprising a first bonding insulation layer on the lower interlayer insulation layer, wherein the third portion of the first contact pad penetrates the first bonding insulation layer, and the second portion of the first contact pad is on a bottom surface of the first bonding insulation layer.

4. The semiconductor device of claim 3, wherein an upper surface of the second portion of the first contact pad is in contact with the bottom surface of the first bonding insulation layer.

5. The semiconductor device of claim 3, wherein a width of a portion of the second portion of the first contact pad decreases in the horizontal direction as a distance of the portion of the second portion of the first contact pad increases from the bottom surface of the first bonding insulation layer.

6. The semiconductor device of claim 5, wherein the width of the second portion of the first contact pad increases in the horizontal direction and then decreases in the horizontal direction as the distance of the second portion of the first contact pad increases from the bottom surface of the first bonding insulation layer.

7. The semiconductor device of claim 3, further comprising a lower barrier layer between the lower wire and the lower interlayer insulation layer, wherein the first portion of the first contact pad penetrates the lower barrier layer.

8. The semiconductor device of claim 7, wherein:

the lower barrier layer comprises silicon nitride; and the lower interlayer insulation layer comprises at least one of silicon oxide, silicon nitride oxide, and silicon carbonitride.

9. The semiconductor device of claim 3, wherein a lower portion of the second portion of the first contact pad is connected to the first portion of the first contact pad and covers a lower region of the void; and an upper portion of the second portion of the first contact pad is connected to the third portion of the first contact pad and covers an upper region of the void, wherein a thickness of the upper portion of the second portion of the first contact pad is thicker than a thickness of the lower portion of the second portion of the first contact pad.

10. The semiconductor device of claim 9, wherein the second portion of the first contact pad does not overlap the first bonding insulation layer in the horizontal direction.

11. The semiconductor device of claim 1, wherein the third portion of the first contact pad comprises a first pattern and a second pattern spaced apart from each other on the second portion of the first contact pad, wherein the maximum width of the second portion of the first contact pad in the horizontal direction is larger than a sum of a maximum width of the first pattern in the horizontal direction and a maximum width of the second pattern in the horizontal direction.

12. The semiconductor device of claim 1, wherein the first contact pad comprises a first conductive layer, a second conductive layer, and a third conductive layer, the first conductive layer of the first contact pad is in contact with the lower interlayer insulation layer, the second conductive layer of the first contact pad is on an inner surface of the first conductive layer of the first contact pad, and the third conductive layer of the first contact pad is on an inner surface of the second conductive layer of the first contact pad, wherein the second conductive layer of the first contact pad covers an upper surface of the first conductive layer located on the first portion, and in the first portion of the first contact pad, the third conductive layer is on top of the inner surface of the second conductive layer of the first contact pad such that the inner surface of the second conductive layer of the first contact pad is an upper surface of the second conductive layer of the first contact pad.

13. A semiconductor device comprising:

a first contact structure including a lower interlayer insulation layer, a first bonding insulation layer on the lower interlayer insulation layer, and a first contact pad penetrating the lower interlayer insulation layer and the first bonding insulation layer; and a second contact structure on the first contact structure, the second contact structure including a second bonding insulation layer on the first contact structure and a second contact pad connected to the first contact pad, the second contact pad penetrating the second bonding insulation layer, wherein the first contact pad includes a first portion extending in one direction, a second portion below the first bonding insulation layer, and a third portion penetrating the first bonding insulation layer, the second portion of the first contact pad protrudes further than the first portion of the first contact pad in a horizontal direction, and the second portion of the first contact pad includes an interiorly buried void.

14. The semiconductor device of claim 13, wherein a maximum width of the second portion of the first contact pad along the horizontal direction is larger than a maximum width of the third portion of the first contact pad along the horizontal direction.

15. The semiconductor device of claim 13, wherein:

a material in the first bonding insulation layer is same as a material in the second bonding insulation layer; and a material in the first contact pad is same as a material in the second contact pad.

16. The semiconductor device of claim 13, wherein a maximum width of the second portion of the first contact pad along the horizontal direction is larger than a width of the third portion of the first contact pad along the horizontal direction, and the maximum width of the second portion of the first contact pad along the horizontal direction is from a first outer surface of the second portion of the first contact pad to a second outer surface of the second portion of the first contact pad.

17. The semiconductor device of claim 13, wherein a width of the first portion of the first contact pad decreases in the horizontal direction as a distance of the first portion of the first contact pad increases from the first bonding insulation layer.

18. A semiconductor device, comprising:

a peripheral (peri) structure and a cell structure stacked on the peri structure, wherein the peri structure includes a first substrate, circuit elements on the first substrate, a lower interlayer insulation layer on the first substrate, a first bonding insulation layer on the lower interlayer insulation layer, and a first contact pad penetrating the lower interlayer insulation layer and the first bonding insulation layer, wherein the cell structure includes a second substrate electrically connected to the first substrate, a gate stacking structure, a channel structure penetrating the gate stacking structure in a cell array region of the second substrate, a second bonding insulation layer between the gate stacking structure and the first bonding insulation layer, and a second contact pad connected to the first contact pad and penetrating the second bonding insulation layer, wherein the second substrate includes the cell array region and an extension region, a first surface of the second substrate faces the peri structure and a second surface of the second substrate is opposite the first surface, wherein the gate stacking structure includes a plurality of gate electrodes and a plurality of interlayer insulation layers alternately stacked on the first surface of the second substrate, wherein the first contact pad includes a first portion extending in one direction, a second portion between the first portion and the first bonding insulation layer, and a third portion penetrating the first bonding insulation layer, wherein the second portion of the first contact pad includes an interiorly buried void, and wherein the second portion of the first contact pad protrudes further than the third portion of the first contact pad in a horizontal direction.

19. The semiconductor device of claim 18, wherein a maximum width of the second portion of the first contact pad along the horizontal direction is larger than a width of the third portion of the first contact pad along the horizontal direction, and the maximum width of the second portion of the first contact pad along the horizontal direction is from a first outer surface of the second portion of the first contact pad to a second outer surface of the second portion of the first contact pad.

20. The semiconductor device of claim 18, further comprising a lower barrier layer below the lower interlayer insulation layer, wherein the first portion of the first contact pad penetrates the lower barrier layer, and the lower interlayer insulation layer overlaps the second portion of the first contact pad in the horizontal direction.

* * * * *